United States Patent
Kim et al.

(10) Patent No.: US 11,800,732 B2
(45) Date of Patent: *Oct. 24, 2023

(54) ORGANIC LIGHT EMITTING DIODE AND ORGANIC LIGHT EMITTING DEVICE HAVING THE SAME

(71) Applicant: LG Display Co., Ltd., Seoul (KR)

(72) Inventors: Chun-Ki Kim, Paju-si (KR); Joong-Hwan Yang, Paju-si (KR); Bo-Min Seo, Paju-si (KR); Dae-Wi Yoon, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/860,964

(22) Filed: Jul. 8, 2022

(65) Prior Publication Data

US 2022/0367828 A1 Nov. 17, 2022

Related U.S. Application Data

(63) Continuation of application No. 16/710,362, filed on Dec. 11, 2019, now Pat. No. 11,424,424.

(30) Foreign Application Priority Data

Dec. 11, 2018 (KR) .......................... 10-2018-0158906

(51) Int. Cl.
*H01L 51/50* (2006.01)
*H10K 50/11* (2023.01)
(Continued)

(52) U.S. Cl.
CPC ............. *H10K 50/11* (2023.02); *H10K 50/18* (2023.02); *H10K 50/805* (2023.02); *H10K 2101/30* (2023.02); *H10K 2101/40* (2023.02)

(58) Field of Classification Search
CPC ........ H10K 50/10; H10K 50/15; H10K 50/30; H10K 50/113; H10K 50/622;
(Continued)

(56) References Cited

U.S. PATENT DOCUMENTS

2010/0187517 A1 7/2010 Nishimura et al.
2017/0031388 A1 2/2017 Han et al.
(Continued)

FOREIGN PATENT DOCUMENTS

| CN | 106816541 A | 6/2017 |
| CN | 107408634 A | 11/2017 |
| EP | 3173855 A1 | 5/2017 |

OTHER PUBLICATIONS

Yamamoto et al., Carbazole DendrimersasSolution-Processable Thermally Activated Delayed-Fluorescence Materials; Angew.Chem. Int.Ed. 2015, 54,5677-5682 (Year: 2105).*

(Continued)

*Primary Examiner* — Gregory D Clark
(74) *Attorney, Agent, or Firm* — Birch, Stewart, Kolasch & Birch, LLP

(57) ABSTRACT

The present disclosure relates to an organic light emitting diode including an emitting material layer that has a host and two different delayed fluorescent materials whose energy levels are controlled and an organic light emitting device including the diode. Exciton energy is transferred from a first delayed fluorescent dopant to a second delayed fluorescent dopant, which has singlet and triplet energy levels lower than singlet and triplet energy levels of the first delayed fluorescent dopant and a narrow FWHM (full-width at half maximum) compared to the first delayed fluorescent dopant so that efficient light emission can be realized.

25 Claims, 13 Drawing Sheets

(51) Int. Cl.
*H10K 50/18* (2023.01)
*H10K 50/805* (2023.01)
*H10K 101/40* (2023.01)
*H10K 101/30* (2023.01)

(58) Field of Classification Search
CPC .. H10K 50/631; H10K 50/155; H10K 50/852; H10K 50/342; H10K 85/342; H10K 85/636; H10K 85/6574; H10K 85/6572
See application file for complete search history.

(56) References Cited

U.S. PATENT DOCUMENTS

2017/0346029 A1 11/2017 Kim et al.
2018/0309069 A1 10/2018 Xie

OTHER PUBLICATIONS

Yang. Z. et al, "Recent advances in organic thermally activated delayed fluorescence materials," Chem. Soc. Rev., 2017, vol. 46, pp. 915-1016.

* cited by examiner

ORGANIC LIGHT EMITTING DIODE AND ORGANIC LIGHT EMITTING DEVICE HAVING THE SAME

CROSS-REFERENCE TO RELATED APPLICATIONS

This application is a Continuation of U.S. patent application Ser. No. 16/710,362 filed on Dec. 11, 2019, which claims the priority benefit under 35 U.S.C. § 119(a) of Korean Patent Application No. 10-2018-0158906, filed in the Republic of Korea on Dec. 11, 2018, all of these applications being incorporated by reference into the present applications.

BACKGROUND

Technical Field

The present disclosure relates to an organic light emitting diode, and more specifically, to an organic light emitting diode having enhanced luminous efficiency and life span and an organic light emitting device having the same.

Description of the Related Art

As display devices have become larger, there exists a need for a flat display device with a lower space requirement. Among the flat display devices, a display device using an organic light emitting diode (OLED) has come into the spotlight.

In the OLED, when electrical charges are injected into an emission layer between an electron injection electrode (i.e., cathode) and a hole injection electrode (i.e., anode), electrical charges are combined to be paired, and then emit light as the combined electrical charges are disappeared.

The OLED can be formed even on a flexible transparent substrate such as a plastic substrate. In addition, the OLED can be driven at a low voltage of 10 V or less. Besides, the OLED has relatively low power consumption for driving compared to plasma display panel and inorganic electroluminescent devices, and its color purity is very high. Further, since the OLED can display various colors such as green, blue, red and the likes, the OLED display device has attracted a lot of attention as a next-generation display device that can replace a liquid crystal display device (LCD).

Since the blue luminous material should have very wide energy bandgap compared to green or red luminous material, it has been difficult to develop a blue luminous material. In addition, the organic light emitting diode with a blue luminous material showed low luminous efficiency and an unsatisfactory life span and color purity.

BRIEF SUMMARY

Accordingly, the present disclosure is directed to an organic light emitting diode and an organic light emitting device including the organic light emitting diode that can reduce one or more of the problems due to the limitations and disadvantages of the related art.

An object of the present disclosure is to provide an organic light emitting diode that can enhance its luminous efficiency and color purity and an organic light emitting device including the diode.

Another object of the present disclosure is to provide an organic light emitting diode having an improved life span and an organic light emitting device including the diode.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

According to an embodiment, the present disclosure provides an organic light emitting diode that comprises first and second electrodes facing each other; and an at least one emitting unit disposed between the first and second electrodes and including an emitting material layer, wherein the emitting material layer includes a host, a first delayed fluorescent dopant and a second delayed fluorescent dopant, wherein each of an excited state singlet energy level ($S_1^{TD1}$) and an excited state triplet energy level ($T_1^{TD1}$) of the first delayed fluorescent dopant is higher than each of an excited state singlet energy level ($S_1^{TD2}$) and an excited state triplet energy level ($T_1^{TD2}$) of the second delayed fluorescent dopant, respectively, wherein a highest occupied molecular orbital (HOMO) energy level ($HOMO^H$) of the first host, a HOMO energy level ($HOMO^{TD1}$) of the first delayed fluorescent dopant and a HOMO energy level ($HOMO^{TD2}$) of the second delayed fluorescent dopant satisfy the following relationships in Equations (1) and (3), and wherein a lowest unoccupied molecular orbital (LUMO) energy level ($LUMO^H$) of the first host, a LUMO energy level ($LUMO^{TD1}$) of the first delayed fluorescent dopant and a LUMO energy level ($LUMO^{TD2}$) of the second delayed fluorescent dopant satisfy the following relationships in Equations (5) and (7).

$$HOMO^H \leq HOMO^{TD1} \quad (1)$$

$$HOMO^{TD2} - HOMO^{TD1} > 0.2 \text{ eV} \quad (3)$$

$$LUMO^H > LUMO^{TD1} \quad (5)$$

$$LUMO^{TD1} \geq LUMO^{TD2} \quad (7)$$

According to second embodiment, the present disclosure provides an organic light emitting diode that comprises first and second electrodes facing each other; and at least one emitting unit disposed between the first and second electrodes, wherein the at least one emitting unit comprises an emitting material layer, wherein the emitting material layer includes a first emitting material layer disposed between the first and second electrodes, wherein the first emitting material layer comprises a first host and a first delayed fluorescent dopant, and a second emitting material layer disposed between the first electrode and the first emitting material layer or between the first emitting material layer and the second electrode, wherein the second emitting material layer comprises a second host and a second delayed fluorescent dopant, wherein each of an excited state singlet energy level ($S_1^{TD1}$) and an excited state triplet energy level ($T_1^{TD1}$) of the first delayed fluorescent dopant is higher than each of an excited state singlet energy level ($S_1^{TD2}$) and an excited state triplet energy level ($T_1^{TD2}$) of the second delayed fluorescent dopant, respectively, wherein a highest occupied molecular orbital (HOMO) energy level ($HOMO^H$) of the first host, a HOMO energy level ($HOMO^{TD1}$) of the first delayed fluorescent dopant and a HOMO energy level ($HOMO^{TD2}$) of the second delayed fluorescent dopant satisfy the relationships in Equations (1) and (3), and wherein a lowest unoccupied molecular orbital (LUMO) energy level (LU- $MO^H$) of the first host, a LUMO energy level ($LUMO^{TD1}$) of the first delayed fluorescent dopant and a LUMO energy level ($LUMO^{TD2}$) of the second delayed fluorescent dopant satisfy the relationships in Equations (5) and (7).

According to still another embodiment, the present disclosure provides an organic light emitting device that comprises a substrate and the OLED disposed over the substrate, as described above.

It is to be understood that both the foregoing general description and the following detailed description are examples and are explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Reference will now be made in detail to aspects of the disclosure, examples of which are illustrated in the accompanying drawings.

[Organic Light Emitting Device]

Figure 1:
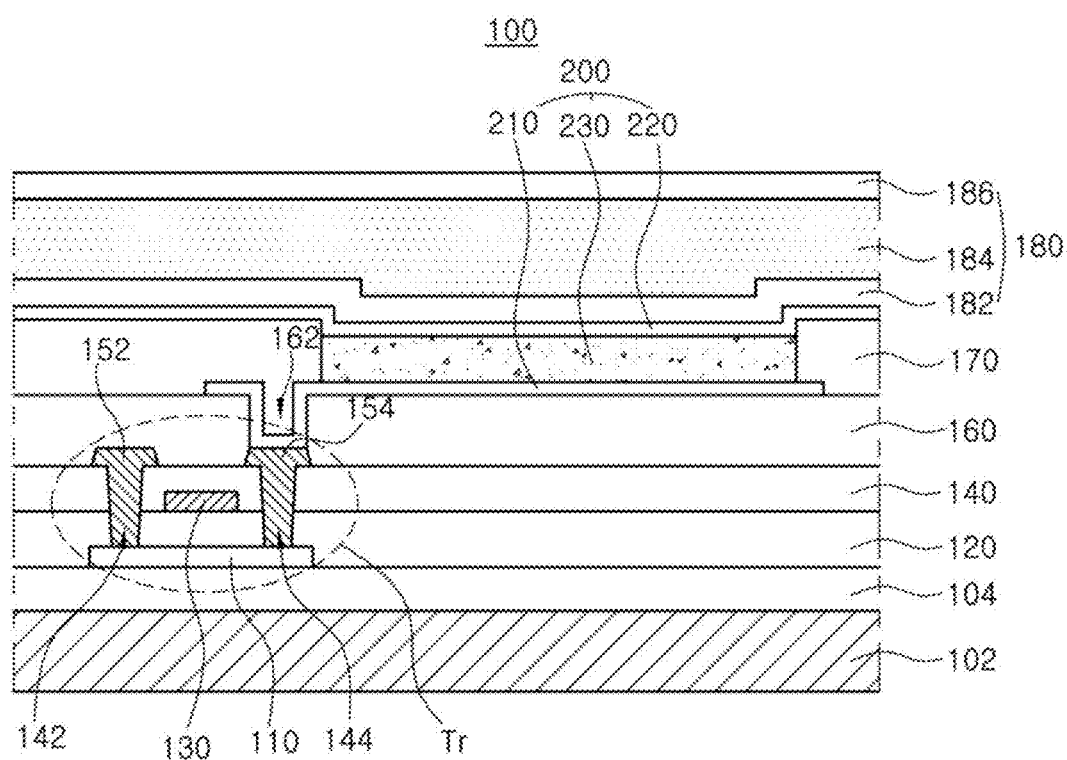
FIG. 1 is a schematic cross-sectional view illustrating an organic light emitting display device of the present disclosure.

An organic light emitting diode of the present disclosure includes a plurality of delayed fluorescent materials in an emitting material layer so as to enhance its luminous efficiency, its life span and its color purity. The organic light emitting diode of the present disclosure may be applied to an organic light emitting device such as an organic light emitting display device and an organic light emitting illumination device. A display device including the organic light emitting diode will be explained. FIG. 1 is a schematic cross-sectional view of an organic light emitting display device of the present disclosure.

As illustrated in FIG. 1, the organic light emitting display device 100 includes a substrate 102, a thin-film transistor Tr on the substrate 102, and an organic light emitting diode 200 connected to the thin film transistor Tr.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combinations thereof. The substrate 102, over which the thin film transistor Tr and the organic light emitting diode 200 are arranged, form an array substrate.

A buffer layer 104 may be disposed over the substrate 102, and the thin film transistor Tr is disposed over the buffer layer 104. The buffer layer 104 may be omitted.

A semiconductor layer 110 is disposed over the buffer layer 104. In one exemplary embodiment, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include, but is not limited to, polycrystalline silicon. In this case, opposite edges of the semiconductor layer 110 may be doped with impurities.

A gate insulating layer 120 formed of an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 1, the gate insulating layer 120 may be patterned in the same way as the gate electrode 130.

An interlayer insulating layer 140 formed of an insulating material is disposed on the gate electrode 130 so that it covers the entire surface of the substrate 102. The interlayer insulating layer 140 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 and spaced apart from the gate electrode 130. The first and second semiconductor layer contact holes 142 and 144 are formed within the gate insulating layer 120 in FIG. 1.

Alternatively, the first and second semiconductor layer contact holes 142 and 144 are formed only within the interlayer insulating layer 140 when the gate insulating layer 120 is patterned in the same way as the gate electrode 130.

A source electrode 152 and a drain electrode 154, which are formed of a conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 1 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and a drain electrode are disposed over the semiconductor layer. In this case, the semiconductor layer may comprise amorphous silicon.

A gate line and a data line, which cross each other to define a pixel region, and a switching element, which is connected to the gate line and the data line, may be further formed in the pixel region in FIG. 1. The switching element is connected to the thin film transistor Tr, which is a driving element. Besides, a power line is spaced apart in parallel from the gate line or the data line, and the thin film transistor Tr may further include a storage capacitor configured to constantly keep a voltage of the gate electrode for one frame.

In addition, the organic light emitting display device 100 may include a color filter for absorbing a part of the light emitted from the organic light emitting diode 200. For example, the color filter may absorb a light of specific wavelength such as red (R), green (G) or blue (B). In this case, the organic light emitting display device 100 can implement full-color through the color filter.

For example, when the organic light emitting display device 100 is a bottom-emission type, the color filter may be disposed on the interlayer insulating layer 140 beneath the organic light emitting diode 200. Alternatively, when the organic light emitting display device 100 is a top-emission type, the color filter may be disposed above the organic light emitting diode 200, that is, a second electrode 220.

A passivation layer 160 is disposed on the source and drain electrodes 152 and 154 over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 154, it may be spaced apart from the second semiconductor layer contact hole 154.

The organic light emitting diode 200 includes a first electrode 210 that is disposed on the passivation layer 160 and connected to the drain electrode 154 of the thin film transistor Tr. The organic light emitting diode 200 further includes an emitting unit 230 as an emission layer and a second electrode 220 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a transparent conductive material such as indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the likes.

In one exemplary embodiment, when the organic light emitting display device 100 is a top-emission type, a reflective electrode or a reflective layer may be disposed under the first electrode 210. For example, the reflective electrode or the reflective layer may include, but is not limited to, aluminum-palladium-copper (APC) alloy.

In addition, a bank layer 170 is disposed on the passivation layer 160 in order to cover edges of the first electrode 210. The bank layer 170 exposes a center of the first electrode 210.

An emitting unit 230 is disposed on the first electrode 210. In one exemplary embodiment, the emitting unit 230 may have a mono-layered structure of an emitting material layer. Alternatively, the emitting unit 230 may include a plurality of charge transfer layers in addition to an emitting material layer. As an example, the emitting unit 230 may have a multiple-layered structure of a hole injection layer, a hole transport layer, an electron blocking layer, an emitting material layer, a hole blocking layer, an electron transport layer and/or an electron injection layer (See, FIGS. 2, 7, 9 and 11). In one embodiment, the organic light emitting diode 200 may have one emitting unit 230. Alternatively, the organic light emitting diode 200 may have multiple emitting units 230 to form a tandem structure. The emitting material layer may include a host, a first delayed fluorescent dopant and a second delayed fluorescent dopant.

The second electrode 220 is disposed over the substrate 102 above which the emitting unit 230 is disposed. The second electrode 220 may be disposed over a whole display area and may include a conductive material with a relatively low work function value compared to the first electrode 210. The second electrode 220 may be a cathode. For example, the second electrode 220 may include, but is not limited to, aluminum (Al), magnesium (Mg), calcium (Ca), silver (Ag), alloys thereof or combinations thereof such as aluminum-magnesium alloy (Al—Mg).

In addition, an encapsulation film 180 may be disposed over the second electrode 220 in order to prevent outer moisture from penetrating into the organic light emitting diode 200. The encapsulation film 180 may have, but is not limited to, a laminated structure of a first inorganic insulating film 182, an organic insulating film 184 and a second inorganic insulating film 186.

[Organic Light Emitting Diode]

Figure 2:
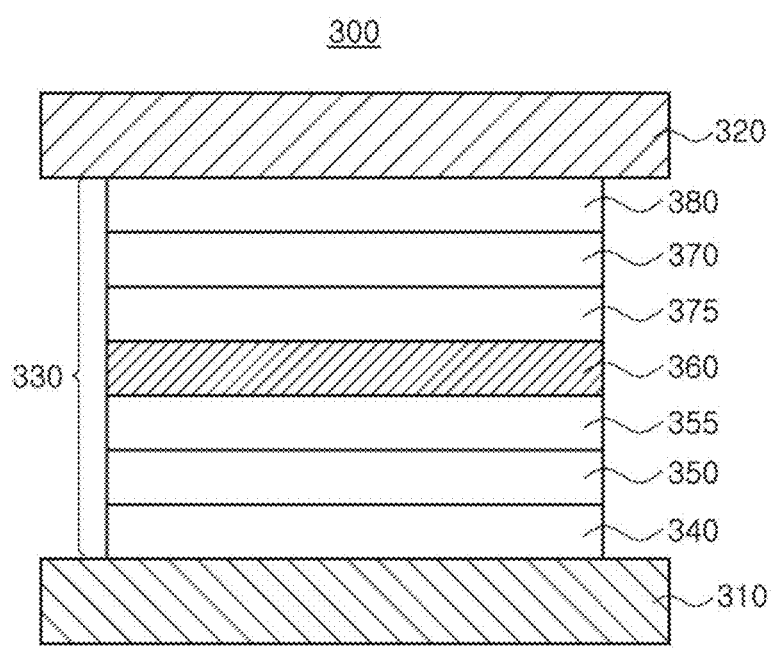
FIG. 2 is a schematic cross-sectional view illustrating an organic light emitting diode in accordance with an exemplary embodiment of the present disclosure.

FIG. 2 is a schematic cross-sectional view illustrating an organic light emitting diode in accordance with an exemplary embodiment of the present disclosure. As illustrated in FIG. 2, the organic light emitting diode (OLED) 300 in accordance with the first embodiment of the present disclosure includes first and second electrodes 310 and 320 facing each other, an emitting unit 330 as an emission layer disposed between the first and second electrodes 310 and 320. In one exemplary embodiment, the emitting unit 330 include a hole injection layer HIL 340, a hole transport layer HTL 350, an emitting material layer EML 360, an electron transport layer ETL 370 and an electron injection layer EIL 380 each of which is laminated sequentially from the first electrode 310. Alternatively, the emitting unit 330 may further comprise a first exciton blocking layer, i.e. an electron blocking layer (EBL) 355 disposed between the HTL 350 and the EML 360 and/or a second exciton blocking layer, i.e. a hole blocking layer (HBL) 375 disposed between the EML 360 and the ETL 370.

The first electrode 310 may be an anode that provides a hole into the EML 360. The first electrode 310 may include, but is not limited to, a conductive material having a relatively high work function value, for example, a transparent conductive oxide (TCO). In an exemplary embodiment, the first electrode 310 may include, but is not limited to, ITO, IZO, ITZO, SnO, ZnO, ICO, AZO, and the likes.

The second electrode 320 may be a cathode that provides an electron into the EML 360. The second electrode 320 may include, but is not limited to, a conductive material having a relatively low work function values, i.e., a highly reflective material such as Al, Mg, Ca, Ag, alloy thereof, combinations thereof, and the likes.

The HIL 340 is disposed between the first electrode 310 and the HTL 350 and improves an interface property between the inorganic first electrode 310 and the organic HTL 350. In one exemplary embodiment, the HIL 340 may include, but is not limited to, 4,4'4"-Tris(3-methylphenylamino)triphenylamine (MTDATA), 4,4',4"-Tris(N,N-diphenylamino)triphenylamine (NATA), 4,4',4"-Tris(N-(naphthalene-1-yl)-N-phenylamino)triphenylamine (1T-NATA), 4,4',4"-Tris(N-(naphthalene-2-yl)-N-phenylamino)triphenylamine (2T-NATA), Copper phthalocyanine (CuPc), Tris (4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl]benzene (TDAPB), poly(3,4-ethylenedioxythiophene)polystyrene sulfonate (PEDOT/PSS) and/or N-(biphenyl-4-yl)-9,9-dimethyl-N-(4-(9-phenyl-9H-carbazol-3-yl)phenyl)-9H-fluoren-2-amine. The HIL 340 may also be omitted according to one inventive embodiment of the OLED 300.

The HTL 350 is disposed adjacently to the EML 360 between the first electrode 310 and the EML 360. In one exemplary embodiment, the HTL 350 may include, but is not limited to, N,N'-Diphenyl-N,N'-bis(3-methylphenyl)-1,1'-biphenyl-4,4'-diamine (TPD), NPB, 4,4'-bis(N-carbazolyl)-1,1'-biphenyl (CBP), Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), Di-[4-(N,N-di-p-tolyl-amino)phenyl]cyclohexane (TAPC), N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EML 360 may include a host doped with a plurality of delayed fluorescent materials. In an exemplary embodiment, the EML 360 may emit blue light, but is not limited thereto. As an example, the EML 360 may include a host (first host; H), a first delayed fluorescent dopant (TD1) and a second delayed fluorescent dopant (TD2). When the EML 360 includes the delayed fluorescent materials, it is possible to fabricate OLED 300 with a further enhanced luminous efficiency.

Organic Light Emitting Diode (OLED) emits light as holes injected from the anode and electrons injected from the cathode are combined to form excitons in EML and then unstable excited state excitons return to a stable ground state. When electrons recombine with holes to form exciton, singlet excitons of a paired spin and triplet excitons of an unpaired spin are produced by a ratio of 1:3 by spin arrangements in theory. Within common fluorescent materials only the singlet exciton among the excitons can be involved in emission process within the common fluorescent materials. Accordingly, the OLED may exhibit luminous efficiency up to 5% when the common fluorescent material is used as a luminous material.

In contrast, phosphorescent materials use different luminous mechanism of converting singlet excitons as well as triplet excitons into light. Phosphorescent materials can convert singlet excitons into triplet excitons through inter-system crossing (ISC). Since phosphorescent materials use both, singlet and triplet excitons during the luminous process, it is possible to enhance luminous efficiency when the OLED uses phosphorescent materials as luminous materials compared to fluorescent materials. However, prior art blue phosphorescent materials exhibit too low color purity to apply with the display device and exhibit very short luminous life span, and therefore, they have not been used in commercial display devices.

Recently, a delayed fluorescent material, which can solve the problems accompanied by the prior art fluorescent and/or phosphorescent materials, has been developed. Representative delayed fluorescent material is a thermally-activated delayed fluorescent (TADF) material. Since the delayed fluorescent material generally has both an electron donor moiety and an electron acceptor moiety within its molecular structure, it can be converted to an intramolecular charge transfer (ICT) state. In case of using the delayed fluorescent material as a dopant, it is possible to use both the excitons of singlet energy level $S_1$ and the excitons of triplet energy level $T_1$ during the emission process.

The luminous mechanism of the delayed fluorescent material will be explained with referring to FIG. 3, which is a schematic diagram illustrating a luminous mechanism of a delayed fluorescent material and illustrates a state of exciton energy loss by converting an excited state triplet exciton to a hot triplet exciton.

Figure 3:
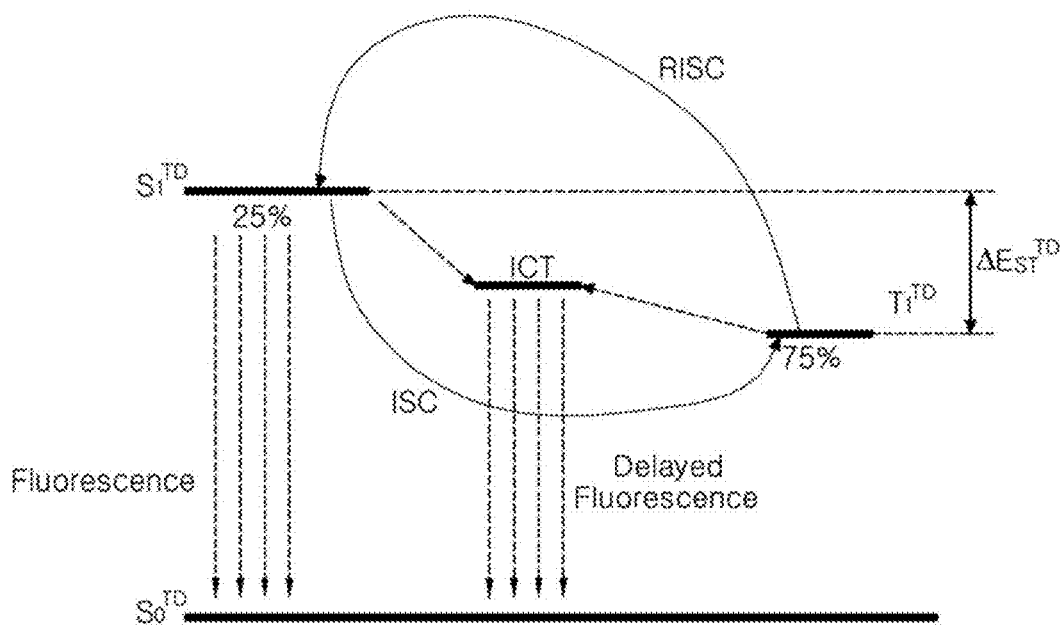
FIG. 3 is a schematic diagram illustrating a luminous mechanism of a delayed fluorescent material.

As illustrated in FIG. 3, the excitons of singlet energy level $S_1^{TD}$ are emitted as fluorescence. On the contrary, the excitons of triplet energy level $T_1^{TD}$ are charge transfer (CT) state because the triplet exciton can be transferred to the ICT state. Since the exciton at CT state can have singlet characteristics as well as triplet characteristics, the exciton at CT state in the delayed fluorescent material can move to an exciton of singlet energy level by Reverse Intersystem Crossing (RISC) mechanism, and then the converted exciton of singlet energy level is transferred to a ground state ($S_0^{TD}$; $S_1^{TD} \rightarrow ICT \leftarrow T_1^{TD}$). Since the excitons of singlet energy level $S_1^{TD}$ as well as the excitons of triplet energy level $T_1^{TD}$ in the delayed fluorescent material are involved in the emission process, the delayed fluorescent material can improve its internal quantum efficiency and its luminous efficiency.

Since both the Highest Occupied Molecular Orbital (HOMO) and the Lowest Unoccupied Molecular orbital (LUMO) are widely distributed over the whole molecule within the common fluorescent material, it is not possible to inter-convert exciton energies between the singlet energy level and the triplet energy level within the common fluorescent material (selection rule). In contrast, since the delayed fluorescent material, which can be converted to ICT state, has little orbital overlaps between HOMO and LUMO, there is little interaction between the HOMO state molecular orbital and the LUMO state molecular orbital. As a result, the changes of spin states of electrons do not have an influence on other electrons, and a new charge transfer band (CT band) that does not follow the selection rule is formed within the delayed fluorescent material.

In other words, since the delayed fluorescent material has the electron acceptor moiety spacing apart from the electron donor moiety within the molecule, it exists as a polarized state having a large dipole moment within the molecule. As the interaction between HOMO molecular orbital and LUMO molecular orbital becomes little in the state where the dipole moment is polarized, the excitons at triplet energy level can be converted to ICT state where the exciton becomes CT state in which the excitons has triplet characteristics as well as singlet characteristics. As the triplet exciton at CT state is converted into singlet exciton by RISC, a delayed fluorescence occurs. Accordingly, the excitons of triplet energy level $T_1^{TD}$ as well as the excitons of singlet energy level $S_1^{TD}$ can be involved in the emission process.

In case of driving an organic light emitting diode that includes the delayed fluorescent material, 25% excitons of singlet energy level $S_1^{TD}$ and 75% excitons of triplet energy level $T_1^{TD}$ are converted to ICT state by heat or electrical field, and then the converted excitons transfer to the ground state $S_0$ with luminescence. Therefore, the delayed fluorescent material may have 100% internal quantum efficiency in theory.

The delayed fluorescent material must has an energy level bandgap $\Delta E_{ST}^{TD}$ equal to or less than about 0.3 eV, for example, from about 0.05 to about 0.3 eV, between the singlet energy level $S_1^{TD}$ and the triplet energy level $T_1^{TD}$ so that singlet energy in both the singlet energy level $S_1^{TD}$ and the triplet energy level $T_1^{TD}$ can be transferred to the ICT state. The material having little energy level bandgap between the singlet energy level $S_1^{TD}$ and the triplet energy level $T_1^{TD}$ can exhibit common fluorescence by excitons of singlet energy level $S_1^{TD}$, as well as delayed fluorescence with Reverse Inter System Crossing (RISC) in which the excitons of triplet energy level $T_1^{TD}$ can be transferred upwardly to the excitons of singlet energy level $S_1^{TD}$, and then the exciton of singlet energy level $S_1^{TD}$ converted from the triplet energy level $T_1^{TD}$ can be transferred to the ground state $S_0^{TD}$.

However, additional charge transfer transition (CT transition) is caused in the delayed fluorescent material consisting of an electron donor moiety and an electron acceptor moiety owing to chemical conformations and structural twists between those moieties. As a result, the delayed fluorescent material, including an electron donor moiety and an electron acceptor moiety, shows emission wavelength having very broad FWHM (full width at half maximum) due to the luminescence property attributed to the CT luminescence mechanism. Consequently, it has a limited potential to be applied in a display device requiring high color purity.

In order to solve the limitation of the delayed fluorescent material having a wide FWHM, it may be considered to apply a fluorescent material having a relatively narrow FWHM. In this case, the triplet exciton energy of the delayed fluorescent material is transferred to a triplet exciton of the fluorescent material with an up-conversion to the singlet exciton of the delayed fluorescent material.

Due to the bond conformation between the electron acceptor and the electron donor and sterical twists within the delayed fluorescent material, as described above, additional charge transfer transitions (CT transitions) are caused within the delayed fluorescent material. Since the delayed fluorescent material shows an emission spectrum having a very broad FWHM caused by the CT transition mechanism in the course of the emission, a poor color purity is obtained. That is, since the delayed fluorescent material emits light by CT luminescence mechanism utilizing triplet exciton energy, it has a very short luminous life span and a limit in terms of color purity caused by its wide FWHM.

A hyper-fluorescence accompanied by a delayed fluorescent material solves the limitations. It uses the delayed fluorescent material so as to raise a generation ratio of the singlet exciton in a fluorescent material that can use only singlet exciton energy. Since the delayed fluorescent material can utilize the triplet exciton energy as well as the singlet exciton energy, the fluorescent material can absorb the exciton energy released from the delayed fluorescent material, and then the exciton energy absorbed by the fluorescent material can be utilized in the emission process with generating 100% singlet exciton.

However, since the triplet exciton of the fluorescent material does not participate in the luminescent mechanism, the triplet exciton energy of the delayed fluorescent material is quenched. Accordingly, the luminous efficiency of OLED further including the fluorescent material is really reduced by about 2 to 3% compared with the luminous efficiency of OLED to which only the delayed fluorescent material is applied.

Figure 4:
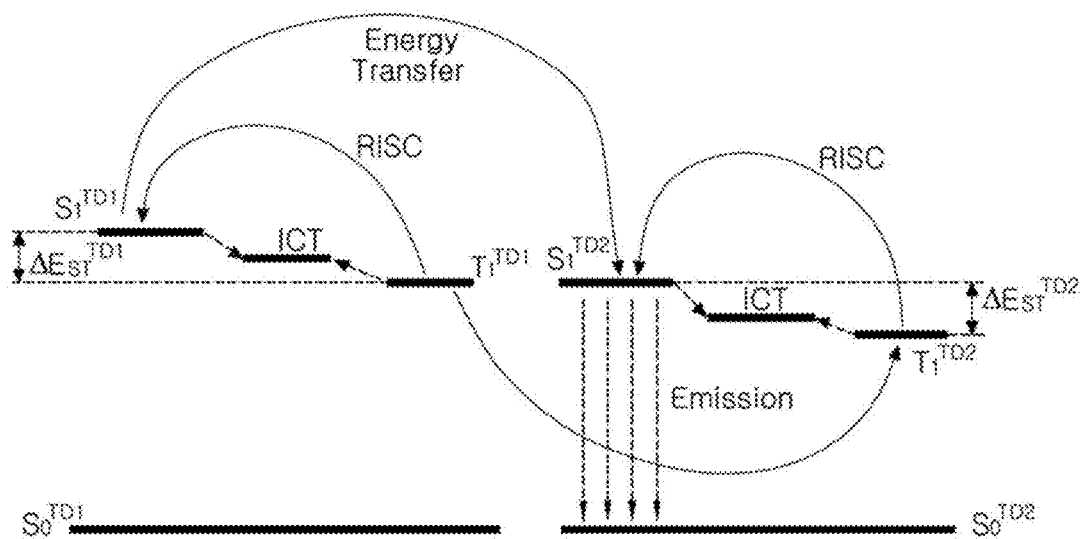
FIG. 4 is a schematic diagram illustrating luminous mechanism in the case of using a plurality of delayed fluorescent materials having different excited state triplet energy levels in accordance with an exemplary embodiment of the present disclosure.

The EML 360 in the OLED 300 in accordance with the first embodiment includes a plurality of delayed fluorescent materials whose energy levels are different from each other so that the OLED 300 can improve its luminous efficiency and color purity. FIG. 4 is a schematic diagram illustrating luminous mechanism in case of using a plurality of delayed fluorescent materials having different excited state triplet energy levels in accordance with an exemplary embodiment of the present disclosure.

As illustrated in FIGS. 2 and 4, the EML 360 includes a first delayed fluorescent dopant (TD1) and a second delayed fluorescent dopant (TD2) as a delayed fluorescent material. Each of an excited state singlet energy level $S_1^{TD1}$ and an excited state triplet energy level $T_1^{TD1}$ of the first delayed fluorescent dopant (TD1) is higher than each of an excited state singlet energy level $S_1^{TD2}$ and an excited state triplet energy level $T_1^{TD2}$ of the second delayed fluorescent dopant (TD2), respectively.

Accordingly, a part of an exciton energy at the excited state triplet energy level $T_1^{TD1}$ of the first delayed fluorescent dopant (TD1) is converted to an exciton energy at the excited state singlet energy level $S_1^{TD1}$ by RISC mechanism (up-conversion), and the rest of an exciton energy at the excited state triplet energy level of the first delayed fluorescent dopant is transferred to an excited state triplet energy level $T_1^{TD2}$ of the second delayed fluorescent dopant (TD2). The exciton energy at the excited state singlet energy level $S_1^{TD1}$, which is converted from the excited state triplet energy level $T_1^{TD1}$ of the first delayed fluorescent dopant (TD1), is transferred to exciton energy at the excited state singlet energy level $S_1^{TD2}$ of the second delayed fluorescent dopant (TD2). The exciton energy at the excited state triplet energy level $T_1^{TD2}$ of the second delayed fluorescent dopant (TD2), which is transferred from the excited state triplet energy level $T_1^{TD1}$ of the first delayed fluorescent dopant (TD1), is converted to exciton energy at the excited state singlet energy level $S_1^{TD2}$ of the second delayed fluorescent dopant (TD2) by another RISC mechanism.

The second delayed fluorescent dopant (TD2) can emit light utilizing i) the exciton energy transferred from the excited state singlet energy level $S_1^{TD1}$ of the first delayed fluorescent dopant as well as ii) exciton energy transferred from the excited state triplet energy level $T_1^{TD1}$ of the first delayed fluorescent dopant (TD1) through the excited state triplet energy level $T_1^{TD2}$ of the second delayed fluorescent dopant (TD2) at the excited state singlet energy level $S_1^{TD2}$. The exciton energy transferred from the first delayed fluorescent dopant is not quenched, but is harvested by the second delayed fluorescent dopant to be involved in the final luminescence by applying a plurality of delayed fluorescent materials whose energy levels are controlled within predetermined ranges in accordance with the first embodiment of the present disclosure. The OLED 300 can maximize its luminous efficiency to realize a hyper-fluorescence. Since final luminescence occurs at the second delayed fluorescent dopant, which may have narrow FWHM, it is possible to fabricate an OLED having an improved color purity.

In order to realize a delayed fluorescence, each of the first and second delayed fluorescent dopants (TD1 and TD2) has a smaller energy level bandgap between the excited state singlet energy levels $S_1^{TD1}$ and $S_1^{TD2}$ and the excited state triplet energy levels $T_1^{TD1}$ and $T_1^{TD2}$ than a common fluorescent material. As an example, an energy level bandgap $\Delta E_{ST}^{TD1}$ between the excited state singlet energy level $S_1^{TD1}$ and the excited state triplet energy level $T_1^{TD1}$ of the first delayed fluorescent dopant (TD1) may be equal to or less than about 0.3 eV, for example about 0.05 to about 0.3 eV. Also, an energy level bandgap $\Delta E_{ST}^{TD2}$ between the excited state singlet energy level $S_1^{TD2}$ and the excited state triplet energy level $T_1^{TD2}$ of the second delayed fluorescent dopant (TD2) may be equal to or less than about 0.2 eV, for example about 0.05 to about 0.2 eV.

Figure 5:
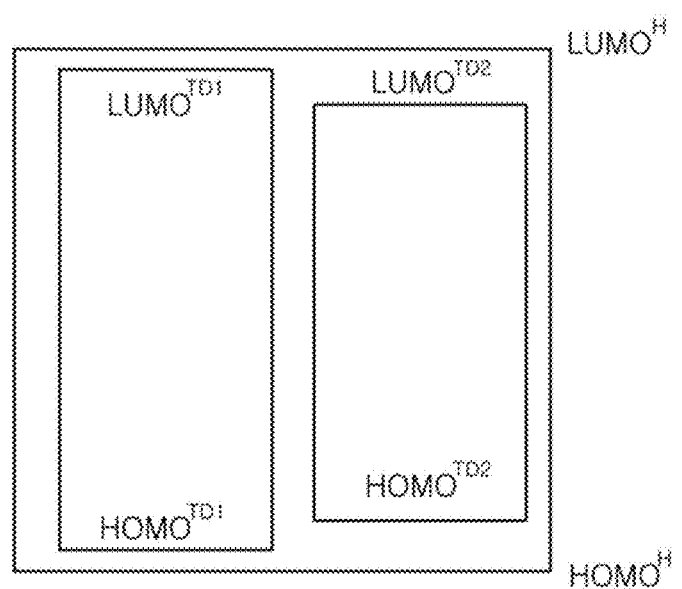
FIG. 5 is a schematic diagram illustrating HOMO and LUMO energy level relationships among luminous materials in accordance with an exemplary embodiment of the present disclosure.

Moreover, when the EML 360 includes the luminous materials such as the first host, the first delayed fluorescent dopant and the second delayed fluorescent dopant, highest occupied molecular orbital (HOMO) energy levels and/or lowest unoccupied molecular orbital (LUMO) energy levels among those luminous materials are considered as another important factor or parameter to realize efficient luminescence in the EML 360. FIG. 5 is a schematic diagram illustrating HOMO and LUMO energy level relationships among luminous materials in accordance with an exemplary embodiment of the present disclosure.

As illustrated schematically in FIG. 5, a HOMO energy level $HOMO^H$ of the host in the EML 360 (See, FIG. 2) is equal to or deeper (lower) than a HOMO energy level $HOMO^{TD1}$ of the first delayed fluorescent dopant. In other words, the HOMO energy level $HOMO^H$ of the host and the HOMO energy level $HOMO^{TD1}$ of the first delayed fluorescent dopant should satisfy the following relationship in Equation (1):

$$HOMO^H \leq HOMO^{TD1} \tag{1}$$

When an energy level bandgap between the HOMO energy level $HOMO^H$ of the host and the HOMO energy level $HOMO^{TD1}$ of the first delayed fluorescent dopant is too large, the hole exciton energy may not be transferred to the first delayed fluorescent dopant. In one exemplary embodiment, the HOMO energy level bandgap $|HOMO^H-HOMO^{TD1}|$ between the HOMO energy level $HOMO^H$ of the host and the HOMO energy level $HOMO^{TD1}$ of the first delayed fluorescent dopant satisfies the following relationship in Equation (2):

$$|HOMO^H-HOMO^{TD1}| < 0.3 \text{ eV} \tag{2}$$

In addition, the first delayed fluorescent dopant should not interfere with the luminescence mechanism of the second delayed fluorescent dopant. Therefore, the HOMO energy level $HOMO^{TD1}$ of the first delayed fluorescent dopant is deeper than a HOMO energy level $HOMO^{TD2}$ of the second delayed fluorescent dopant. As an example, the HOMO energy level $HOMO^{TD1}$ of the first delayed fluorescent dopant and the HOMO energy level $HOMO^{TD2}$ of the second delayed fluorescent dopant satisfy the following relationship in Equation (3):

$$HOMO^{TD2}-HOMO^{TD1} > 0.2 \text{ eV} \tag{3}$$

When the HOMO energy levels of the host, the first delayed fluorescent dopant and the second delayed fluorescent dopant satisfy the relationships in Equations (1) and (3), the holes injected into the host can be injected into the second delayed fluorescent dopant via the first delayed fluorescent dopant. Accordingly, the holes are recombined with electrons at the second delayed fluorescent dopant irrespective of the first delayed fluorescent dopant so that light emission can occur at the second delayed fluorescent dopant.

As an example, when the HOMO energy level $HOMO^{TD1}$ of the first delayed fluorescent dopant is equal to or shallower than the HOMO energy level $HOMO^{TD2}$ of the second delayed fluorescent dopant, the holes injected via the host is trapped at the first delayed fluorescent dopant. Accordingly, an excited complex, i.e. exciplex is formed between the first delayed fluorescent dopant trapping holes and the second delayed fluorescent dopant absorbing electron excitons, ultimate light emission peak is shifted toward longer wavelength ranges, and luminous life span of the delayed fluorescent dopants are reduced.

In another exemplary embodiment, the HOMO energy level $HOMO^{TD1}$ of the first delayed fluorescent dopant and the HOMO energy level $HOMO^{TD2}$ of the second delayed fluorescent dopant may satisfy the following relationship in Equation (4):

$$0.2 \text{ eV} < HOMO^{TD2}-HOMO^{TD1} < 1.0 \text{ eV} \tag{4}$$

When the HOMO energy levels $HOMO^{TD1}$ and $HOMO^{TD2}$ of the first and second delayed fluorescent dopants satisfy the relationship in Equation (4), holes injected from the host can be transferred to the second delayed fluorescent dopant rapidly without being trapped at the first delayed fluorescent dopant.

Moreover, a LUMO energy level $LUMO^H$ of the host in the EML 360 is shallower than a LUMO energy level $LUMO^{TD1}$ of the first delayed fluorescent dopant with respect to a zero point on the energy scale. In other words, the LUMO energy level $LUMO^H$ of the host and the LUMO energy level $LUMO^{TD1}$ of the first delayed fluorescent dopant satisfy the following relationship in Equation (5):

$$LUMO^H > LUMO^{TD1} \tag{5}$$

In addition, the first delayed fluorescent dopant should not interfere with the luminescence mechanism of the second delayed fluorescent dopant. Therefore, a LUMO energy level $LUMO^{TD1}$ of the first delayed fluorescent dopant is equal to or shallower than the LUMO energy level $LUMO^{TD2}$ of the second delayed fluorescent dopant with respect to a zero point on the energy scale. As an example, the LUMO energy level $LUMO^{TD1}$ of the first delayed fluorescent dopant and the LUMO energy level $LUMO^{TD2}$ of the second delayed fluorescent dopant satisfy the following relationship in Equation (7):

$$LUMO^{TD1} \geq LUMO^{TD2} \tag{7}$$

When the LUMO energy levels of the host, the first and second delayed fluorescent dopants satisfy the relationships in Equations (5) and (7), electrons injected to the host can be injected into the second delayed fluorescent dopant via the first delayed fluorescent dopant. Accordingly, the electrons are recombined with holes at the second delayed fluorescent dopant irrespective of the first delayed fluorescent dopant so that light emission can occur at the second delayed fluorescent dopant.

When an energy level bandgap between the LUMO energy level $LUMO^H$ of the host and the LUMO energy level $LUMO^{TD1}$ of the first delayed fluorescent dopant is too large, the electron exciton energy may not be transferred to the first delayed fluorescent dopant. In one exemplary embodiment, the LUMO energy level bandgap $|LUMO^H-LUMO^{TD1}|$ between the LUMO energy level $LUMO^H$ of the host and the LUMO energy level $LUMO^{TD1}$ of the first delayed fluorescent dopant thus satisfies the following relationship in Equation (6):

$$0.3\ eV < LUMO^H - LUMO^{TD1} < 1.0\ eV \quad (6)$$

When the LUMO energy levels $LUMO^{TD1}$ of the first delayed fluorescent dopant is deeper than the LUMO energy level $LUMO^{TD2}$ of the second delayed fluorescent dopant, the electrons injected via the host is trapped at the first delayed fluorescent dopant. Accordingly, as an exciplex is formed between the first delayed fluorescent dopant trapping electrons and the second delayed fluorescent dopant absorbing hole excitons, ultimate light emission peak is shifted toward longer wavelength ranges, and luminous life span of the delayed fluorescent dopants are reduced.

In still another exemplary embodiment, the LUMO energy level $LUMO^{TD1}$ of the first delayed fluorescent dopant and the LUMO energy level $LUMO^{TD2}$ of the second delayed fluorescent dopant may satisfy the following relationship in Equation (8):

$$|LUMO^{TD1} - LUMO^{TD2}| < 0.2\ eV \quad (8)$$

When the LUMO energy levels $LUMO^{TD1}$ and $LUMO^{TD2}$ of the first and second delayed fluorescent dopants satisfy the relationship in Equation (8), electrons injected from the host can be transferred to the second delayed fluorescent dopant rapidly without being trapped at the first delayed fluorescent dopant.

In one exemplary embodiment, the first delayed fluorescent dopant (TD1) may have a molecular structure in which an electron acceptor moiety and an electron donor moiety are connected via a proper linker so as to realize a delayed fluorescence. As an example, the first delayed fluorescent dopant (TD1) may include, but is not limited to, an organic compound having the following structure of Chemical Formula 1:

Chemical Formula 1

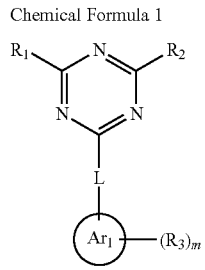

In Chemical Formula 1, each of $R_1$ and $R_2$ is independently a $C_5$~$C_{30}$ aryl group or a $C_4$~$C_{30}$ hetero aryl group. $R_3$ is halogen, a $C_1$~$C_{20}$ alkyl halide, a cyano group, a nitro group, a linear or branched $C_1$~$C_{20}$ alkyl group, a $C_1$~$C_{20}$ alkoxy group, a $C_5$~$C_{30}$ aryl group unsubstituted or substituted with a group selected from halogen, a $C_1$~$C_{20}$ alkyl halide, a cyano group, a nitro group and combinations thereof, or a $C_4$~$C_{30}$ hetero aryl group unsubstituted or substituted with a group selected from halogen, a $C_1$~$C_{20}$ alkyl halide, a cyano group, a nitro group and combinations thereof. m is a number of substituent and is an integer of 1 to 5. $Ar_1$ is a $C_{10}$~$C_{30}$ fused hetero aryl group. L is a $C_5$~$C_{30}$ arylene group unsubstituted or substituted with one or more groups selected from halogen, a $C_1$~$C_{20}$ alkyl halide, a cyano group, a nitro group and combinations thereof, or a $C_4$~$C_{30}$ hetero arylene group unsubstituted or substituted with one or more groups selected from halogen, a $C_1$~$C_{20}$ alkyl halide, a cyano group, a nitro group and combinations thereof.

As used herein, the term "unsubstituted" means that hydrogen atom is bonded, and in this case hydrogen atom comprises protium, deuterium and tritium.

As used herein, the term "hetero" described in "hetero aromatic ring", "hetero aromatic group", "hetero alicyclic ring", "hetero cyclic alkyl group", "hetero aryl group", "hetero aralkyl group", "hetero aryloxyl group", "hetero aryl amino group", "hetero arylene group", "hetero aralkylene group", "hetero aryloxylene group", and the likes means that at least one carbon atoms, for example 1 to 5 carbon atoms, forming such aromatic or alicyclic rings are substituted with at least one hetero atoms selected from the group consisting of N, O, S and combinations thereof.

As an example, each of the $C_5$~$C_{30}$ aryl group constituting each of $R_1$ to $R_3$ may be independently, but is not limited to, a unfused or fused aryl group such as phenyl, biphenyl, naphthyl, anthracenyl, indenyl, indacenyl, phenalenyl, phenanthrenyl, benzophenanthrenyl, dibenzophenanthrenyl, azulenyl, pyrenyl, fluoranthenyl, chrysenyl, tetraphenyl, tetracenyl, pleiadenyl, pycenyl, pentaphenyl, pentacenyl, fluorenyl, indenoindenyl, indenofluorenyl or spiro fluorenyl.

In another exemplary embodiment, each of the $C_4$~$C_{30}$ hetero aryl group constituting each of $R_1$ to $R_3$ may be independently, an unfused or fused hetero aryl group such as furanyl, thiophenyl, pyrrolyl, pyridinyl, pyrimidinyl, pyrazinyl, pyridazinyl, triazinyl, tetrazinyl, imidazolyl, pyrazolyl, indolyl, carbazolyl, benzocarbazolyl, dibenzocarbazolyl, indolocarbazolyl, indenocarbazolyl, benzofuranocarbazolyl, benzothienocarbazolyl, quinolinyl, iso-quinolinyl, phthalazinyl, quinoxalinyl, cinnolinyl, quinazolinyl, benzoquinolinyl, benzoiso-quinolinyl, benzoquinazolinyl, benzoquinoxalinyl, acridinyl, phenanthrolinyl, phenazinlyl, phenoxazinyl, phenothiazinyl, pyranyl, oxazinyl, oxazolyl, iso-oxazolyl, oxadiazolyl, triazolyl, dioxinyl, benzofuranyl, dibenzofuranyl, thiopyranyl, thiazinyl, benzothiophenyl, dibenzothiophenyl, spiro acridinyl linked to xanthene and the likes, dihydroacridnyl substituted with at least one $C_1$~$C_{10}$ alkyl, N-substituted spiro fluorenyl (in case $R_1$ and $R_2$ are combined).

As an example, $Ar_1$, which is the electron donor moiety in Chemical Formula 1, includes, but is not limited to, carbazolyl, indolocarbazolyl, phenazinyl, phenoxazinyl, phenothiazinyl, acridinyl, spirofluoro acridinyl, spiroxantheno acridinyl and the likes.

In addition, L, which is a linker connecting the electron donor moiety $Ar_1$ and the electron acceptor moiety triazine moiety, may be selected from the group, but is not limited to, phenylene, biphenylene, terphenylene, tetraphenylene, indenylene, naphthylene, azulenylene, indacenylene, acenaphthylene, fluorenylene, spiro-fluorenylene, phenalenylene, phenanthrenylene, anthracenylene, fluoranthenylene, triphenylenylene, pyrenylene, chrysenylene, naphthacenylene, picenylene, perylenylene, pentaphenylene and hexacenylene.

In one exemplary embodiment, $Ar_1$ in Chemical Formula 1 may include a carbazolyl moiety. As an example, the first delayed fluorescent dopant may include, but is not limited to, an organic compound having the following structure of Chemical Formula 2:

Chemical Formula 2

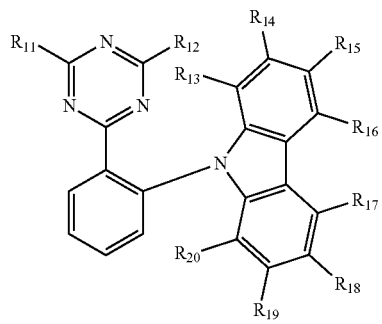

In Chemical Formula 2, each of $R_{11}$ and $R_{12}$ is independently a $C_5$~$C_{20}$ aryl group. Each of $R_{13}$ to $R_{20}$ is independently protium, deuterium, tritium, a cyano group, a linear or branched $C_1$~$C_{10}$ alkyl group, a $C_5$~$C_{30}$ aryl amino group unsubstituted or substituted with $C_5$~$C_{20}$ aryl group, a $C_5$~$C_{30}$ aryl group unsubstituted or substituted with a cyano group, or a $C_4$~$C_{30}$ hetero aryl group unsubstituted or substituted with a cyano group.

As an example, at least one of $R_{13}$ to $R_{20}$ in Chemical Formula 2 may not be hydrogen.

Particularly, the first delayed fluorescent dopant may include, but is not limited to, any of the following structures of Chemical Formula 3.

Chemical Formula 3

A-1

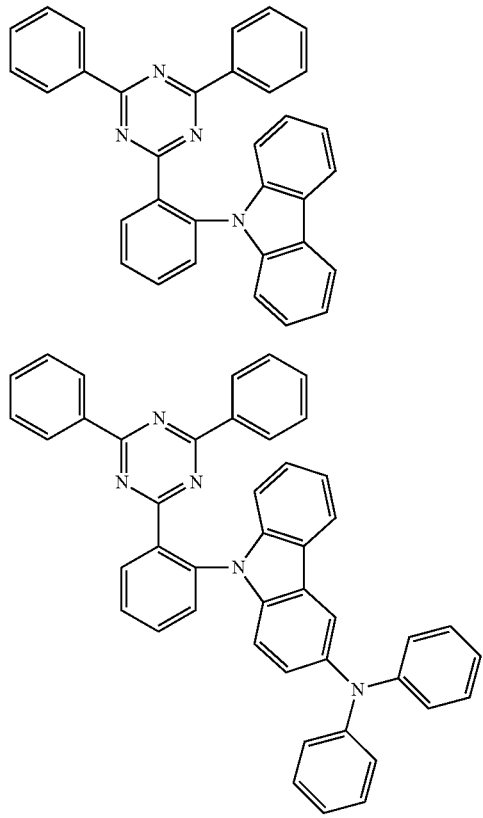

A-2

A-3

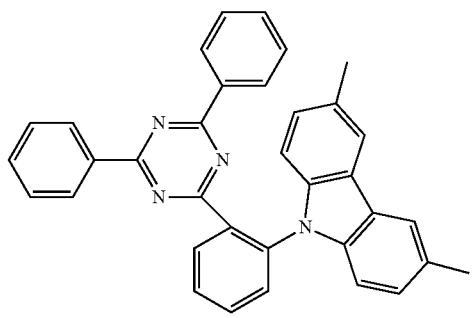

A-4

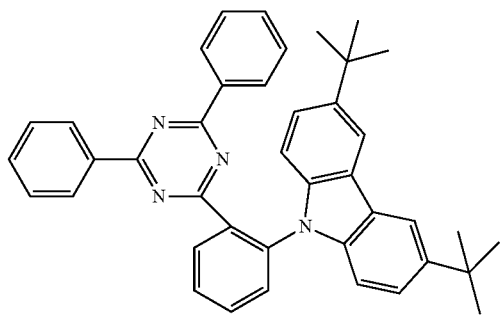

A-5

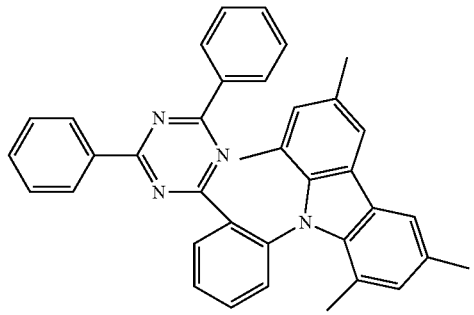

A-6

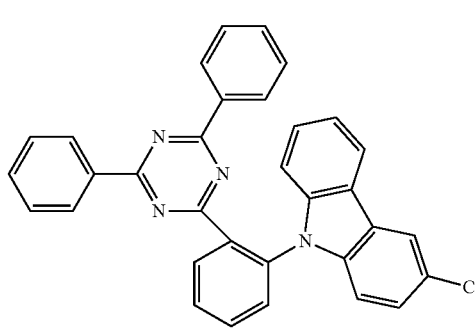

A-7

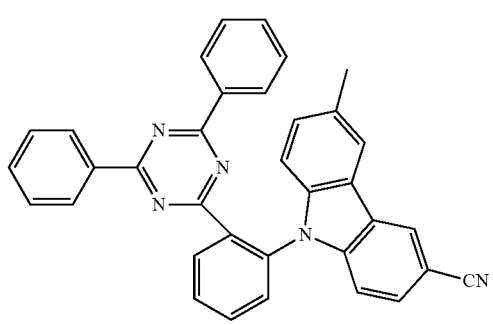

A-8

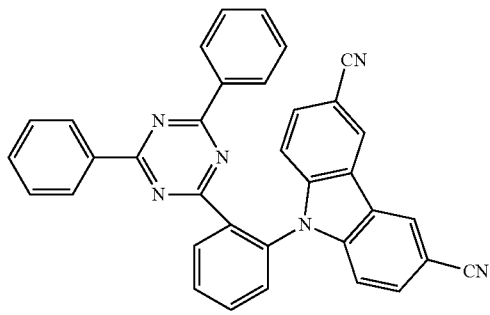

A-9

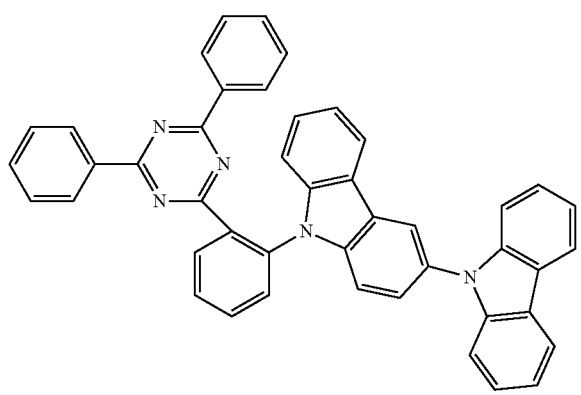

A-10

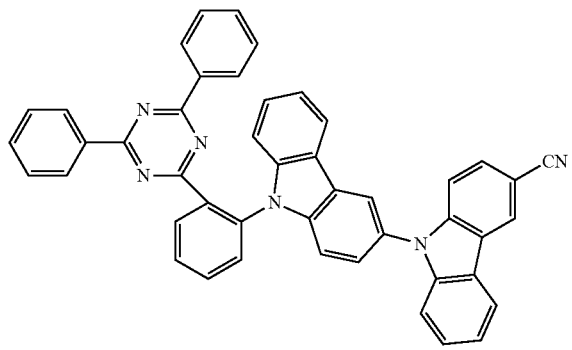

A-11

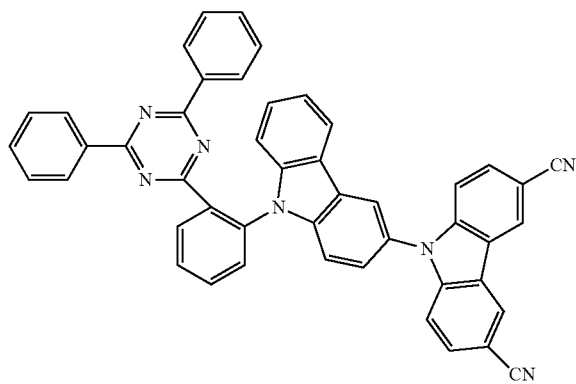

A-12

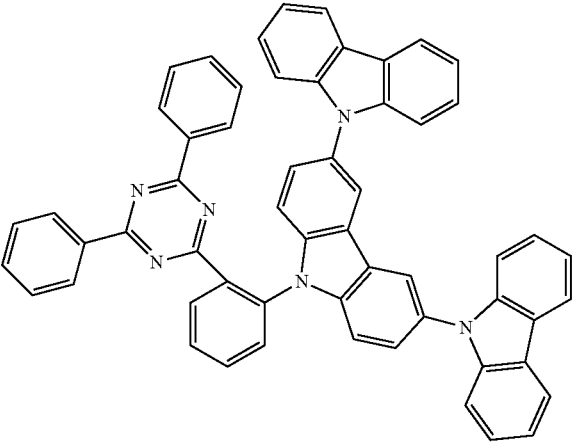

In another exemplary embodiment, the second delayed fluorescent dopant may be an organic compound having a plurality of fused hetero aromatic moieties and a narrow FWHM, unlike the first delayed fluorescent dopant having the electron donor moiety and the electron acceptor moiety. As an example, the second delayed fluorescent dopant may include, but is not limited to, an organic compound having the following structure of Chemical Formula 4:

Chemical Formula 4

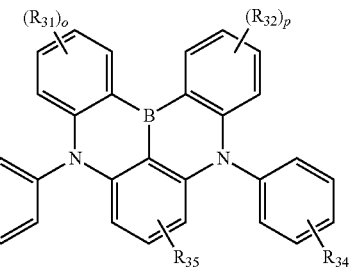

In Chemical Formula 4, each of $R_{31}$ and $R_{32}$ is independently a linear or branched $C_1$~$C_{20}$ alkyl group, a $C_1$~$C_{20}$ alkoxy group, a $C_5$~$C_{30}$ aryl group, a $C_4$~$C_{30}$ hetero aryl group or an aromatic or hetero aromatic amino group, wherein the amino group is substituted with a group selected from the group consisting of a $C_5$~$C_{30}$ aryl group, a $C_4$~$C_{30}$ hetero aryl group, a $C_5$~$C_{30}$ aryl amino group unsubstituted or substituted with a $C_5$~$C_{20}$ aryl group, a $C_4$~$C_{30}$ hetero aryl amino group unsubstituted or substituted with a $C_4$~$C_{20}$ hetero aryl group and combinations thereof. Alternatively, two adjacent groups among each of $R_{31}$ and $R_{32}$ form respectively a $C_5$~$C_{20}$ fused aromatic ring or a $C_4$~$C_{20}$ fused hetero aromatic ring. Wherein each of the $C_5$~$C_{20}$ fused aromatic ring and the $C_4$~$C_{20}$ fused hetero aromatic ring is independently unsubstituted or substituted with a $C_5$~$C_{20}$ aryl group or a $C_4$~$C_{20}$ hetero aryl group. Each of o and p is a number of a substituent and an integer of 0 to 3. Each of $R_{33}$ and $R_{34}$ is independently protium, deuterium, tritium, a linear or branched $C_1$~$C_{20}$ alkyl group, a $C_1$~$C_{20}$ alkoxy group, a $C_5$~$C_{30}$ aryl group or a $C_4$~$C_{30}$ hetero aryl group. $R_{35}$ is protium, deuterium, tritium, a linear or branched $C_1$~$C_{20}$ alkyl group, a $C_1$~$C_{20}$ alkoxy group or an aromatic or hetero aromatic amino group. Wherein the amino group is substituted with a group selected from the group consisting of a $C_5$~$C_{30}$ aryl group, a $C_4$~$C_{30}$ hetero aryl group and combinations thereof.

In accordance with an exemplary embodiment, each of the aryl group and the hetero aryl group constituting each of $R_{31}$ to $R_{35}$ in Chemical Formula 4 may be the same as the aryl group and the hetero aryl group constituting each of $R_1$ to $R_3$ in Chemical Formula 1. As an example, the second dopant may include, but is not limited to, an organic compound having the following structure of Chemical Formula 5:

Chemical Formula 5

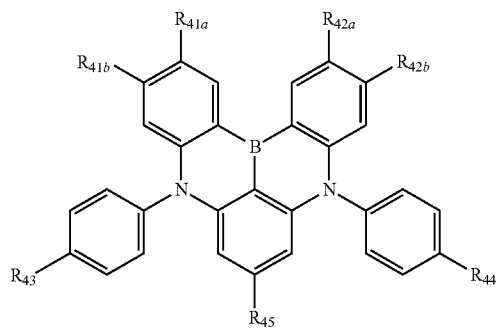

In Chemical Formula 5, each of $R_{41a}$, $R_{41b}$, $R_{42a}$ and $R_{42b}$ is independently protium, deuterium, tritium, a linear or branched $C_1$~$C_{10}$ alkyl group, a $C_5$~$C_{30}$ aryl group, a $C_4$~$C_{30}$ hetero aryl group or an aromatic or hetero aromatic amino group, wherein the amino group is substituted with a group selected from the group consisting of a $C_5$~$C_{30}$ aryl group, a $C_4$~$C_{30}$ hetero aryl group, a $C_5$~$C_{30}$ aryl amino group unsubstituted or substituted with a $C_5$~$C_{20}$ aryl group, a $C_4$~$C_{30}$ hetero aryl amino group unsubstituted or substituted with a $C_4$~$C_{20}$ hetero aryl group and combinations thereof. Alternatively, two adjacent groups among $R_{41a}$, $R_{41b}$, $R_{42a}$ and $R_{42b}$ form respectively a $C_4$~$C_{20}$ fused hetero aryl ring unsubstituted or substituted with a $C_5$~$C_{20}$ aryl group. Each of $R_{43}$ and $R_{44}$ is independently protium, deuterium, tritium, a linear or branched $C_1$~$C_{10}$ alkyl group or an aromatic or hetero aromatic amino group. The amino group may be substituted with a group selected from the group consisting of a $C_5$~$C_{30}$ aryl group, a $C_4$~$C_{30}$ hetero aryl group and combinations thereof. $R_{45}$ is protium, deuterium tritium, a linear or branched $C_1$-$C_{20}$ alkyl group, a $C_1$-$C_{20}$ alkoxy group or an aromatic or hetero aromatic amino group, wherein the amino group is substituted with a group selected from the group consisting of $C_5$-$C_{30}$ aryl group, $C_4$-$C_{30}$ hetero aryl group and combinations thereof.

Particularly, the second delayed fluorescent dopant may include, but is not limited to, any having the following structures of Chemical Formula 6.

Chemical Formula 6

B-1

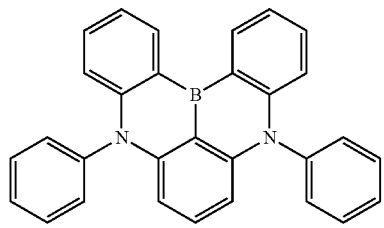

B-2

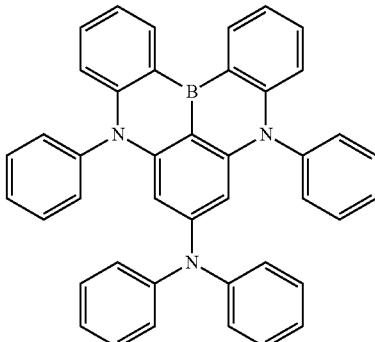

B-3

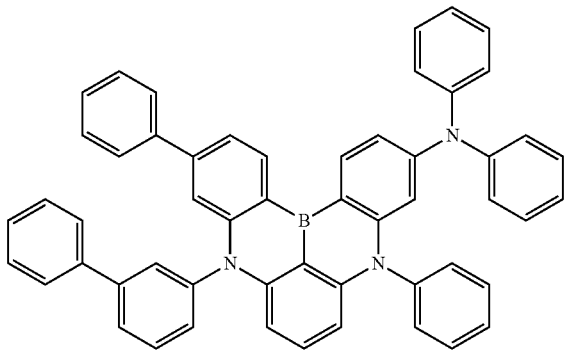

B-4

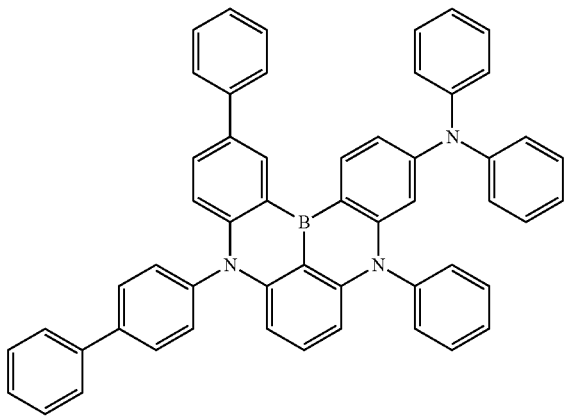

B-5

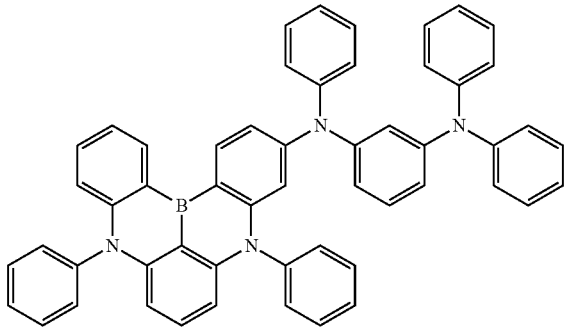

B-6
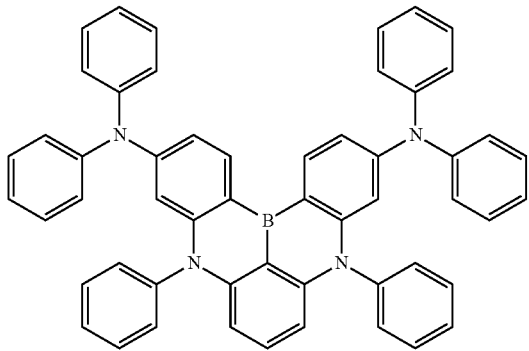

B-7
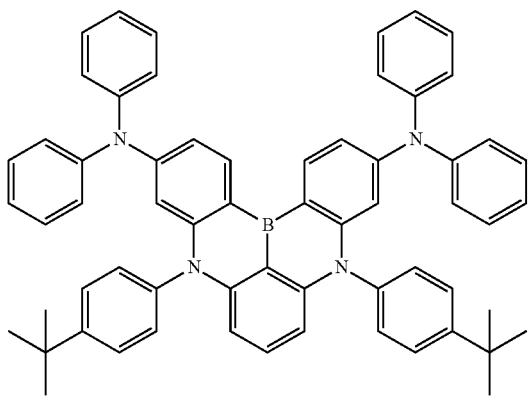

B-8
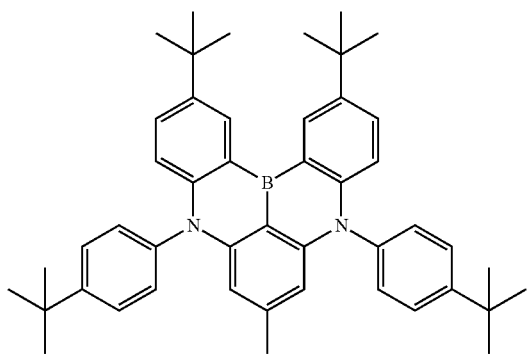

B-9
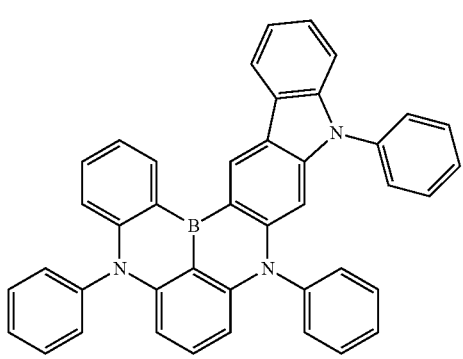

B-10
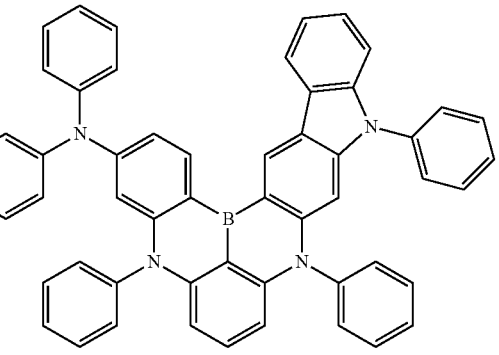

B-11
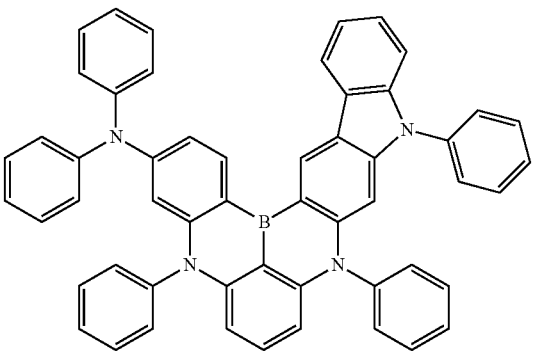

Figure 6:
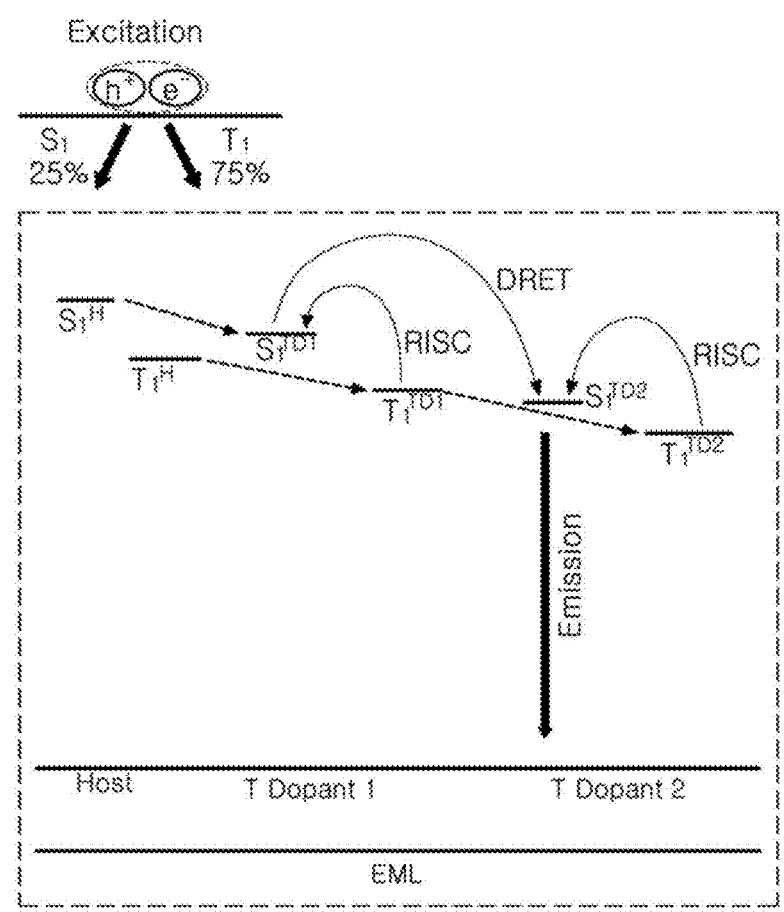
FIG. 6 is a schematic diagram illustrating luminous mechanism by energy level bandgap among luminous materials in accordance with an exemplary embodiment of the present disclosure.

When the EML 360 of the OLED 300 in accordance with the first embodiment of the present disclosure includes the host, the first and second delayed fluorescent dopants, the relationships of the singlet and triplet energy levels among those luminous materials are explained with referring to FIG. 6.

FIG. 6 is a schematic diagram illustrating luminous mechanism by energy level bandgap among luminous materials in accordance with an exemplary embodiment of the present disclosure. As illustrated in FIG. 6, the exciton energy generated at the host should be transferred to the second delayed fluorescent dopant via the first delayed fluorescent dopant in order to emit light at the second delayed fluorescent dopant. Therefore, each of an excited state singlet energy level $S_1^H$ and an excited state triplet energy level $T_1^H$ of the host is higher than each of excited state singlet energy levels $S_1^{TD1}$ and $S_1^{TD2}$ and the excited triplet energy levels $T_1^{TD1}$ and $T_1^{TD2}$ of the first and second delayed fluorescent dopants.

As an example, when the excited state triplet energy level $T_1^H$ of the host is not higher than the excited state triplet energy level $T_1^{TD1}$ of the first delayed fluorescent dopant, the triplet exciton energy of the first delayed fluorescent dopant may be reversely transferred to the excited state triplet energy level $T_1^H$ of the host. In this case, the triplet exciton is quenched non-radiatively at the host where the triplet exciton cannot be emitted so that the triplet exciton energy of the first delayed fluorescent dopant cannot contribute to light emission. As an example, the excited state triplet energy level $T_1^H$ of the host may be higher than the excited state triplet energy level $T_1^{TD1}$ of the first delayed fluorescent dopant by at least about 0.2 eV.

The host is not limited to specific materials. It is only important that the excited state triplet energy level $T_1^H$ is higher than the excited state triplet energy levels $T_1^{TD1}$ and $T_1^{TD2}$ of the delayed fluorescent dopants and its HOMO and LUMO energy levels $HOMO^H$ and $LUMO^H$ satisfy the relationships in Equations (1), (2), (5) and (6) compared to the HOMO and LUMO energy levels $HOMO^{TD1}$, $HOMO^{TD2}$, $LUMO^{TD1}$ and $LUMO^{TD2}$ of the delayed fluorescent dopants. As an example, the first host may include, but is not limited to, 9-(3-(9H-carbazol-9-yl)phenyl)-9H-carbazole-3-carbonitrile (mCP-CN), CBP, 3,3'-bis(N-carbazolyl)-1,1'-biphenyl (mCBP), 1,3-Bis(carbazol-9-yl)benzene (mCP), Oxybis(2,1-phenylene))bis(diphenylphosphine oxide (DPEPO), 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-biphenyl]-3,5-dicarbonitrile (DCzTPA), 4'-(9H-carbazol-9-yl)biphenyl-3,5-dicarbonitrile(4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), Diphenyl-4-triphenylsilylphenyl-phosphine oxide (TPSO1), 9-(9-phenyl-9H-carbazol-6-yl)-9H-carbazole (CCP), 4-(3-(triphenylen-2-yl)phenyl)dibenzo[b,d]thiophene), 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

When the EML 360 includes the first and second delayed fluorescent dopants, the content of the second delayed fluorescent dopant is less than the content of the first delayed fluorescent dopant. When the content of the second delayed fluorescent dopant is more than the content of the first delayed fluorescent dopant, exciton energies may not be transferred efficiently form the first delayed fluorescent dopant to the second delayed fluorescent dopant. As an example, the EML 360 may include, but is not limited to, the host of about 50 to about 75% by weight, and preferably about 60 to about 75% by weight, the first delayed fluorescent dopant of about 20 to about 40% by weight and the second delayed fluorescent dopant of about 1 to about 10% by weight, and preferably about 1 to about 5% by weight.

Referring to FIG. 2, the ETL 370 and the EIL 380 may be laminated sequentially between the EML 360 and the second electrode 320. The ETL 370 includes a material having a high electron mobility so as to stably provide electrons for the EML 360 by fast electron transportation.

In one exemplary embodiment, the ETL 370 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the likes.

As an example, the ETL 370 may include, but is not limited to, tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-Tris(N-phenyl-benzimidazol-2-yl)benzene (TPBi), Bis(2-methyl-8-quinolinolato-N1,O8)-(1, 1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenanthroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr) and/or tris(phenylquinoxaline) (TPQ).

The EIL 380 is disposed between the second electrode 320 and the ETL 370, and can improve physical properties of the second electrode 320 and therefore, can enhance the life span of the OLED 300. In one exemplary embodiment, the EIL 380 may include, but is not limited to, an alkali halide such as LiF, CsF, NaF, $BaF_2$ and the likes, and/or an organic metal compound such as lithium quinolate, lithium benzoate, sodium stearate, and the likes.

When holes are transferred to the second electrode 320 via the EML 360 and/or electrons are transferred to the first electrode 310 via the EML 360, the OLED 300 may have a short life span and a reduced luminous efficiency. In order to prevent these phenomena, the OLED 300 in accordance with this embodiment of the present disclosure has at least one exciton blocking layer adjacent to the EML 360.

For example, the OLED 300 of the exemplary embodiment includes the EBL 355 between the HTL 350 and the EML 360 so as to control and prevent electron transfers. In one exemplary embodiment, the EBL 355 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino) phenyl]-N,N'-diphenyl-[1,1'-biphenyl]-4,4'-diamine (DNTPD), TDAPB and/or 3,6-bis(N-carbazolyl)-N-phenyl-carbazole.

In addition, the OLED 300 further includes the HBL 375 as a second exciton blocking layer between the EML 360 and the ETL 370 so that holes cannot be transferred from the EML 360 to the ETL 370. In one exemplary embodiment, the HBL 375 may include, but is not limited to, oxadiazole-based compounds, triazole-based compounds, phenanthroline-based compounds, benzoxazole-based compounds, benzothiazole-based compounds, benzimidazole-based compounds, and triazine-based compounds.

For example, the HBL 375 may include a compound having a relatively low HOMO energy level compared to the emitting material in EML 360. The HBL 375 may include, but is not limited to, BCP, BAlq, $Alq_3$, PBD, spiro-PBD, Liq, Bis-4,5-(3,5-di-3-pyridylphenyl)-2-methylpyrimidine (B3PYMPM), DPEPO, 9-(6-(9H-carbazol-9-yl)pyridine-3-yl)-9H-3,9'-bicarbazole and combinations thereof.

In accordance with an exemplary embodiment, the EML 360 includes a second delayed fluorescent dopant having narrow FWHM so as to prevent that the color purity is deteriorated when only the first delayed fluorescent dopant is used. The triplet exciton energy of the first delayed fluorescent dopant is converted to singlet exciton energy of its own by RISC mechanism, then the converted singlet exciton energy of the first delayed fluorescent dopant can be transferred to the second delayed fluorescent dopant within the same EML 360 by a Dexter energy transfer mechanism, which transfers exciton energies depending upon wave function overlaps among adjacent molecules by inter-molecular electron exchanges and exciton diffusions. As the exciton energy is transferred from the first delayed fluorescent dopant to the second delayed fluorescent dopant, ultimate light emission occurs as transferred exciton energy at the second delayed fluorescent dopant having narrow FWHM is shifted to the ground state. Accordingly, the luminous efficiency and life span of the OLED can be enhanced and its color purity can be improved.

Figure 7:
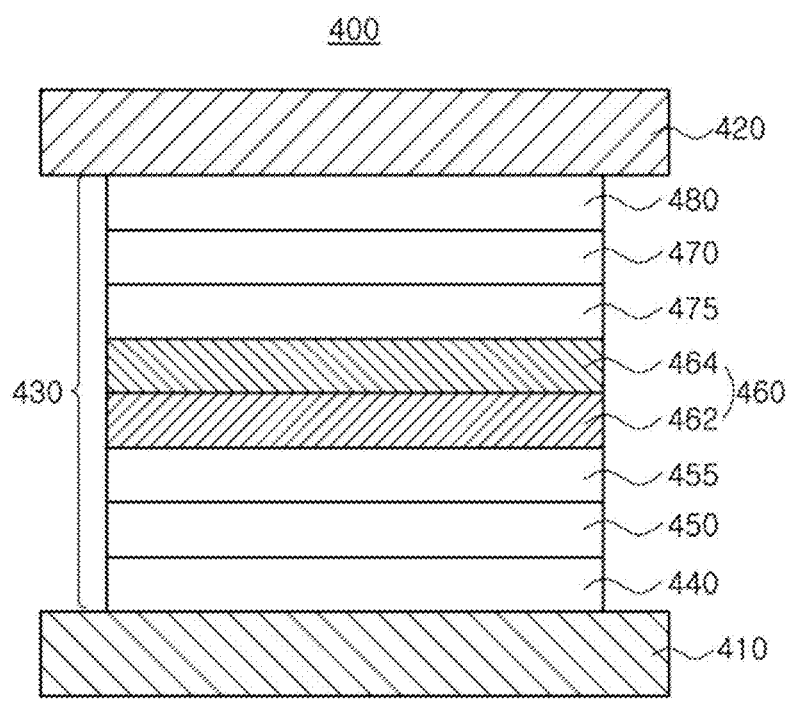
FIG. 7 is a schematic cross-sectional view illustrating an organic light emitting diode in accordance with another exemplary embodiment of the present disclosure.

In the above first embodiment, the OLED 300 includes a single-layered EML 360. Alternatively, an OLED in accordance with the present disclosure may include a multiple-layered EML. FIG. 7 is a schematic cross-sectional view illustrating an organic light emitting diode in accordance with another exemplary embodiment of the present disclosure.

As illustrated in FIG. 7, the OLED 400 in accordance with an exemplary third embodiment of the present disclosure includes first and second electrodes 410 and 420 facing each other and an emitting unit 430 as an emission layer disposed between the first and second electrodes 410 and 420.

In one exemplary embodiment, the emitting unit 430 includes an HIL 440, an HTL 450, and EML 460, an ETL 470 and an EIL 480 each of which is laminated sequentially over the first electrode 410. Besides, the emitting unit 430 may further include an EBL 455 as a first exciton blocking layer disposed between the HTL 450 and the EML 460, and/or an HBL 475 as a second exciton blocking layer disposed between the EML 460 and the ETL 470.

As described above, the first electrode 410 may be an anode and may include, but is not limited to, a conductive material having a relatively large work function values such as ITO, IZO, SnO, ZnO, ICO, AZO, and the likes. The second electrode 420 may be a cathode and may include, but is not limited to, a conductive material having a relatively small work function values such as Al, Mg, Ca, Ag, alloy thereof or combinations thereof.

The HIL 440 is disposed between the first electrode 410 and the HTL 450. The HIL 440 may include, but is not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 440 may be omitted in compliance with the structure of the OLED 400.

The HTL 450 is disposed adjacently to the EML 460 between the first electrode 410 and the EML 460. The HTL 450 may include, but is not limited to, aromatic amine compounds such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EBL 455 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB and/or 3,6-bis(N-carbazolyl)-N-phenyl-carbazole.

The EML 460 includes a first EML (EML1) 462 and a second EML (EML2) 464. The EML1 462 is disposed between the EBL 455 and the HBL 475 and the EML2 464 is disposed between the EML1 462 and the HBL 475. The configuration and energy levels among the luminous materials in the EML 460 will be explained in more detail below.

The HBL 475 may include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 475 may include a compound having a relatively low HOMO energy level compared to the emitting material in EML 460. The HBL 475 may include, but is not limited to, BCP, BAlq, Alq$_3$, PBD, spiro-PBD, Liq, B3PYMPM, DPEPO, 9-(6-(9H-carbazol-9-yl)pyridine-3-yl)-9H-3,9'-bicarbazole and combinations thereof.

The ETL 470 is disposed between the EML 460 and the EIL 480. In one exemplary embodiment, the ETL 470 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the likes. As an example, the ETL 470 may include, but is not limited to, Alq$_3$, PBD, spiro-PBD, Liq, TPBi, BAlq, Bphen, NBphen, BCP, TAZ, NTAZ, TpPyPB, TmPPPyTz, PFNBr and/or TPQ.

The EIL 480 is disposed between the second electrode 420 and the ETL 470. In one exemplary embodiment, the EIL 480 may include, but is not limited to, an alkali halide such as LiF, CsF, NaF, BaF$_2$ and the likes, and/or an organic metal compound such as lithium benzoate, sodium stearate, and the likes.

As described above, the EML 460 includes the EML1 462 and the EML2 464. One of the EML1 462 and the EML2 464 includes a first host and the first delayed fluorescent dopant, and the other of the EML1 462 and the EML2 464 includes a second host and a second delayed fluorescent dopant. Hereinafter, the EML 460, where the EML1 462 includes the first delayed fluorescent dopant and the EML2 464 includes the second delayed fluorescent dopant, will be explained.

In accordance with an exemplary second embodiment, the EML1 462 includes the first host and the first delayed fluorescent dopants, and the EML2 464 includes the second host and the second delayed fluorescent dopant. As described in the first embodiment, two delayed fluorescent materials having different triplet energy levels, HOMO energy levels and LUMO energy levels can be applied into an EML to improve its luminous efficiency and its luminescence lifetime. Particularly, it is possible to improve color purity by applying the second delayed fluorescent dopant having narrow FWHM into the EML 460.

In this exemplary second embodiment, the singlet exciton energy and the triplet exciton energy of the first delayed fluorescent dopant in EML1 462 can be transferred to the second delayed fluorescent dopant in the EML2 464 disposed adjacently to the EML1 462 by FRET (Forster resonance energy transfer) mechanism, which transfers energy non-radiatively through electrical fields by dipole-dipole interactions. Accordingly, the ultimate emission occurs in the second delayed fluorescent dopant within the EML2 464.

Figure 8:
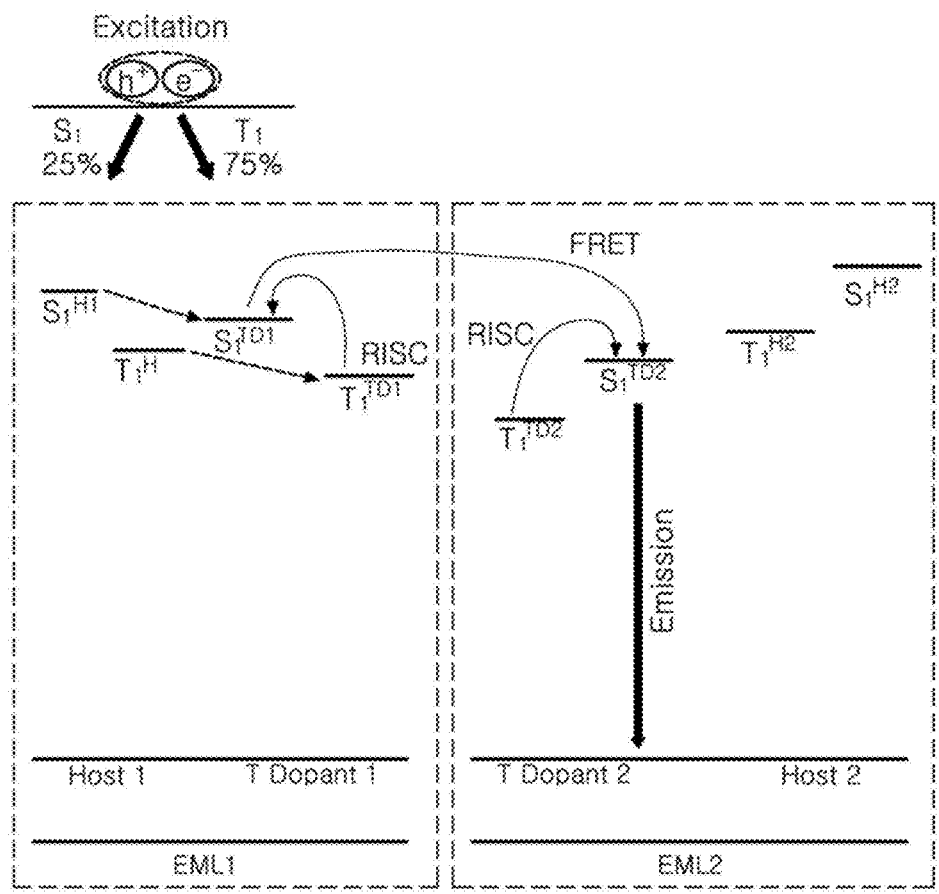
FIG. 8 is a schematic diagram illustrating luminous mechanism by energy level bandgap among luminous materials in accordance with another exemplary embodiment of the present disclosure.

In other words, the triplet exciton energy of the first delayed fluorescent dopant is converted to the singlet exciton energy of its own in the EML1 462 by the RISC mechanism ($T_1^{TD1} \rightarrow S_1^{TD1}$), then the converted singlet exciton energy of the first delayed fluorescent dopant is transferred to the singlet exciton energy of the second delayed fluorescent dopant in the EML2 464 because the excited state singlet energy level $S_1^{TD1}$ of the first delayed fluorescent dopant in the EML1 462 is higher than the excited state singlet energy level $S_1^{TD2}$ of the second delayed fluorescent dopant in the EML2 464 (See, FIG. 8).

The second delayed fluorescent dopant in the EML2 464 can emit light using the triplet exciton energy as well as the singlet exciton energy of the first delayed fluorescent dopant. In addition, the second delayed fluorescent dopant has relatively narrow FWHM as compared to the first delayed fluorescent dopant. As a result, the OLED 400 can enhance its luminous efficiency and color purity. As the exciton energy generated at the first delayed fluorescent dopant in the EML1 462 is efficiently transferred to the second delayed fluorescent dopant in the EML2 464, the OLED 400 can implement hyper-fluorescence.

The first delayed fluorescent dopant only transfers exciton energy to the second delayed fluorescent dopant. Accordingly, the EML1 462 including the first delayed fluorescent dopant is not involved in the ultimate light emission process, but the ultimate light emission occurs in the EML2 464 including the second delayed fluorescent dopant.

Each of the EML1 462 and the EML2 464 includes a first host and a second host, respectively. For example, each of the first host and the second host may respectively include, but is not limited to, mCP-CN, CBP, mCBP, mCP, DPEPO, PPT, TmPyPB, PYD-2CZ, DCzDBT, DCzTPA, pCzB-2CN, mCzB-2CN, TPSO1, CCP, 4-(3-(triphenylen-2-yl)phenyl) dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and second delayed fluorescent dopants that may be included in the EML1 462 or EML2 464 is not particularly limited as long as they satisfy the above-mentioned relationships in Equations (1) to (8). As an example, the first delayed fluorescent dopant may include any compound having the structure of Chemical Formulae 1 to 3 and the second delayed fluorescent dopant may include any compound having the structure of Chemical Formulae 4 to 6.

In one exemplary embodiment, each of the first and second hosts may have a higher weight ratio than the first and second delayed fluorescent dopants in the EML1 462 and the EML2 464, respectively. In addition, the weight ratio of the first delayed fluorescent dopant in the EML1 462 may be higher than the weight ratio of the second delayed fluorescent dopant in the EML2 464. In this case, it is possible to transfer enough energy from the first delayed fluorescent dopant in the EML1 462 to the second delayed fluorescent dopant in the EML2 464 by the FRET transfer mechanism.

As an example, each of the EML1 462 and the EML2 464 may include each of the first host and the second host of about 50 to about 80% by weight, preferably about 60 to about 90% by weight. Further, each of the EML1 462 and the EML2 464 may include each of the first delayed fluorescent dopant and the second delayed fluorescent dopant of about 10 to about 50% by weight, preferably about 20 to about 40% by weight.

Energy level relationships among the luminous materials in the double-layered EML 460 will be explained. FIG. 8 is a schematic diagram illustrating luminous mechanism by energy level bandgap among luminous materials in a double-layered EML in accordance with another exemplary embodiment of the present disclosure. As illustrated in FIG. 8, each of an excited state singlet energy level $S_1^{H1}$ and an excited state triplet energy level $T_1^{H1}$ of the first host is higher than an excited state singlet energy level $S_1^{TD1}$ and an excited state triplet energy level $T_1^{TD1}$ of the first delayed fluorescent dopant in the EML1 462, respectively. In addition, each of an excited state singlet energy level $S_1^{H2}$ and an excited state triplet energy level $T_1^{H2}$ of the second host is higher than an excited state singlet energy level $S_1^{TD2}$ and an excited state triplet energy level $T_1^{TD2}$ of the second delayed fluorescent dopant in the EML4 464, respectively. Alternatively, each of the excited state singlet energy level $S_1^{H2}$ and the excited state triplet energy level $T_1^{H2}$ of the second host in the EML2 464 may be higher than the excited state singlet energy level $S_1^{TD1}$ and the excited state triplet energy levels $T_1^{TD1}$ of the first delayed fluorescent dopant in the EML1 462, respectively.

In addition, each of the excited state singlet energy level $S_1^{TD1}$ and the excited state triplet energy levels $T_1^{TD1}$ of the first delayed fluorescent dopant in the EML1 462 is higher than each of the excited state singlet energy level $S_1^{TD2}$ and the excited state triplet energy level $T_1^{TD2}$ of the second delayed fluorescent dopant in the EML2 464, respectively.

When the luminous materials do not satisfy the above-described energy level relationships, exciton quenching as non-emission exciton annihilation occurs at the first and/or second delayed fluorescent dopants, or exciton energy cannot be efficiently transferred from the host to the dopants so that the luminous efficiency of the OLED 400 may be deteriorated.

In an alternatively exemplary embodiment, the second host, which is included in the EML2 464 together with the second delayed fluorescent dopant, may be the same material as the HBL 475. In this case, the EML2 464 may have a hole blocking function as well as an emission function. In other words, the EML2 464 can act as a buffer layer for blocking holes. In one embodiment, the HBL 475 may also be omitted, in particular when the EML2 464 is a hole blocking layer as well as an emitting material layer.

In another exemplary embodiment, the EML1 462 may include the second host and the second delayed fluorescent dopant and the EML2 464 may include the first host and the first delayed fluorescent dopant. In this embodiment, the second host in the EML1 462 may be the same material as the EBL 455. In this case, the EML1 462 may have an electron blocking function as well as an emission function. In other words, the EML1 462 can act as a buffer layer for blocking electrons. In one embodiment, the EBL 455 may be omitted where the EML1 462 may be an electron blocking layer as well as an emitting material layer.

Figure 9:
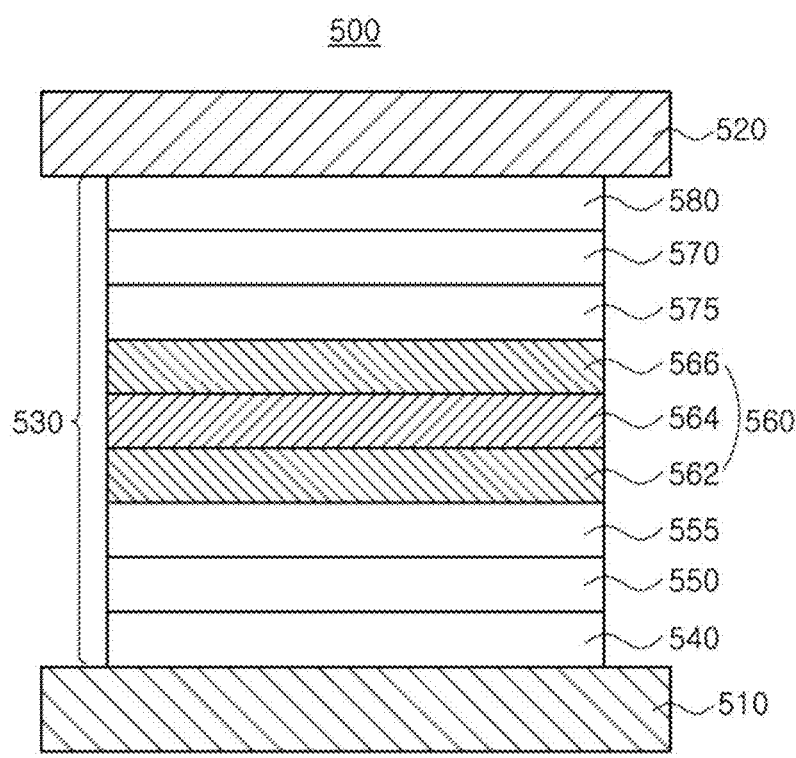
FIG. 9 is a schematic cross-sectional view illustrating an organic light emitting diode in accordance with another exemplary embodiment of the present disclosure.
Figure 10:
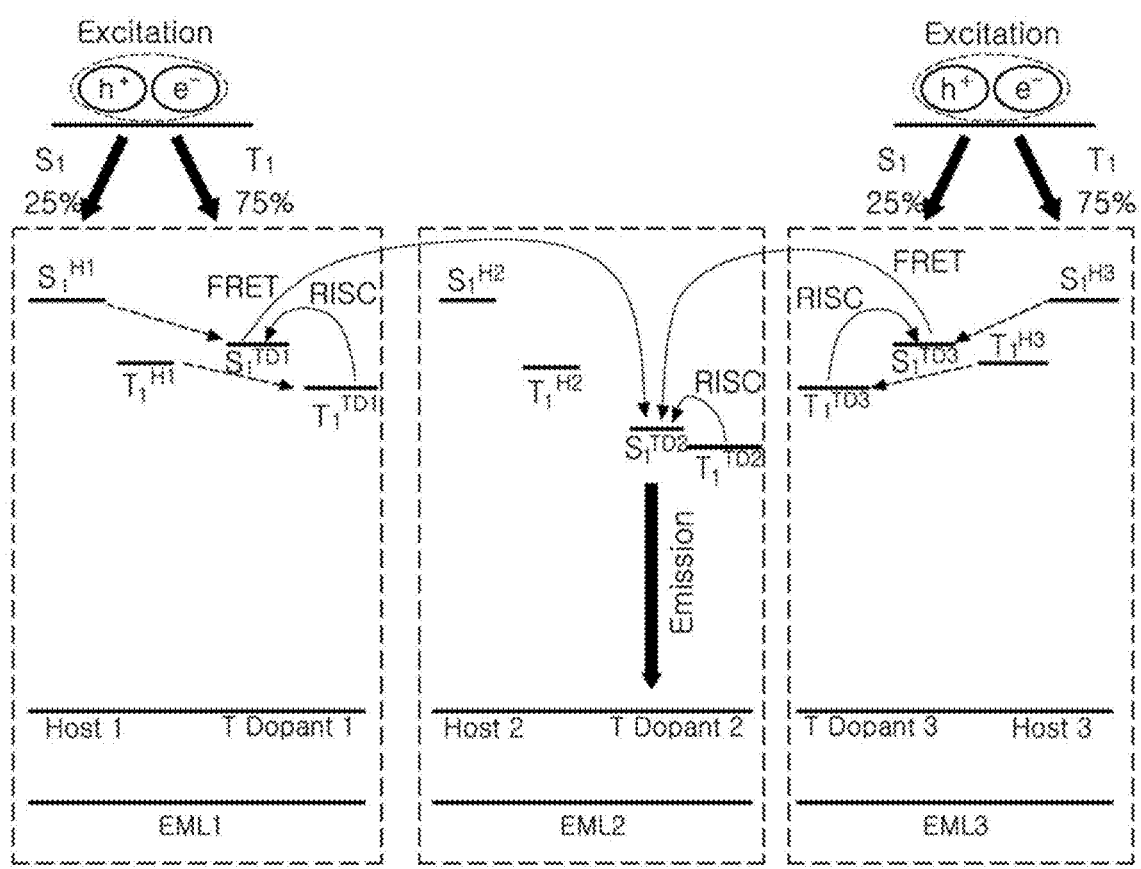
FIG. 10 is a schematic diagram illustrating luminous mechanism by energy level bandgap among luminous materials in accordance with another exemplary embodiment of the present disclosure.

An OLED having a triple-layered EML will be explained. FIG. 9 is a cross-sectional view illustrating an organic light emitting diode having a triple-layered EML in accordance with another exemplary embodiment of the present disclosure. As illustrated in FIG. 10, an OLED 500 in accordance with a fourth embodiment of the present disclosure includes first and second electrodes 510 and 520 facing each other and an emitting unit 530 as an emissive unit disposed between the first and second electrodes 510 and 520.

In one exemplary embodiment, the emitting unit 530 includes an HIL 540, an HTL 550, an EML 560, an ETL 570 and an EIL 580 each of which is laminated sequentially over the first electrode 510. Besides, the emitting unit 530 may further include an EBL 555 as a first exciton blocking layer disposed between the HTL 550 and the EML 560, and/or an HBL 575 as a second exciton blocking layer disposed between the EML 560 and the ETL 570.

The OLED 500 in accordance with the third embodiment may have the same first and second electrodes 510 and 520 as the OLEDs 300 and 400 in accordance with the first to third embodiments. The emitting unit 530 may also be the same except for the EML 560.

The first electrode 510 may be an anode and may include, but is not limited to, a conductive material having a relatively large work function values such as ITO, IZO, SnO, ZnO, ICO, AZO, and the likes. The second electrode 520 may be a cathode and may include, but is not limited to, a conductive material having a relatively small work function values such as Al, Mg, Ca, Ag, alloys thereof or combinations thereof.

The HIL 540 is disposed between the first electrode 510 and the HTL 550. The HIL 540 may include, but is not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 540 may be omitted in accordance with the structure of the OLED 500.

The HTL 550 is disposed adjacently to the EML 560 between the first electrode 510 and the EML 560. The HTL 550 may include, but is not limited to, aromatic amine compounds such as TPD, NPD(NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

The EBL 555 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole.

The EML 560 includes a first EML (EML1) 562, a second EML (EML2) 564 and a third EML (EML3) 566. The configuration and energy levels among the luminous materials in the EML 560 will be explained in more detail below.

The HBL 575 may include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, the HBL 575 may include a compound having a relatively low HOMO energy level compared to the emitting material in EML 560. The HBL 575 may include, but is not limited to, BCP, BAlq, Alq$_3$, PBD, spiro-PBD, Liq, B3PYMPM, DPEPO, 9-(6-(9H-carbazol-9-yl)pyridine-3-yl)-9H-3,9'-bicarbazole and combinations thereof.

The ETL 570 is disposed between the EML 560 and the EIL 580. In one exemplary embodiment, the ETL 570 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the likes. As an example, the ETL 570 may include, but is not limited to, Alq$_3$, PBD, spiro-PBD, Liq, TPBi, BAlq, Bphen, NBphen, BCP, TAZ, NTAZ, TpPyPB, TmPPPyTz, PFNBr and/or TPQ.

The EIL 580 is disposed between the second electrode 520 and the ETL 570. In one exemplary embodiment, the EIL 580 may include, but is not limited to, an alkali halide such as LiF, CsF, NaF, BaF$_2$ and the likes, and/or an organic metal compound such as lithium benzoate, sodium stearate, and the likes.

As described above, the EML 560 includes the EML1 562 disposed between the EBL 555 and the HBL 575, the EML2 564 disposed between the EML1 562 and the HBL 575 and the EML3 566 disposed between the EML2 564 and the HBL 575. In one exemplary embodiment, each of the EML1 562 and the EML3 566 may include the delayed fluorescent material of any compound having the structure in Chemical Formulae 1 to 3, and the EML2 564 may include the delayed fluorescent material of any compound having the structure in Chemical Formulae 4 to 6. In another exemplary embodiment, each of the EML1 562 and the EMl3 566 may include the delayed fluorescent material of any compound having the structure in Chemical Formulae 4 to 6, and the EML2 564 may include the delayed fluorescent material of any compound having the structure in Chemical Formulae 1 to 3. Hereinafter, the EML 560, where each of the EML1 562 and the EML3 566 includes the delayed fluorescent material of any compound having the structure in Chemical Formulae 1 to 3 and the EML2 564 include the delayed fluorescent material of any compound having the structure in Chemical Formulae 4 to 6, will be explained. For example, each of the EML1 to EML3 562, 564 and 566 may include first to third delayed fluorescent dopant, respectively. In this case, each of the first and third delayed fluorescent dopant may be an organic compound having an electron donor moiety and an electron acceptor moiety. In addition, each of the EML1 to EML3 562, 564 and 566 may further include first to third hosts, respectively.

In accordance with this embodiment, the singlet and triplet exciton energies of the first and third delayed fluorescent dopants, each of which is included in the EML1 562 and the EML3 566, is transferred to the second delayed fluorescent dopant, which is included in the EML2 564 disposed adjacently to the EML1 562 and the EML3 566, by the FRET energy transfer mechanism. Accordingly, the ultimate emission occurs in the second delayed fluorescent dopant in the EML2 564.

In other words, the triplet exciton energy of the first and third delayed fluorescent dopants is converted to the singlet exciton energy of their own in the EML1 562 and the EML3 566 by the RISC mechanism, then the singlet exciton energy of the first and third delayed fluorescent dopants is transferred to the singlet exciton energy of the second delayed fluorescent dopant in the EML2 564 because the excited state singlet energy levels $S_1^{TD1}$ and $S_1^{TD3}$ of the first and third delayed fluorescent dopants in the EML1 562 and the EML3 566 are higher than the excited state singlet energy levels $S_1^{TD2}$ of the second delayed fluorescent dopant in the EML2 564 (See, FIG. 10).

The second delayed fluorescent dopant in the EML2 564 can emit light using the singlet exciton energy and the triplet exciton energy derived from the first and third delayed fluorescent dopants in the EML1 562 and the EMl3 566. Therefore, the OLED 500 has an enhanced luminous efficiency and color purity which is also due to the narrow FWHM of the second delayed fluorescent dopant.

In this case, the first and third delayed fluorescent dopants only transfer energy to the second delayed fluorescent dopant. The EML1 562 and the EML3 566 including the first and third delayed fluorescent dopants is not involved in the ultimate emission process, while EML2 564 including the second delayed fluorescent dopant emits light. Since the second delayed fluorescent dopant have relatively narrow FWHM as compared to the first and third delayed fluorescent dopant, the OLED 500 has an enhanced luminous efficiency and color purity.

In addition, each of the EML1 562, the EML2 564 and the EML3 566 include the first host, the second host and the third host, respectively. The first to third hosts are the same as or different from one another. As an example, each of the first to third host may independently include, but is not limited to, mCP-CN, CBP, mCBP, mCP, DPEPO, PPT, TmPyPB, PYD-2CZ, DCzDBT, DCzTPA, pCzB-2CN, mCzB-2CN, TPSO1, CCP, 4-(3-(triphenylen-2-yl)phenyl) dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3 ,9'-bicarbazole.

Each of the first and third delayed fluorescent dopants that may be included in the EML1 562 and the EML3 566 is not particularly limited as long as they satisfy the above-mentioned relationships in Equations (1) to (8). As an example, each of the first and third delayed fluorescent dopant may include any compound having the structure in Chemical Formula 1 to 3 and the second delayed fluorescent dopant may include any compound having the structure in Chemical Formulae 4 to 6.

In one exemplary embodiment, each of the first to third hosts may have a higher weight ratio than the first to third delayed fluorescent dopants in the EML1 562, the EML2 564 and the EML3 566, respectively. In addition, the weight ratio of each of the first and third delayed fluorescent dopants in the EML1 562 and the EML3 566 may be higher than the weight ratio of the second delayed fluorescent dopant in the EML2 564, respectively. In this case, it is possible to transfer enough energy from the first and third delayed fluorescent dopants in the EML1 562 and the EML 566 to the second delayed fluorescent dopants in the EML2 564.

As an example, each of the EML1 562 to the EML3 566 may include each of the first to third hosts of about 50 to about 90% by weight, preferably about 60 to about 80% by weight, respectively. Further, each of the EML 562 to the EML3 666 may include each of the first to third delayed fluorescent dopants of about 10 to about 50% by weight, preferably about 20 to about 40% by weight, respectively.

Energy level relationships among the luminous materials in the EML 560 will be explained in more detail. FIG. 10 is a schematic diagram illustrating luminous mechanism by energy level bandgap among the luminous material in a triple-layered EML in accordance with another exemplary embodiment of the present disclosure. As illustrated in FIG. 10, each of excited state singlet energy levels $S_1^{H1}$, $S_1^{H2}$ and $S_1^{H3}$ and excited state triplet energy level $T_1^{H1}$, $T_1^{H2}$ and $T_1^{H3}$ of the first to third hosts is higher than excited state singlet energy levels $S_1^{TD1}$, $S_1^{TD2}$ and $S_1^{TD3}$ and excited state triplet energy levels $T_1^{TD1}$, $T_1^{TD2}$ and $T_1^{TD3}$ of the first to third delayed fluorescent dopants in the EML1 562, EML2 564, EML3 566, respectively. In addition each of the excited state singlet energy levels $S_1^{TD1}$ and $S_1^{TD3}$ and the excited state triplet energy levels $T_1^{TD1}$ and $T_1^{TD3}$ of the first and third delayed fluorescent dopants in the EML1 562 and the EML3 566 is higher than each of the excited state singlet energy levels $S_1^{TD2}$ and excited state triplet energy levels $T_1^{TD2}$ of the second delayed fluorescent dopant in the EML2 564, respectively.

When the luminous materials do not satisfy the above-described energy level relationships, exciton quenching as non-emission exciton annihilation occurs at the first and/or second delayed fluorescent dopants, or exciton energy cannot be efficiently transferred from the host to the dopants so that luminous efficiency of the OLED 500 may be deteriorated.

In an alternatively exemplary embodiment, the first host, which is included in the EML1 562 together with the first delayed fluorescent dopant, may be the same material as the EBL 555. In this case, the EML1 562 may have an electron blocking function as well as an emission function. In other words, the EML2 562 can act as a buffer layer for blocking electrons. In one embodiment, the EBL 555 may also be omitted, in particular when the EML1 562 is an electron blocking layer as well as an emitting material layer.

In another exemplary embodiment, the third host, which is included in the EML3 566 together with the third delayed fluorescent dopant, may be the same material as the HBL 575. In this case, the EML3 566 may have a hole blocking function as well as an emission function. In other words, the EML3 566 can act as a buffer layer for blocking holes. In one embodiment, the HBL 575 may also be omitted, in particular when the EML3 566 is a hole blocking layer as well as an emitting material layer.

In still another exemplary embodiment, the first host in the EML1 562 may be the same material as the EBL 555 and the third host in the EML3 566 may be the same material as the HBL 575. In this embodiment, the EML1 562 may have an electron blocking function as well as an emission function, and the EML3 566 may have a hole blocking function as well as an emission function. In other words, each of the EML1 562 and the EML3 566 can act as a buffer layer for blocking electrons or holes, respectively. In one embodiment, the EBL 555 and the HBL 575 may be omitted, in particular when the EML1 562 is an electron blocking layer as well as an emitting material layer and the EML3 566 is a hole blocking layer as well as an emitting material layer.

Figure 11:
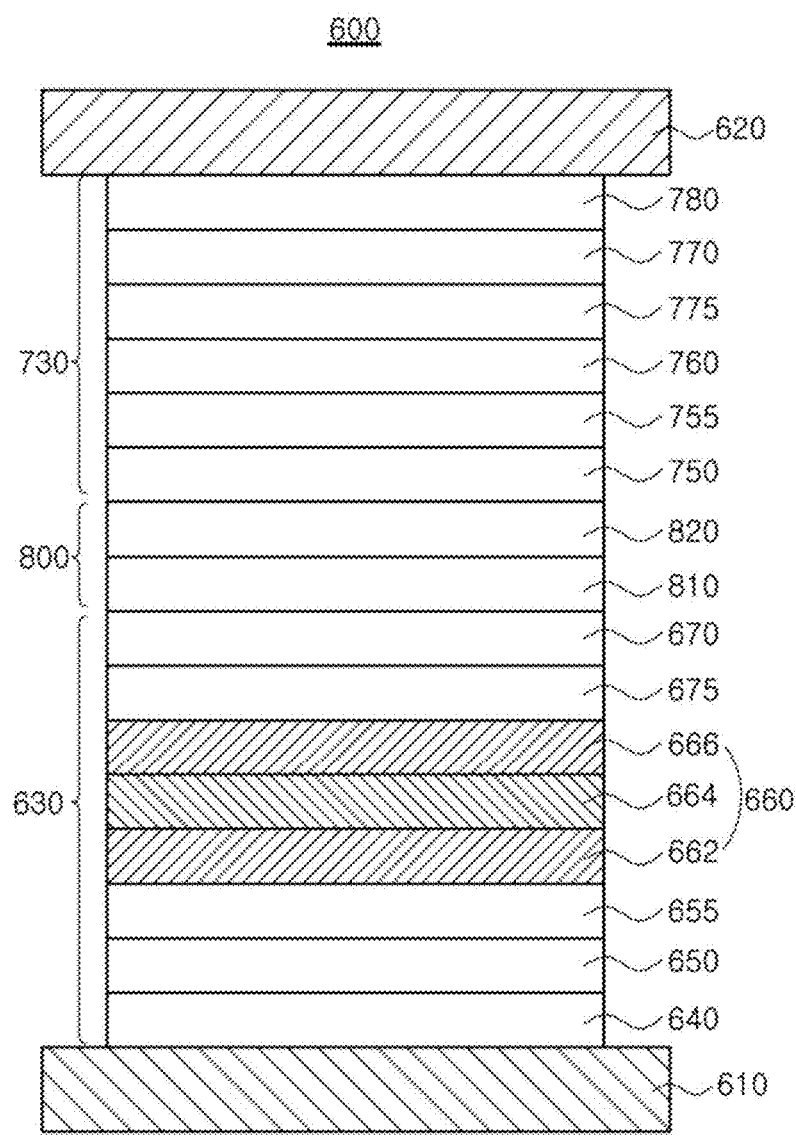
FIG. 11 is a schematic cross-section view illustrating an organic light emitting diode in accordance with another exemplary embodiment of the present disclosure.

In the above embodiments, the OLED having only one emitting unit is described. Unlike the above embodiment, the OLED may have multiple emitting units so as to form a tandem structure. FIG. 11 is a cross-sectional view illustrating an organic light emitting diode in accordance with still another embodiment of the present disclosure.

As illustrated in FIG. 11, the OLED 600 in accordance with the fourth embodiment of the present disclosure includes first and second electrodes 610 and 620 facing each other, a first emitting unit 630 as a first emission layer disposed between the first and second electrodes 610 and 620, a second emitting unit 730 as a second emission layer disposed between the first emitting unit 630 and the second electrode 620, and a charge generation layer 800 disposed between the first and second emitting units 630 and 730.

As mentioned above, the first electrode 610 may be an anode and may include, but is not limited to, a conductive material, for example, a transparent conductive material (TCO), having a relatively large work function value. As an example, the first electrode 610 may include, but is not limited to, ITO, IZO, SnO, ZnO, ICO, AZO, and the likes. The second electrode 620 may be a cathode and may include, but is not limited to, a conductive material having a relatively small work function values such as Al, Mg, Ca, Ag, alloys thereof or combinations thereof.

The first emitting unit 630 includes a HIL 640, a first HTL (a lower HTL) 650, a lower EML 660 and a first ETL (a lower ETL) 670. The first emitting unit 630 may further include a first EBL (a lower EBL) 655 disposed between the first HTL 650 and the lower EML 660 and/or a first HBL (a lower HBL) 675 disposed between the lower EML 660 and the first ETL 670.

The second emitting unit 730 includes a second HTL (an upper HTL) 750, an upper EML 760, a second ETL (an upper ETL) 770 and an EIL 780. The second emitting unit 730 may further include a second EBL (an upper EBL) 755 disposed between the second HTL 750 and the upper EML 760 and/or a second HBL (an upper HBL) 775 disposed between the upper EML 760 and the second ETL 770.

At least one of the lower EML 660 and the upper EML 760 may emit blue (B) light. As an example, both the lower and upper EMLs 660 and 760 may emit blue light. Alternatively, one of the lower and upper EMLs 660 and 760 may emit blue light and the other of the lower and upper EMLs 660 and 760 may emit any other light having emission wavelength ranges longer than the blue light, for example, green (G), yellow-green (YG), yellow (Y) and/or Orange. Hereinafter, the OLED 600, where the lower EML 660 emits blue light and the upper EML 760 emits green, yellow-green, yellow and/or orange light, will be explained.

The HIL 640 is disposed between the first electrode 610 and the first HTL 650 and improves an interface property between the inorganic first electrode 610 and the organic first HTL 650. In one exemplary embodiment, the HIL 640 may include, but is not limited to, MTDATA, NATA, 1T-NATA, 2T-NATA, CuPc, TCTA, NPB(NPD), HAT-CN, TDAPB, PEDOT/PSS and/or N-(biphenyl-4-yl)-9,9-dimethyl-N-(4-(9-phenyl-9H-carbazol-3-yl)phenyl)-9H-fluoren-2-amine. The HIL 640 may also be omitted in accordance with an inventive structure of the OLED 600.

Each of the first and second HTLs 650 and 750 may independently include, but is not limited to, TPD, NPD (NPB), CBP, poly-TPD, TFB, TAPC, N-(biphenyl-4-yl)-9,9-dimethyl-N-(4-(9-phenyl-9H-carbazol-3-yl)phenyl)-9H-fluoren-2-amine and/or N-(biphenyl-4-yl)-N-(4-(9-phenyl-9H-carbazol-3-yl)phenyl)biphenyl-4-amine.

Each of the first and second ETLs 670 and 770 facilitates electron transportations in the first emitting unit 630 and the second emitting unit 730, respectively. Each of the first and second ETLs 670 and 770 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the likes, respectively. As an example, each of the first and second ETLs 670 and 770 may independently include, but is not limited to, $Alq_3$, PBD, spiro-PBD, Liq, TPBi, BAlq, Bphen, NBphen, BCP, TAZ, NTAZ, TpPyPB, TmPPPyTz, PFNBr and/or TPQ, respectively.

The EIL 780 is disposed between the second electrode 620 and the second ETL 770, and can improve physical properties of the second electrode 620 and therefore, can enhance the life span of the OLED 600. In one exemplary embodiment, the EIL 680 may include, but is not limited to, an alkali halide such as LiF, CsF, NaF, $BaF_2$ and the likes, and/or an organic metal compound such as lithium benzoate, sodium stearate, and the likes.

Each of the first and second EBLs 655 and 755 may independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, N,N'-bis[4-(bis(3-methylphenyl)amino)phenyl]-N,N'-diphenyl-[1,1'-biphenyl]-4,4'-diamine (DNTPD), TDAPB and/or 3,6-bis(N-carbazolyl)-N-phenyl-carbazole, respectively.

Each of the first and second HBLs 675 and 775 may independently include, but is not limited to, oxadiazole-based compounds, triazole-based compounds, phenanthroline-based compounds, benzoxazole-based compounds, benzothiazole-based compounds, benzimidazole-based compounds, and triazine-based compounds. As an example, each of the first and second HBLs 675 and 775 may independently include, but is not limited to, BCP, BAlq, $Alq_3$, PBD, spiro-PBD, Liq, B3PYMPM, DPEPO, 9-(6-(9H-carbazol-9-yl)pyridine-3-yl)-9H-3,9'-bicarbazole and combinations thereof, respectively.

In one exemplary embodiment, when the upper EML 760 emits green light, the upper EML 760 may be, but is not limited to, a phosphorescent emitting material layer that includes a host (e.g. CBP and the likes) and an iridium-based dopant (e.g. Iridium (III) bis(2,4-diphenyloxazolato-1,3-N, C2')(acetyl acetonate) ($dpo_2Ir(acac)$), Iridium (III) bis(2-phenyl-oxazolinato-N,C2')(acetyl acetonate) ($op_2Ir(acac)$) and the likes). Alternatively, the upper EML 760 may be a fluorescent material including Alq as a dopant. In this case, the upper EML 760 may emit green light having, but is not limited to, emission wavelength ranges of about 510 nm to about 570 nm.

In another exemplary embodiment, when the upper EML 760 emits yellow light, the upper EML 760 may have a single-layered structure of yellow-green EML or a double-layered structure of a yellow-green EML and green EML. As an example, when the upper EML 760 is a yellow-green EML, the upper EML 760 may include, but is not limited to, a host selected from at least one of CBP and BAlq and a phosphorescent dopant emitting yellow-green light. In this case, the upper EML 760 may emit yellow-green light having, but is not limited to, emission wavelength ranges of about 510 nm to about 590 nm.

In still another exemplary embodiment, the upper EML 760 may have two EMLs, for example, a yellow-green EML and a red EML. As an example, when the upper EML 760 is a yellow-green EML, the upper EML 760 may have a single-layered structure of yellow-green EML or a double-layered structure of a yellow-green EML and a green EML. When the upper EML 760 has a single-layered structure of the yellow-green EML, the upper EML 760 may include, but is not limited to, a host selected from at least one of CBP and BAlq and a phosphorescent dopant emitting yellow-green light.

The charge generation layer (CGL) 800 is disposed between the first emitting unit 630 and the second emitting unit 730. The CGL 800 includes an N-type CGL 810 disposed adjacently to the first emitting unit 630 and a P-type CGL 820 disposed adjacently to the second emitting unit 730. The N-type CGL 810 injects electrons into the first emitting unit 630 and the P-type CGL 820 injects holes into the second emitting unit 730.

As an example, the N-type CGL 810 may be a layer doped with an alkali metal such as Li, Na, K and/or Cs and/or an alkaline earth metal such as Mg, Sr, Ba and/or Ra. For example, a host used in the N-type CGL 810 may include, but is not limited to, an organic compound such as Bphen or MTDATA. The alkali metal or the alkaline earth metal may be doped by about 0.01 wt % to about 30 wt %.

The P-type CGL 820 may include, but is not limited to, an inorganic material selected from the group consisting of tungsten oxide ($WO_x$), molybdenum oxide ($MoO_x$), beryllium oxide ($Be_2O_3$), vanadium oxide ($V_2O_5$) and combinations thereof, and/or an organic material selected from the group consisting of NPD, HAT-CN, 2,3,5,6-Tetrafluoro-7,7,8,8-tetracyanoquinodimethane (F4TCNQ), TPD, N,N,N',N'-Tetranaphthalenyl-benzidine (TNB), TCTA, N,N'-dioctyl-3,4,9,10-perylenedicarboximide (PTCDI-C8) and combinations thereof.

The lower EML 660 includes a first EML (EML1) 662, a second EML (EML2) 664 and a third EML3 (EML3) 666. The EML1 662 is disposed between the first EBL 655 and the first HBL 675, the EML2 664 is disposed between the first EML 662 and the first HBL 675 and the EML3 666 disposed between the EML2 664 and the first HBL 675. Each of the EML1 662 to EML3 666 includes the first to third delayed fluorescent dopants, respectively. Each of the EML1 662, EML2 664 and EML3 666 further includes a first host, a second host and a third host, respectively.

In one exemplary embodiment, each of the EML1 662 and the EML3 666 may include the delayed fluorescent material of any compound having the structure in Chemical Formulae 1 to 3, and the EML2 664 may include the delayed fluorescent material of any compound having the structure in Chemical Formulae 4 to 6. In another exemplary embodiment, each of the EML1 662 and the EMl3 666 may include the delayed fluorescent material of any compound having the structure in Chemical Formulae 4 to 6, and the EML2 664 may include the delayed fluorescent material of any compound having the structure in Chemical Formulae 1 to 3. Hereinafter, the lower EML 660, where each of the EML1 662 and the EML3 666 includes the delayed fluorescent material of any compound having the structure in Chemical Formulae 1 to 3 and the EML2 664 include the delayed fluorescent material of any compound having the structure in Chemical Formulae 4 to 6, will be explained. For example, each of the EML1 to EML3 662, 664 and 666 may include first to third delayed fluorescent dopant, respectively. In this case, each of the first and third delayed fluorescent dopant may be an organic compound having an electron donor moiety and an electron acceptor moiety. In addition, each of the EML1 to EML3 662, 664 and 666 may further include first to third hosts, respectively.

The singlet and triplet exciton energies of the first and third delayed fluorescent dopant, which is included in the EML1 662 and the EML3 666, is transferred to the second delayed fluorescent dopant, which is included in the EML2 664 disposed adjacently to the EML1 662 by the FRET energy transfer mechanism. Accordingly, the ultimate emission occurs in the second delayed fluorescent dopant in the EML2 664.

In other words, the triplet exciton energy of the first and third delayed fluorescent dopants is converted to the singlet exciton energy of their own in the EML1 662 and the EML3 666 by the RISC mechanism, then the singlet exciton energy of the first and third delayed fluorescent dopants is transferred to the singlet exciton energy of the second delayed fluorescent dopant because the excited state singlet energy levels $S_1^{TD1}$ and $S_1^{TD3}$ of the first and third delayed fluorescent dopants in the EML1 662 and the EML3 666 are higher than the excited state singlet energy levels $S_1^{TD2}$ of the second delayed fluorescent dopant in the EML2 664 (See, FIG. 10).

The second delayed fluorescent dopant in the EML2 664 can emit light using the singlet exciton energy and the triplet exciton energy derived from the first and third delayed fluorescent dopants in the EML1 662 and the EML3 666. Therefore, the OLED 600 has an enhanced luminous efficiency and color purity also due to the narrow FWHM of the second delayed fluorescent dopant.

In addition, each of the EML1 662, the EML2 664 and the EML3 666 include the first host, the second host and the third host, respectively. The first to third hosts are the same as or different from one another. As an example, each of the first to third host may independently include, but is not limited to, mCP-CN, CBP, mCBP, mCP, DPEPO, PPT, TmPyPB, PYD-2CZ, DCzDBT, DCzTPA, pCzB-2CN, mCzB-2CN, TPSO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole and/or 9-(6-(9H-carbazol-9-yl)pyridin-3-yl)-9H-3,9'-bicarbazole.

Each of the first and third delayed fluorescent dopants that may be included in the EML1 562 and the EML3 566 is not particularly limited as long as they satisfy the above-mentioned relationships in Equations (1) to (8). As an example, each of the first and third delayed fluorescent dopant may include any compound having the structure in Chemical Formulae 1 to 3 and the second delayed fluorescent dopant may include any compound having the structure in Chemical Formulae 4 to 6.

In this case, the energy level relationships among the luminous materials, i.e. the first to third hosts, and the first to third delayed fluorescent dopants in the EML 660 may be in the same way as illustrated in FIG. 10.

In one exemplary embodiment, each of the first to third hosts is included in a higher weight ratio than the first to third delayed fluorescent dopants in the EML1 662, the EML2 664 and the EML3 666, respectively. In addition, the weight ratio of each of the first and third delayed fluorescent dopants in the EML1 662 and the EML3 666 may be higher than the weight ratio of the second delayed fluorescent dopant in the EML2 664, respectively. In this case, it is possible to transfer enough energy from the first and third delayed fluorescent dopants in the EML1 662 and the EML 666 to the second delayed fluorescent dopants in the EML2 664.

In an alternatively exemplary embodiment, the first host, which is included in the EML1 662 together with the first delayed fluorescent dopant, may be the same material as the first EBL 655. In this case, the EML1 662 may have an electron blocking function as well as an emission function. In other words, the EML1 664 can act as a buffer layer for blocking electrons. In one embodiment, the first EBL 655 may also be omitted, in particular when the EML1 662 is an electron blocking layer as well as an emitting material layer.

In another exemplary embodiment, the third host, which is included in the EML3 666 together with the third delayed fluorescent dopant, may be the same material as the first HBL 675. In this case, the EML3 666 may have a hole blocking function as well as an emission function. In other words, the EML3 666 can act as a buffer layer for blocking holes. In one embodiment, the first HBL 675 may also be omitted, in particular when the EML3 666 is a hole blocking layer as well as an emitting material layer.

In still another exemplary embodiment, the first host in the EML1 662 may be the same material as the first EBL 655 and the third host in the EML3 666 may be the same material as the first HBL 675. In this embodiment, the EML1 662 may have an electron blocking function as well as an emission function, and the EML3 666 may have a hole blocking function as well as an emission function. In other words, each of the EML1 662 and the EML3 666 can act as a buffer layer for blocking electrons or hole, respectively. In one embodiment, the first EBL 655 and the first HBL 675 may also be omitted, in particular when the EML1 662 is an electron blocking layer as well as an emitting material layer and the EML3 666 is a hole blocking layer as well as an emitting material layer.

In an alternative embodiment, the lower EML 660 may have a single-layered structure as illustrated in FIG. 2. In this case, the lower EML 660 may include a host and first and second delayed fluorescent dopants. In another alternative embodiment, the lower EML 660 may have a double-layered structure as illustrated in FIG. 7. In this case, the lower EML 660 may include a first EML and a second EML. The first EML may include a first host and a first delayed fluorescent dopant, and the second EML may include a second host and a second delayed fluorescent dopant.

In still another exemplary embodiment, an OLED of the present disclosure may further include a third emitting unit (not shown) disposed between the second emitting unit 730 and the second electrode 620 and a second CGL (not shown) disposed between the second emitting unit 730 and the third emitting unit (not shown). In this case, at least one of the first emitting unit 630, the second emitting unit 730 and the third emitting unit (not shown) may include an emitting material layer which includes at least one host and first and second fluorescent dopants, as described above.

SYNTHESIS EXAMPLE 1

Synthesis of Compound A-1

(1) Synthesis of Intermediate 1A

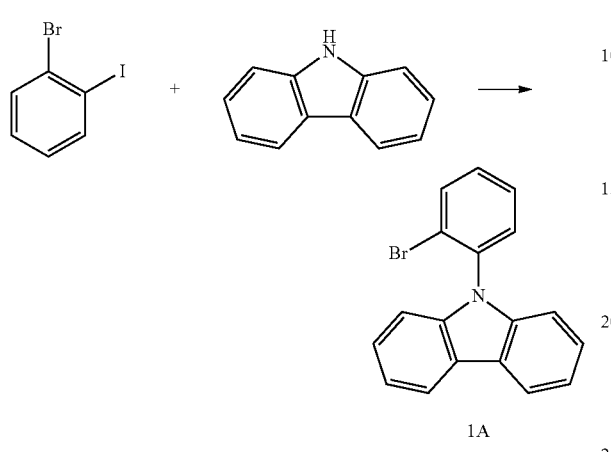

20 g (119.6 mmol) of carbazole, 67.4 g (239.2 mmol) of 2-bromoiodo benzene, 11.4 g (59.8 mmol) of copper iodide and 33.1 g (239.2 mmol) of potassium carbonate were suspended in toluene, and then solution was refluxed with stirring for 12 hours. The solution was extracted with dichloromethane and water, the organic layer was dried with magnesium sulfate and then was filtered with silica gel. The extracted liquid was distilled under reduced pressure and purified by column chromatography to give 32.6 g (yield: 85%) of intermediate 1A.

(2) Synthesis of Intermediate 1B

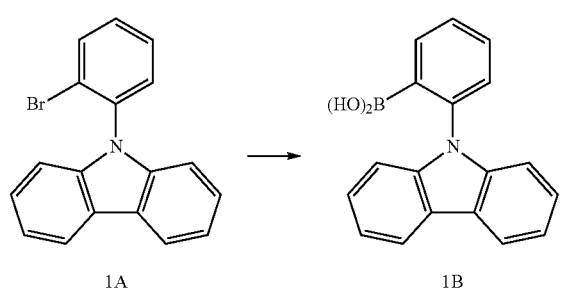 [SMILES: Brc1ccccc1-n1c2ccccc2c2ccccc21 ; OB(O)c1ccccc1-n1c2ccccc2c2ccccc21]

After 6.4 g (20.0 mmol) of intermediate 1A was dissolved in 70 mL of THF, the solution was cooled down −78° C. 8.8 mL (22 mmol) of n-BuLi (2.5 M in hexane) was injected slowly into the solution. The mixed solution was stirred for 2 hours, was cooled down −78° C. again, and then 5.6 g (30 mmol) of tri-isopropyl borate was injected into the mixed solution. After stirring for 5 hours at room temperature, the solution was quenched with 1N HCl. The solution was extracted with ethyl acetate and water, the organic layer was dried with magnesium sulfate and then was filtered with silica gel. The extracted liquid was distilled under reduced pressure and purified by column chromatography to give 3.8 g (yield: 68%) of intermediate 1B.

(3) Synthesis of Compound A-1

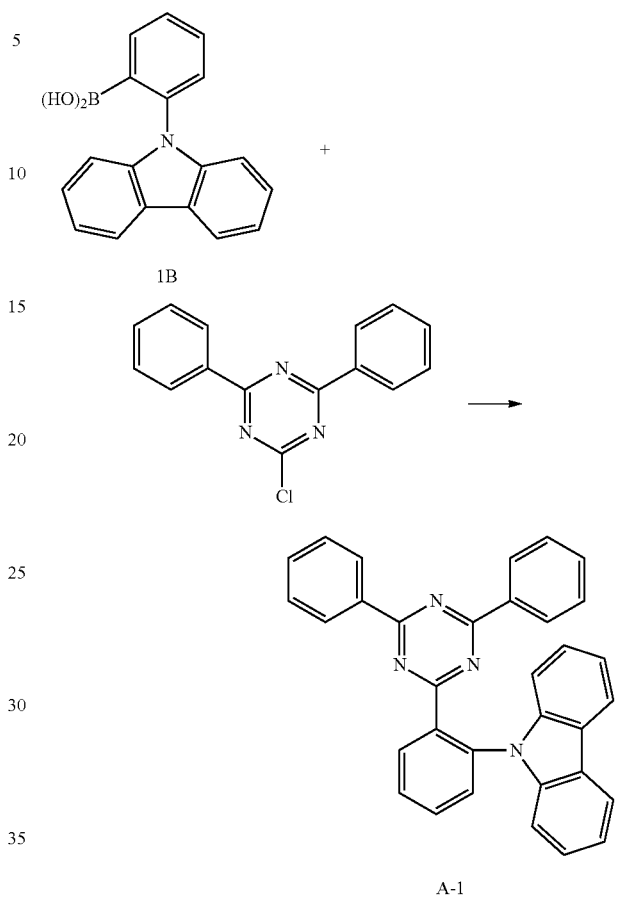

5.7 g (20 mmol) of intermediate 1B, 5.3 g (20 mmol) of 2-chloro-4,6-diphenyl-1,3,6-triazine, 0.7 g (0.6 mmol) of tetrakis(triphenylphosphine) palladium (0) (Pd(PPh$_3$)$_4$) and 8.3 g (60 mmol) of potassium carbonate was suspended of a mixed solvent of 75 mL of THF and 15 mL of water, and then the solution was refluxed under nitrogen atmosphere. The solution was extracted with dichloromethane and water, the organic layer was dried with magnesium sulfate and then was filtered with silica gel. The extracted liquid was distilled under reduced pressure and purified by column chromatography to give 5.6 g (yield: 60%) of Compound A-1.

SYNTHESIS EXAMPLE 2

Synthesis of Compound A-2

(1) Synthesis of Intermediate 2A

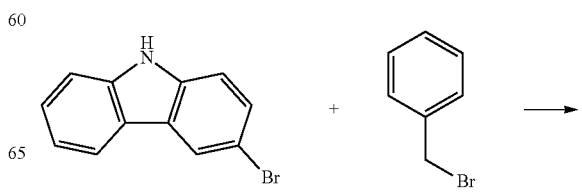

-continued

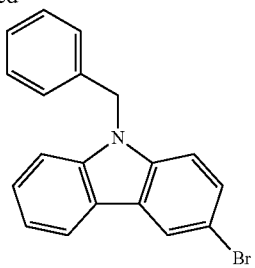

2A 10 g (41 mmol) of 3-bromo carbazole and 1.8 g (45 mmol) of sodium hydroxide was added into 100 mL of dimethyl sulfoxide (DMF), and then 7.4 g (43 mmol) of benzyl bromide was injected with drop-wise into the solution with stirring under nitrogen atmosphere. After stirring for 20 hours at room temperature, the solution was extracted with dichloromethane and water, the organic layer was dried with magnesium sulfate and then was filtered with silica gel. The extracted liquid was distilled under reduced pressure and purified by column chromatography to give 11 g (yield: 80%) of intermediate 2A.

(2) Synthesis of Intermediate 2B

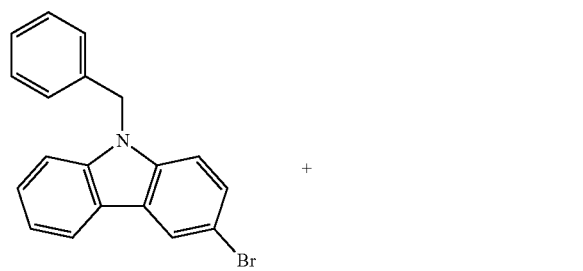

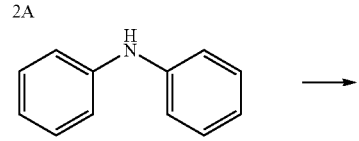

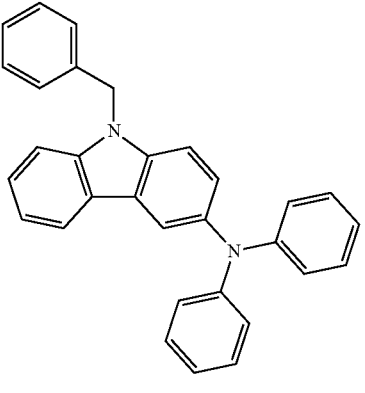

2B 4.47 g (13.3 mmol) of intermediate 2A, 0.69 g (0.67 mmol) of tris(dibenzylideneacetone) dipalladium (0) chloroform complex (Pd$_2$(dba)$_3$·CH$_3$Cl) 0.82 g (2.7 mmol) of tri-tert-butylphosphonium tetrafluoroborate (P(t-Bu)$_3$· HFB$_4$), 1.9 g (20 mmol) of sodium t-butoxide (tert-BuONa) and 2.5 g (14.6 mmol) of diphenyl amine were dissolved in dry toluene, and then the solution was refluxed with stirring for 18 hours at 100° C. under nitrogen atmosphere. The solution was extracted with dichloromethane and water, the organic layer was dried with magnesium sulfate and then was filtered with silica gel. The extracted liquid was distilled under reduced pressure and purified by column chromatography to give 4.3 g (yield: 76%) of intermediate 2B.

(3) Synthesis of Intermediate 2C

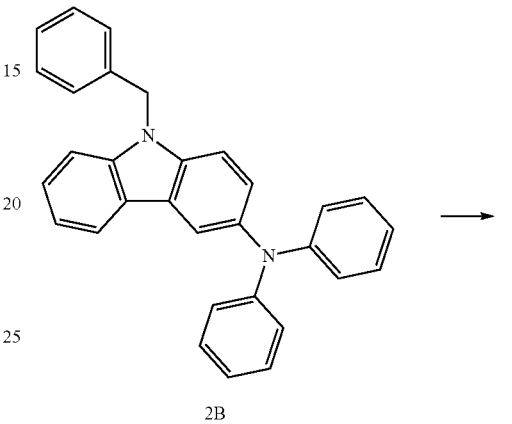

2B

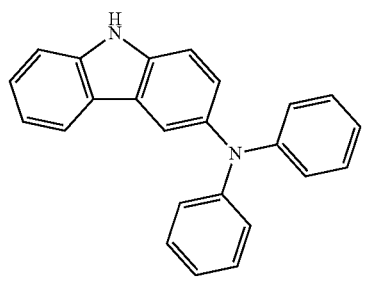

2C

After 6.3 g (15.0 mmol) of intermediate 2B was dispersed in 45 mL anisole, and 12.0 g (90.0 mmol) of AlCl$_3$ was injected into the anisole suspension slowly. After stirring for 24 hours at 65° C., the solution was extracted with dichloromethane and water, the organic layer was dried with magnesium sulfate and then was filtered. The extracted liquid was distilled under reduced pressure and purified by column chromatography to give 2.3 g (yield: 46%) of intermediate 2C.

(4) Synthesis of Intermediate 2D

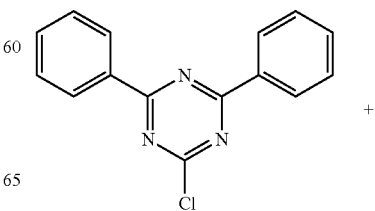

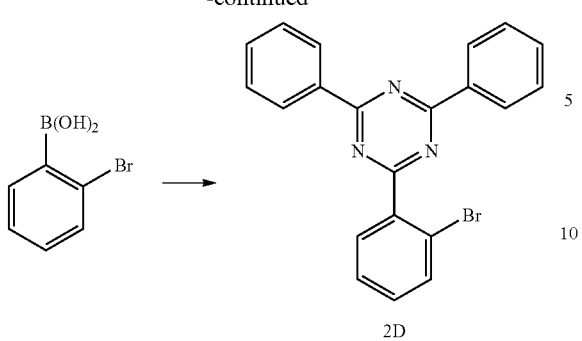

5.3 g (20 mmol) of 2-chloro-4,6-diphenyl-1.3,5-triazine, 4.4 g (22 mmol) of 2-bromophenyl boronic acid, 8.3 g (60 mmol) of potassium carbonate and 0.7 g (0.6 mmol) of Pd(PPh$_3$)$_4$ were suspended into a mixed solvent of 75 mL of THF and 15 mL of water, and then the suspension was refluxed with stirring for 12 hours under nitrogen atmosphere. The solution was extracted with dichloromethane and water, the organic layer was dried with magnesium sulfate and then filtered with silica gel. The extracted liquid was distilled under reduced pressure and purified by column chromatography to give 5.0 g (yield: 65%) of intermediate 2D.

(5) Synthesis of Compound A-2

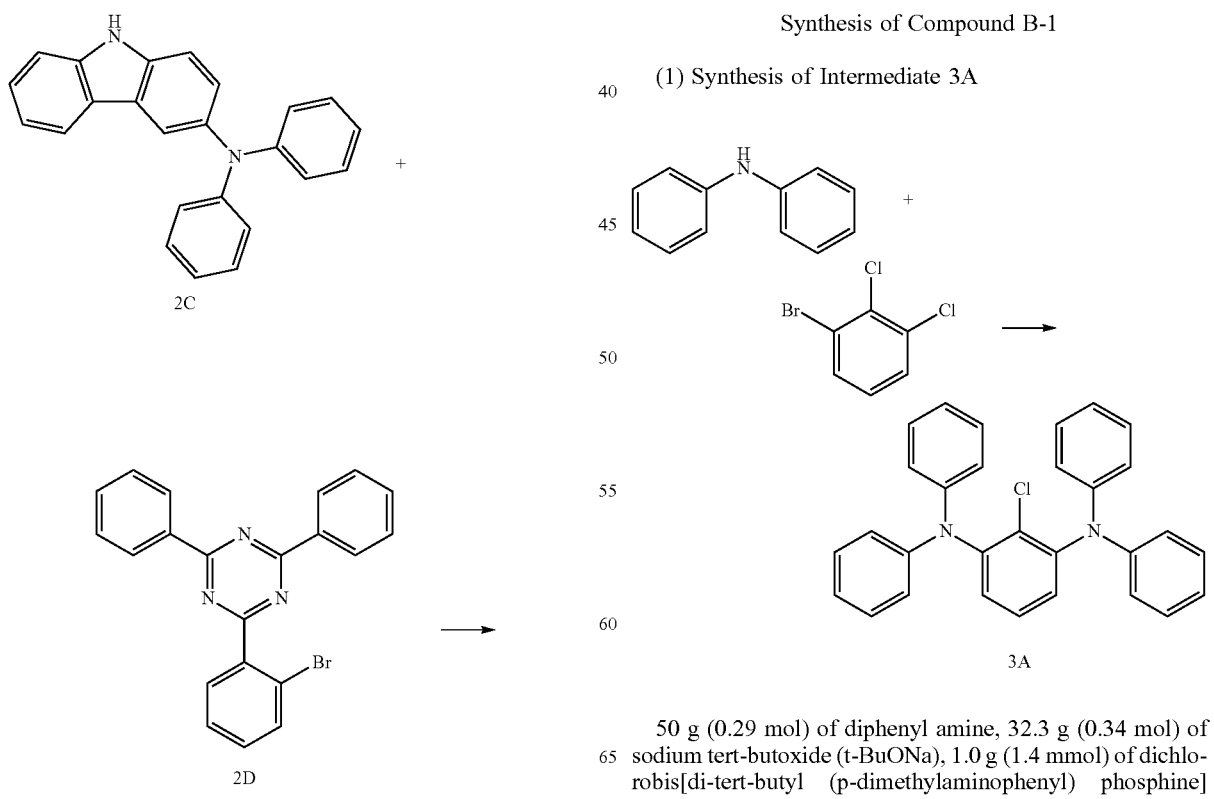

5.0 g (15.0 mmol) of intermediate 2C, 6.4 g (16.5 mmol) of intermediate 2D, 0.78 g (0.75 mmol) of Pd$_2$(dba)$_3$.CHCl$_3$, 0.91 g (3.0 mmol) of P(t-Bu)$_3$.HBF$_4$, 2.2 g (22.5 mmol) of tert-BuONa were dissolved in 100 mL of dry toluene, and then the solution was refluxed with stirring for 18 hours at 100° C. under nitrogen atmosphere. The solution was extracted with dichloromethane and water, the organic layer was dried with magnesium sulfate and then was filtered with silica gel. The extracted liquid was distilled under reduced pressure and purified by column chromatography to give 5.8 g (yield: 60%) of Compound A-2.

SYNTHESIS EXAMPLE 3

Synthesis of Compound B-1

(1) Synthesis of Intermediate 3A 50 g (0.29 mol) of diphenyl amine, 32.3 g (0.34 mol) of sodium tert-butoxide (t-BuONa), 1.0 g (1.4 mmol) of dichlorobis[di-tert-butyl (p-dimethylaminophenyl) phosphine] palladium (II) (PdCl$_2$(Amphos)$_2$), 30 g (0.13 mol) of 1-bromo-2,3-dichlorobenzene were dissolved in 330 mL of o-xylene under nitrogen atmosphere, and then the solution was stirred for 2 hours at 80° C. and additionally stirred for 3 hours at 120° C. Then, the solution was treated with ethyl acetate and water to generate a precipitate. After the liquid was separated by filtering, the liquid was dissolved in toluene, was passed through a silica gel column and then distilled under reduced pressure to give 29 g (yield: 50%) of intermediate 3A.

(2) Synthesis of Compound B-1

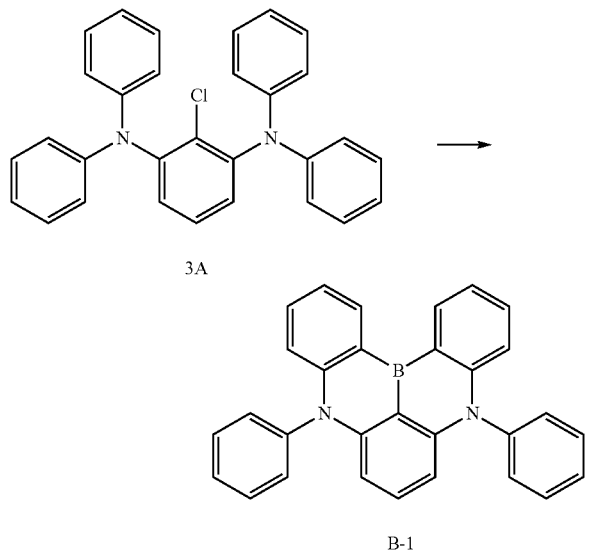

After 20 g (44.7 mmol) of intermediate 3A was dissolved in 150 mL of tert-butylbenzene, 31.6 mL (53.7 mmol) of 1.7 M tert-BuLi (in pentane) was injected with drop-wise at −30° C. After stirring for 2 hours at 60° C., pentane was evaporated, the solution was cooled down −30° C., 5.1 mL (53.9 mmol) of tri-bromide was injected into the solution, and then the solution was stirred again for 30 minutes. 15.6 mL (90 mmol) of N,N-diisopropyl amine was injected into the solution at 0° C., the temperature was raised and the solution was stirred for 3 hours at 120° C. 100 mL of water (dissolving 13 g of sodium acetate) and 50 mL of ethyl acetate was added to the reaction vessel. The solution was extracted with ethyl acetate, the organic layer was dried with magnesium sulfate and then the solution was filtered. After the solution was distilled under reduced pressure, the solution was treated with toluene and pentane to precipitate a solid 4 g (yield: 21%) of Compound B-1.

EXPERIMENTAL EXAMPLE 1

Evaluation of Energy Level of Compound

Energy levels such as excited state singlet energy level ($S_1$), excited state triplet energy level ($T_1$), HOMO energy levels and LUMO energy levels were evaluated for compound A-1, A-2 and B-1 which have been synthesized according to Synthesis Examples 1 to 3. In order to measure the $S_1$ of the compounds, each of the compounds was deposited on a glass substrate with a thickness of 50 nm, and an absorption spectrum for the compound was measured at 298K. A tangent line was drawn with respect to the falling curve on the long wavelength sides of the measured absorption spectrum to obtain a wavelength value ($\lambda_{edge}$; nm) at the intersection of the tangent line and the horizontal axis. Using the wavelength value, $S_1$ was calculated from the following Conversion Equation 1:

$$S_1 \text{ (eV)} = 1242/\lambda_{edge} \qquad \text{Conversion Equation 1:}$$

In order to measure the T1 of the compounds, a film of mCBP doped with each of the compounds (doping concentration: 20%) was deposited on a glass substrate with a thickness of 50 nm and maximum photoluminescence ($\lambda_{max}$) of phosphorescent peak was measured using 355 nm beam at 77K. Using the $\lambda_{max}$, $T_1$ was calculated from the following Conversion Equation 2:

$$T_1 \text{ (eV)} = 1242/\lambda_{max} \qquad \text{Conversion Equation 2:}$$

In order to measure HOMO energy level, each of the compounds was deposited on a glass substrate with a thickness of 50 nm and then each sample was subject to photoelectron spectroscopy (Riken Keiki, AC-2). LUMO energy level was calculated from the following Conversion Equation 3:

$$\text{LUMO energy level (eV)} = |\text{HOMO} - S_1| \qquad \text{Conversion Equation 3:}$$

The evaluation results are indicted in Table 1. Energy levels of mCBP, which was used as a host in an emitting material layer, were included in Table 1 based upon literature values.

TABLE 1

| Energy Level of Compound | | | | | |
|---|---|---|---|---|---|
| Compound | $S_1$(eV) | $T_1$(eV) | HOMO (eV) | LUMO (eV) | Eg (eV) |
| mCBP | 3.60 | 2.90 | −6.00 | −2.40 | 3.60 |
| A-1 | 2.91 | 2.69 | −5.77 | −2.86 | 2.91 |
| A-2 | 2.80 | 2.65 | −5.50 | −2.70 | 2.80 |
| B-1 | 2.64 | 2.50 | −5.50 | −2.86 | 2.64 |

Eg: LUMO-HOMO

EXAMPLE 1

Fabrication of Organic Light Emitting Diode (OLED)

An organic light emitting diode was fabricated applying CBP as a host, Compound A-1 as a first delayed fluorescent dopant and Compound B-1 as a second delayed fluorescent dopant into an emitting material layer. The ITO substrate was washed by UV-Ozone treatment before using it, and was transferred to a vacuum chamber for depositing emission layer. Subsequently, an anode, an emission layer and a cathode were deposited by evaporation from a heating boat under $10^{-7}$ Torr vacuum condition as the following order:

An anode (ITO, 500 Å); a hole injection layer (HIL) (HAT-CN; 70 Å); a hole transport layer (HTL) (NPB, 500 Å); an electron blocking layer (EBL) (3 Cz; 100 Å); an emitting material layer (EML) (mCBP:A-1:B-1=79:20:1 by weight ratio; 250 Å); a hole blocking layer (HBL) (TSPO1; 150 Å); an electron transport layer (ETL) (TPBi; 350 Å); an electron injection layer (EIL) (LiF; 10 Å); and a cathode (Al; 1000 Å).

And then, capping layer (CPL) was deposited over the cathode and the device was encapsulated by glass. After deposition of emissive layer and the cathode, the OLED was transferred from the deposition chamber to a dry box for film formation, followed by encapsulation using UV-curable epoxy resin and moisture getter. The manufacture organic light emitting diode had an emission area of 9 mm$^2$. The energy levels among the host (H), the first delayed fluorescent dopant (TD1) and the second delayed fluorescent dopant (TD2) are as follows: $HOMO^H-HOMO^{TD1}=-0.23$ eV; $HOMO^{TD2}-HOMO^{TD1}=0.27$ eV; $LUMO^H-LUMO^{TD1}=0.46$ eV; $LUMO^{TD1}=LUMO^{TD2}$.

EXAMPLE 2

Fabrication of OLED

An OLED was fabricated using the same materials as Example 1, except that an EML having a double-layered structure, i.e. a second emitting material layer of host and second delayed fluorescent dopant (mCBP:B-1=80:20 by weight ratio; 100 Å) on the EBL and a first emitting material layer of host and first delayed fluorescent dopant (mCBP:A-1=80:20 by weight ratio, 150 Å), has been laminated instead of the single-layered EML. The energy levels among the host (H), the first delayed fluorescent dopant (TD1) and the second delayed fluorescent dopant (TD2) are the same as in Example 1.

COMPARATIVE EXAMPLE 1

Fabrication of OLED

An OLED was fabricated using the same materials as Example 1, except that luminous materials mCBP (host):A-1 (delayed fluorescent dopant) (80:20 by weight ratio; Ref. 1) have been used in the EML instead of mCBP:A-1:B-1. The energy levels among the host (H) and the delayed fluorescent dopant (TD) are as follows: $HOMO^H-HOMO^{TD}=-0.23$ eV; $LUMO^H-LUMO^{TD}=0.46$ eV.

COMPARATIVE EXAMPLE 2

Fabrication of OLED

An OLED was fabricated using the same materials as Example 1, except that luminous materials mCBP (host):B-1 (delayed fluorescent dopant) (80:20 by weight ratio; Ref. 2) have been used in the EML instead of mCBP:A-1:B-1. The energy levels among the host (H) and the delayed fluorescent dopant (TD) are as follows: $HOMO^H-HOMO^{TD}=-0.50$ eV; $LUMO^H-LUMO^{TD}=0.46$ eV.

COMPARATIVE EXAMPLE 3

Fabrication of OLED

An OLED was fabricated using the same materials as Example 1, except that luminous materials mCBP (host):A-2 (delayed fluorescent dopant) (80:20 by weight ratio; Ref. 3) have been used in the EML instead of mCBP:A-1:B-1. The energy levels among the host (H) and the delayed fluorescent dopant (TD) are as follows: $HOMO^H-HOMO^{TD}=-0.50$ eV; $LUMO^H-LUMO^{TD}=0.30$ eV.

COMPARATIVE EXAMPLE 4

Fabrication of OLED

An OLED was fabricated using the same materials as Example 1, except that luminous materials mCBP (host):A-2 (first delayed fluorescent dopant):B-1 (second delayed fluorescent dopant) (79:20:1 by weight ratio, Ref. 4) have been used in the EML instead of mCBP:A-1:B-1. The energy levels among the host (H), the first delayed fluorescent dopant (TD1) and the second delayed fluorescent dopant (TD2) are as follows: $HOMO^H-HOMO^{TD1}=-0.50$ eV; $HOMO^{TD2}=HOMO^{TD1}$; $LUMO^H-LUMO^{TD1}=0.30$ eV; $LUMO^{TD1}-LUMO^{TD2}=0.16$ eV.

COMPARATIVE EXAMPLE 5

Fabrication of OLED

An OLED was fabricated using the same materials as Example 1, except that luminous materials, mCBP (host): A-2 (delayed fluorescent dopant):fluorescent dopant as indicated below (79:20:1 by weight ratio; Ref. 5) have been used in the EML instead of mCBP:A-1:B-1. The energy levels among the host (H) and the delayed fluorescent dopant are as follows: $HOMO^H-HOMO^{TD}=-0.50$ eV; $LUMO^H-LUMO^{TD}=0.30$ eV.

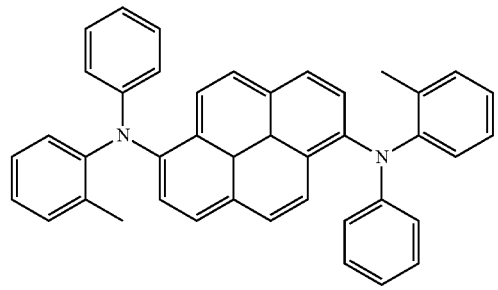

[Fluorescent Dopant]

COMPARATIVE EXAMPLE 6

Fabrication of OLED

An OLED was fabricated using the same materials as Example 2, except that luminous materials mCBP (host):the fluorescent dopant (second dopant) (80:20 by weight ratio; 100 Å) in the second EML (Ref. 6) have been used instead of mCBP:B-1. The energy levels among the host (H) and the delayed fluorescent dopant (A-1; TD) are as follows: $HOMO^H-HOMO^{TD}=-0.23$ eV; $LUMO^H-LUMO^{TD}=0.46$ eV.

EXPERIMENTAL EXAMPLE 2

Measurement of Luminous Properties of OLED

Each of the organic light emitting diode fabricated by Examples 1 to 2 and Comparative Examples 1 to 6 was connected to an external power source, and luminous properties for all the diodes were evaluated using a constant current source (KEITHLEY) and a photometer PR650 at room temperature. In particular, maximum External Quantum Efficiency ($EQE_{max}$; %), External Quantum Efficiency (EQE, %), maximum Electroluminescence Wavelength ($\lambda_{max}$; nm), FWHM (nm) and CIE color coordinates ($CIE_x$, $CIE_y$) at a current density of 10 mA/cm² of the light emitting diodes of Examples 1 to 2 and Comparative Examples 1 to 6 (Ref. 1-6) were measured. The results thereof are shown in the following Table 2 and in FIGS. 12 to 14.

TABLE 2

Luminous Properties of OLED

| Sample | $EQE_{max}$ (%) | EQE (%) | $\lambda_{max}$ (nm) | FWHM (nm) | $CIE_x$ | $CIE_y$ |
|---|---|---|---|---|---|---|
| Ref. 1 | 8.0 | 4.9 | 466 | 65 | 0.148 | 0.192 |
| Ref. 2 | 10 | 4.2 | 464 | 33 | 0.132 | 0.133 |
| Ref. 3 | 9.2 | 6.4 | 473 | 71 | 0.150 | 0.241 |
| Ref. 4 | 9.6 | 7.2 | 464 | 36 | 0.141 | 0.152 |
| Ref. 5 | 4.5 | 4.0 | 462 | 51 | 0.143 | 0.160 |
| Ref. 6 | 4.0 | 3.8 | 463 | 53 | 0.145 | 0.165 |
| Example 1 | 18.2 | 11.0 | 462 | 35 | 0.139 | 0.145 |
| Example 2 | 16.2 | 8.2 | 464 | 40 | 0.142 | 0.165 |

Figure 12:
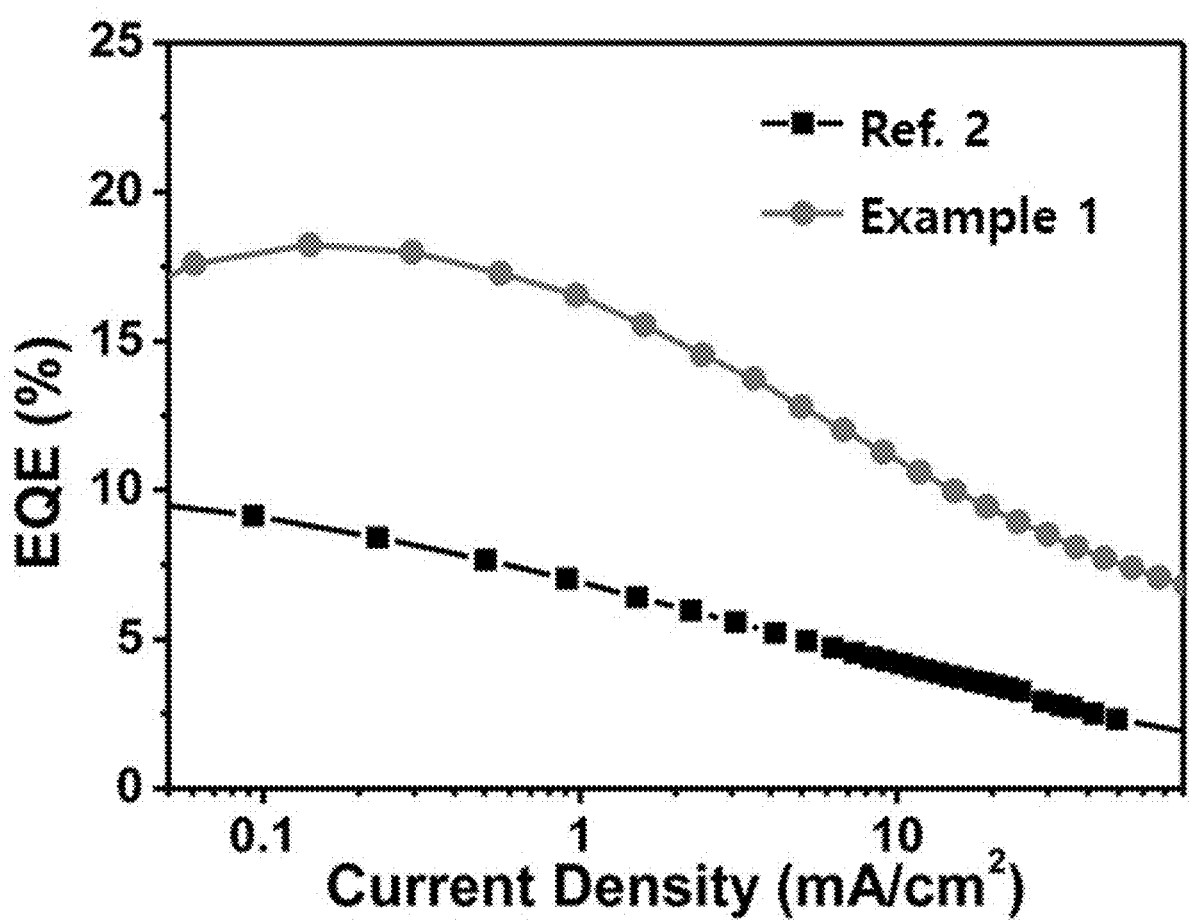
FIGS. 12 to 14 are graphs each of which illustrates an External Quantum Efficiency (EQE) as a function of current density changes in an organic light emitting diode fabricated by applying a plurality of delayed fluorescent materials in accordance with Examples of the present disclosure.
Figure 13:
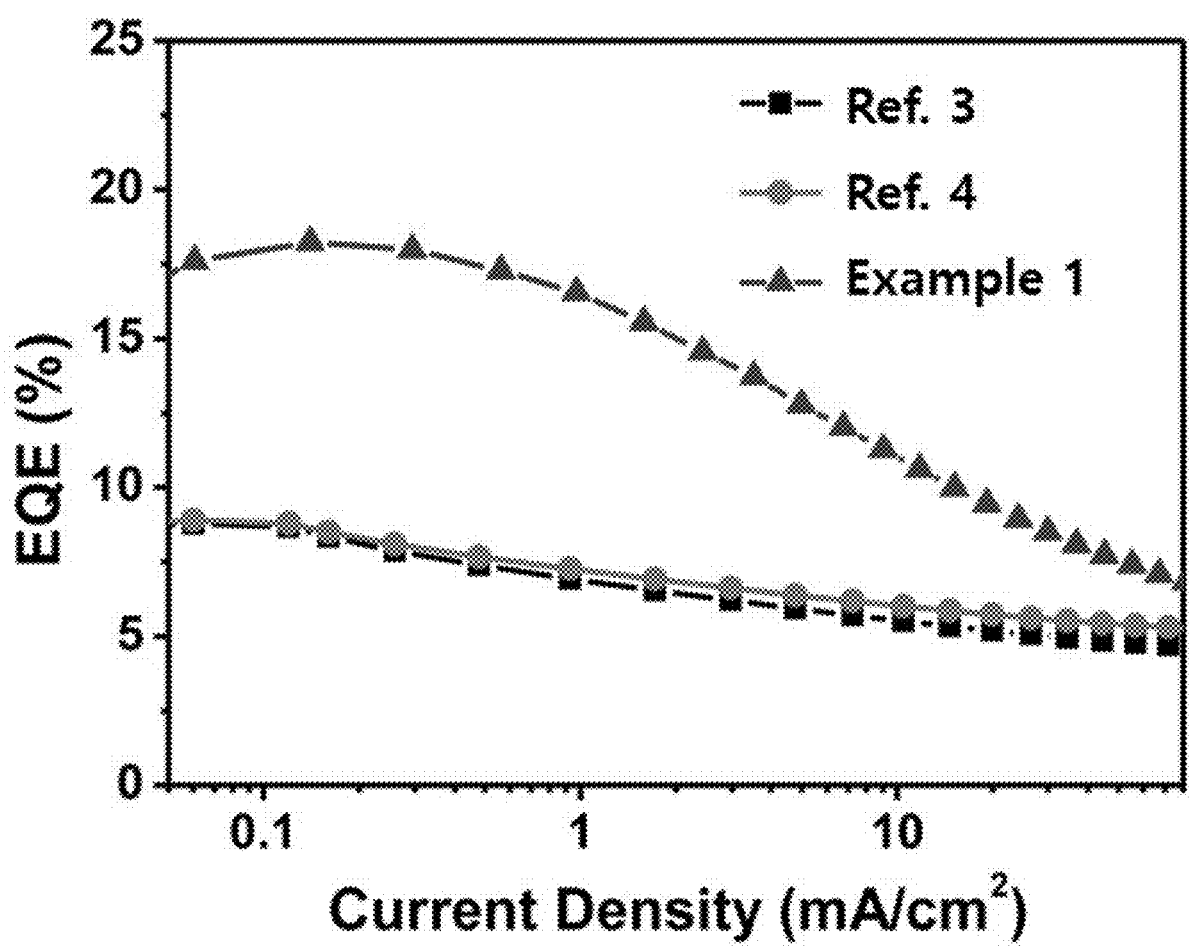
Figure 14:
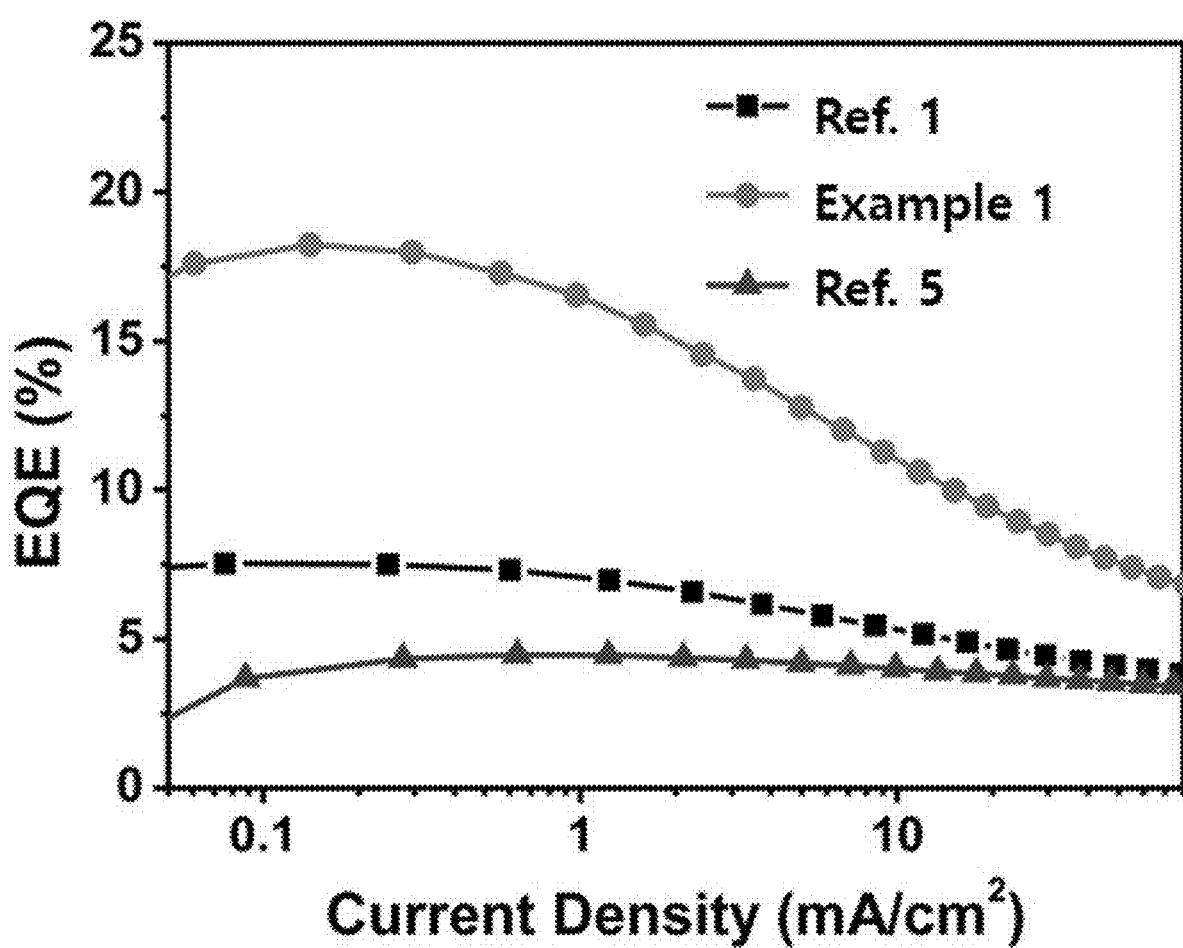

As indicated in Table 2 and FIGS. 12-14, each of the organic light emitting diodes of Examples 1 to 2 including two delayed fluorescent dopants whose energy levels are controlled in the EML had an enhanced luminous efficiency and color purity owing to narrow FWHM.

Particularly, compared with the OLEDs only using the second delayed fluorescent dopant in Comparative Example 2, the OLED using two different delayed fluorescent dopants whose energy levels are controlled (Example 1) hand a maximum EQE which is improved by 82% and an EQE which is improved by 162.0% (See, FIG. 12). Compared with the OLEDs which are only using the first delayed fluorescent dopants "A-1" and "A-2" (Comparative Examples 1 and 3), the OLED in Example 1 had an improved color purity owing to its narrow FWHM and can implement deep blue color as indicated in the CIE color coordinates.

In addition, compared with the OLED which includes different delayed fluorescent dopants whose HOMO energy levels are identical (Comparative Example 4), the OLED in Example 1 has a maximum EQE which is enhanced by 89.6% and an EQE which is enhanced by 52.8%. Compared with the OLED only using the first delayed fluorescent dopant (Comparative Example 3), the OLED applying the second delayed fluorescent dopant whose energy levels are not controlled (Comparative Example 4) did not show an improved luminous efficiency (See, FIG. 13).

Moreover, compared with the OLED applying the fluorescent dopant instead of the second delayed fluorescent dopant in Comparative Example 5, the OLED in Example 1 has a maximum EQE which is improved by 304.4% and an EQE which is improved by 175% (See, FIG. 14). In addition, the OLED in Examples 1 and 2 have an improved color purity due to their narrow FWHM compared with the OLEDs using the fluorescent dopant in Comparative Examples 5 and 6. Particularly, compared with the OLED using the fluorescent dopant as the final luminous material (Comparative Example 5), the OLED using the delayed fluorescent dopant whose energy levels are controlled has an enhanced color purity as well as an enhanced luminous efficiency. Compared with the OLED using the fluorescent dopant within one EML among two EMLs in Comparative Example 6, the OLED applying two different delayed fluorescent dopants whose energy levels are controlled into each of two EMLs in Example 2 has a maximum EQE which is improved by 305% and an EQE which is improved by 115.8%, as well as an improved color purity.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure covers the modifications and variations of the present disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode, comprising:

a first electrode;

a second electrode, wherein the first and second electrodes face each other; and at least one emitting unit disposed between the first and second electrodes, wherein the at least one emitting unit comprises at least one emitting material layer, wherein the at least one emitting material layer comprises a first host, a first delayed fluorescent dopant and a second delayed fluorescent dopant, wherein each of an excited state singlet energy level ($S_1^{TD1}$) and an excited state triplet energy level ($T_1^{TD1}$) of the first delayed fluorescent dopant is higher than each of an excited state singlet energy level ($S_1^{TD2}$) and an excited state triplet energy level ($T_1^{TD2}$) of the second delayed fluorescent dopant, respectively, wherein a highest occupied molecular orbital (HOMO) energy level ($HOMO^{TD1}$) of the first delayed fluorescent dopant and a HOMO energy level ($HOMO^{TD2}$) of the second delayed fluorescent dopant satisfy the following relationship in Equation (3), wherein a lowest unoccupied molecular orbital (LUMO) energy level ($LUMO^{TD1}$) of the first delayed fluorescent dopant and a LUMO energy level ($LUMO^{TD2}$) of the second delayed fluorescent dopant satisfy the following relationship in Equations (7), $$HOMO^{TD2} - HOMO^{TD1} > 0.2 \text{ eV} \quad (3)$$

$$LUMO^{TD1} \geq LUMO^{TD2} \quad (7), \text{ and}$$

wherein the first delayed fluorescent dopant includes an organic compound having the following structure of Chemical Formula 1:

Chemical Formula 1

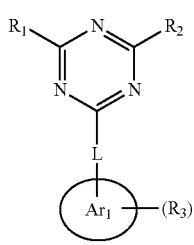

wherein each of $R_1$ and $R_2$ is independently a $C_5$~$C_{30}$ aryl group or a $C_4$~$C_{30}$ hetero aryl group; $R_3$ is halogen, a $C_1$~$C_{20}$ alkyl halide, a cyano group, a nitro group, a linear or branched $C_1$~$C_{20}$ alkyl group, a $C_1$~$C_{20}$ alkoxy group, a $C_5$~$C_{30}$ aryl group unsubstituted or substituted with a group selected from halogen, a $C_1$~$C_{20}$ alkyl halide, a cyano group, a nitro group and combinations thereof, or a $C_4$~$C_{30}$ hetero aryl group unsubstituted or substituted with a group selected from halogen, a $C_1$~$C_{20}$ alkyl halide, a cyano group, a nitro group and combinations thereof; m is a number of substituent and is an integer of 1 to 5; $Ar_1$ is a $C_{10}$~$C_{30}$ fused hetero aryl group; and L is a $C_5$~$C_{30}$ arylene group unsubstituted or substituted with one or more groups selected from halogen, a $C_1$~$C_{20}$ alkyl halide, a cyano group, a nitro group and combinations thereof, or a $C_4$~$C_{30}$ hetero arylene group unsubstituted or substituted with one or more selected from halogen, a $C_1$~$C_{20}$ alkyl halide, a cyano group, a nitro group and combinations thereof.

2. The organic light emitting diode of claim 1, wherein the HOMO energy level ($HOMO^{TD1}$) of the first delayed fluorescent dopant and the HOMO energy level ($HOMO^{TD2}$) of the second delayed fluorescent dopant satisfy the following relationship in Equation (4)

$$0.2\ eV < HOMO^{TD2} - HOMO^{TD1} < 1.0\ eV \quad (4).$$

3. The organic light emitting diode of claim 1, wherein the LUMO energy level ($LUMO^{TD1}$) of the first delayed fluorescent dopant and the LUMO energy level ($LUMO^{TD2}$) of the second delayed fluorescent dopant satisfy the following relationship in Equation (8)

$$|LUMO^{TD1} - LUMO^{TD2}| < 0.2\ eV \quad (8).$$

4. The organic light emitting diode of claim 1, wherein the first delayed fluorescent dopant includes an organic compound having the following structure of Chemical Formula 2:

Chemical Formula 2

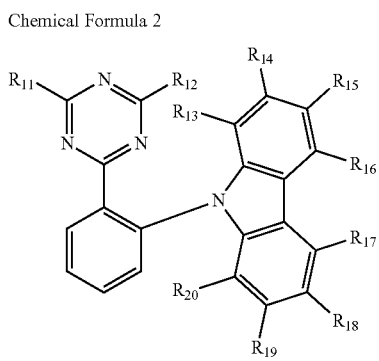

wherein each of $R_{11}$ and $R_{12}$ is independently a $C_5$~$C_{20}$ aryl group; and each of $R_{13}$ to $R_{20}$ is independently protium, deuterium, tritium, a cyano group, a linear or branched $C_1$~$C_{10}$ alkyl group, a $C_5$~$C_{30}$ aryl amino group unsubstituted or substituted with $C_5$~$C_{20}$ aryl group, a $C_5$~$C_{30}$ aryl group unsubstituted or substituted with a cyano group, or a $C_4$~$C_{30}$ hetero aryl group unsubstituted or substituted with a cyano group.

5. The organic light emitting diode of claim 1, wherein the first delayed fluorescent dopant includes anyone having the following structure of Chemical Formula 3:

Chemical Formula 3

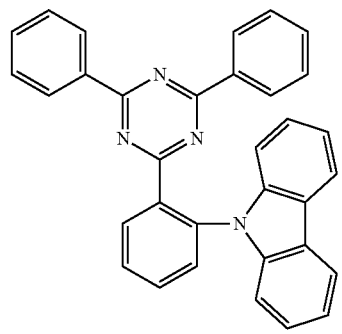
A-1

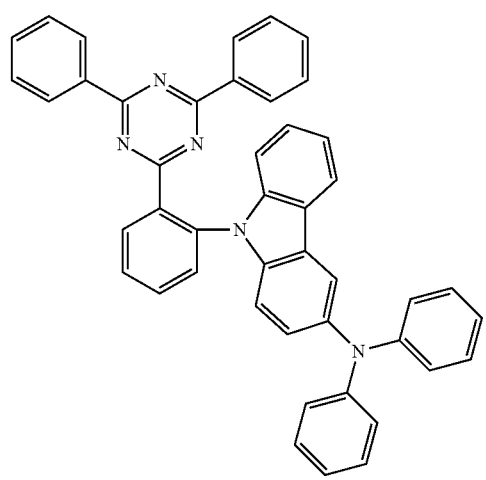
A-2

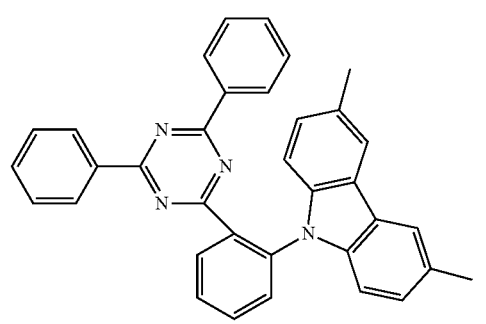
A-3

A-4
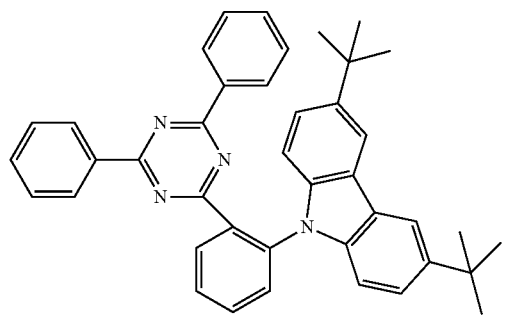
A-5
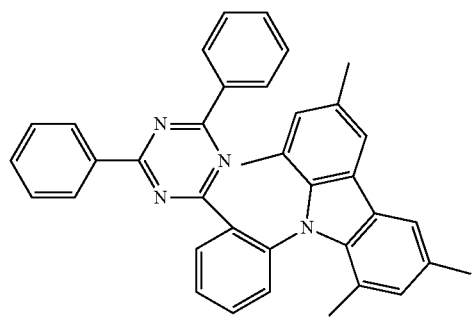
A-6
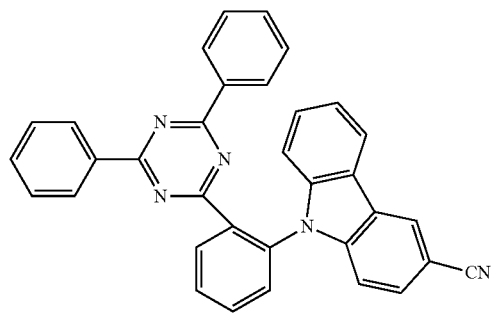
A-7
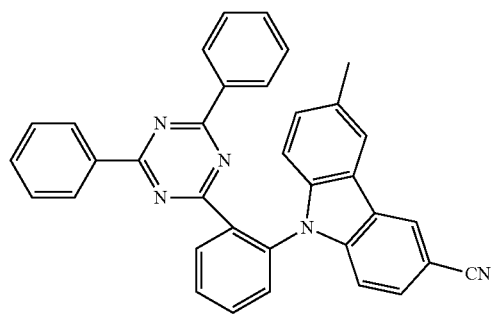
A-8
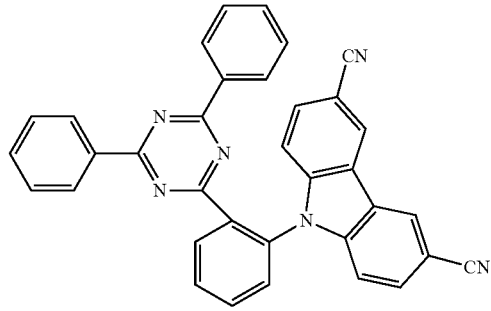
A-9
A-10
A-11
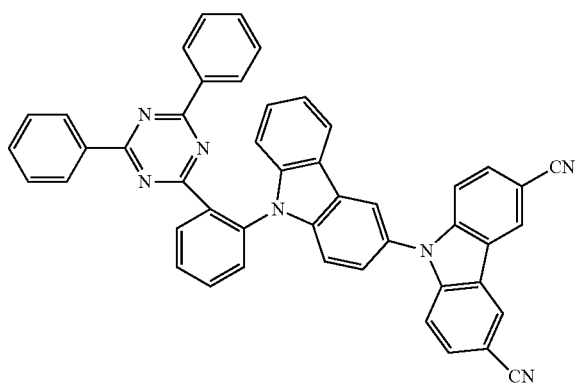

-continued

A-12

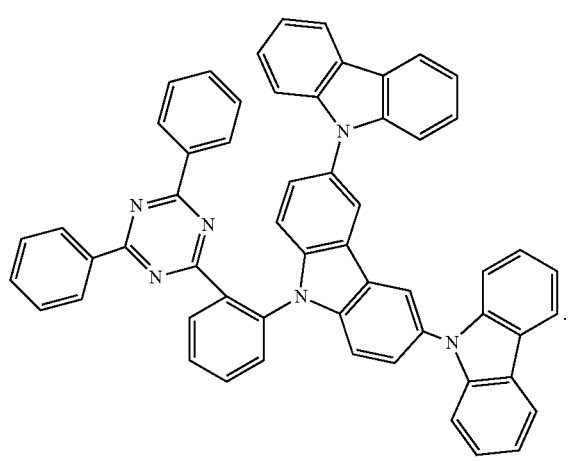

6. The organic light emitting diode of claim 1, wherein the second delayed fluorescent dopant includes an organic compound having the following structure of Chemical Formula 4:

Chemical Formula 4

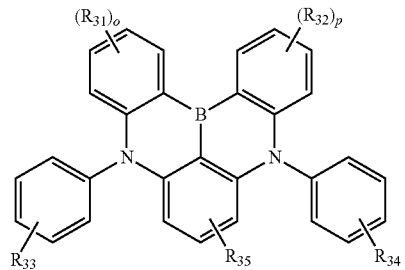

wherein each of $R_{31}$ and $R_{32}$ is independently a linear or branched $C_1$~$C_{20}$ alkyl group, a $C_1$~$C_{20}$ alkoxy group, a $C_5$~$C_{30}$ aryl group, a $C_4$~$C_{30}$ hetero aryl group or an aromatic or hetero aromatic amino group, wherein the amino group is substituted with a group selected from the group consisting of a $C_5$~$C_{30}$ aryl group, a $C_4$~$C_{30}$ hetero aryl group, a $C_5$~$C_{30}$ aryl amino group unsubstituted or substituted with a $C_5$~$C_{20}$ aryl group, a $C_4$~$C_{30}$ hetero aryl amino group unsubstituted or substituted with a $C_4$~$C_{20}$ hetero aryl group and combinations thereof, or two adjacent groups among each of $R_{31}$ and $R_{32}$ form respectively a $C_5$~$C_{20}$ fused aromatic ring or a $C_4$~$C_{20}$ fused hetero aromatic ring, wherein each of the $C_5$~$C_{20}$ fused aromatic ring and the $C_4$~$C_{20}$ fused hetero aromatic ring is independently unsubstituted or substituted with a $C_5$~$C_{20}$ aryl group or a $C_4$~$C_{20}$ hetero aryl group; each of and p is a number of a substituent and an integer of 0 to 3; each of $R_{33}$ and $R_{34}$ is independently protium, deuterium, tritium, a linear or branched $C_1$~$C_{20}$ alkyl group, a $C_1$~$C_{20}$ alkoxy group, a $C_5$~$C_{30}$ aryl group or a $C_4$~$C_{30}$ hetero aryl group; $R_{35}$ is protium, deuterium, tritium, linear or branched a $C_1$~$C_{20}$ alkyl group, a $C_1$~$C_{20}$ alkoxy group or an aromatic or hetero aromatic amino group, wherein the amino group is substituted with a group selected from the group consisting of a $C_5$~$C_{30}$ aryl group, a $C_4$~$C_{30}$ hetero aryl group and combinations thereof.

7. The organic light emitting diode of claim 1, wherein the second delayed fluorescent dopant includes an organic compound having the following structure of Chemical Formula 5:

Chemical Formula 5

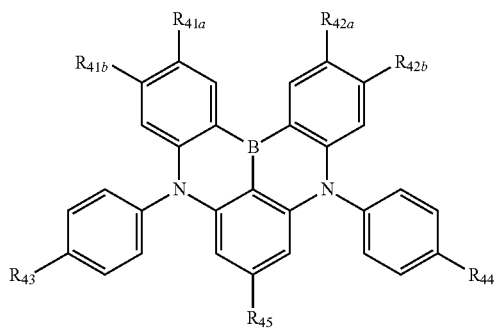

wherein each of $R_{41a}$, $R_{41b}$, $R_{42a}$ and $R_{42b}$ is independently protium, deuterium, tritium, a linear or branched $C_1$~$C_{10}$ alkyl group, a $C_5$~$C_{30}$ aryl group, a $C_4$~$C_{30}$ hetero aryl group or an aromatic or hetero aromatic amino group, wherein the amino group is substituted with a group selected from the group consisting of a $C_5$~$C_{30}$ aryl group, a $C_4$~$C_{30}$ hetero aryl group, a $C_5$~$C_{30}$ aryl amino group unsubstituted or substituted with a $C_5$~$C_{20}$ aryl group, a $C_4$~$C_{30}$ hetero aryl amino group unsubstituted or substituted with a $C_4$~$C_{20}$ hetero aryl group and combinations thereof, or two adjacent groups among $R_{41a}$, $R_{41b}$, $R_{42a}$ and $R_{42b}$ form respectively a $C_4$~$C_{20}$ fused hetero aryl ring unsubstituted or substituted with a $C_5$~$C_{20}$ aryl group; each of $R_{43}$ and $R_{44}$ is independently protium, deuterium, tritium, a linear or branched $C_1$~$C_{10}$ alkyl group or an aromatic or hetero aromatic amino group, wherein the amino group is substituted with a group selected from the group consisting of a $C_5$~$C_{30}$ aryl group, a $C_4$~$C_{30}$ hetero aryl group and combinations thereof. $R_{45}$ is protium, deuterium tritium, a linear or branched $C_1$~$C_{20}$ alkyl group, a $C_1$~$C_{20}$ alkoxy group or an aromatic or hetero aromatic amino group, wherein the amino group is substituted with a group selected from the group consisting of $C_5$~$C_{30}$ aryl group, $C_4$~$C_{30}$ hetero aryl group and combinations thereof.

8. The organic light emitting diode of claim 1, wherein the second delayed fluorescent dopant includes anyone having the following structure of Chemical Formula 6:

Chemical Formula 6

B-1

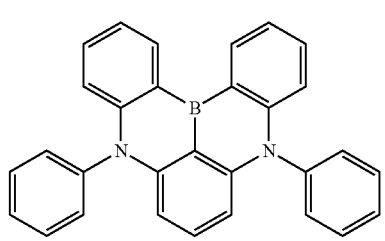

-continued
B-2
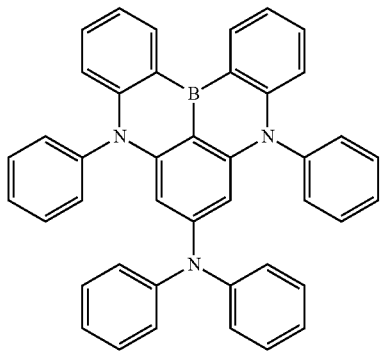
B-3
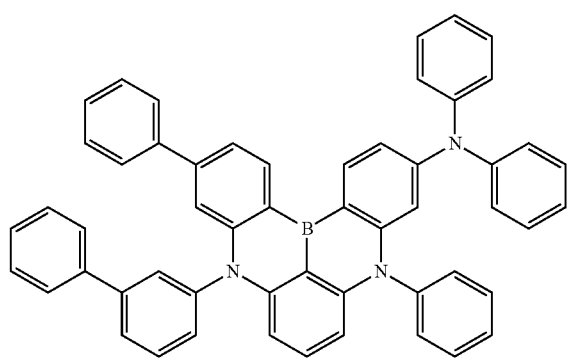
B-4
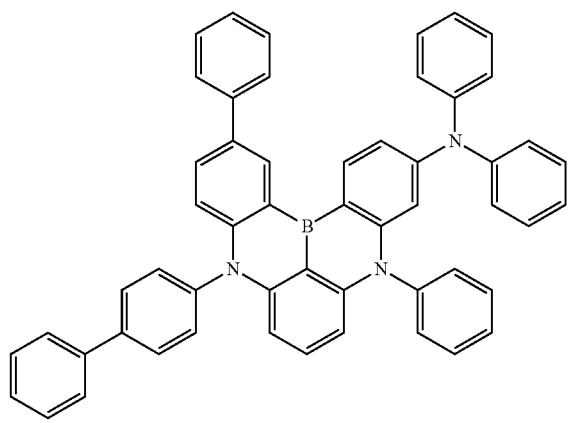
B-5
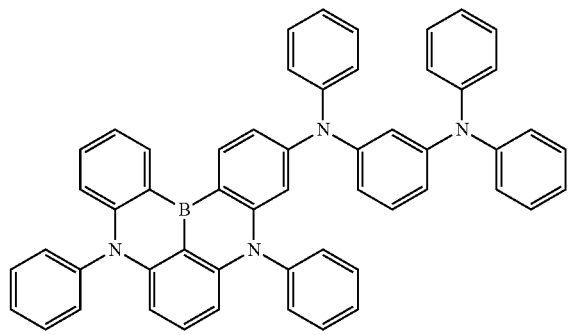
B-6
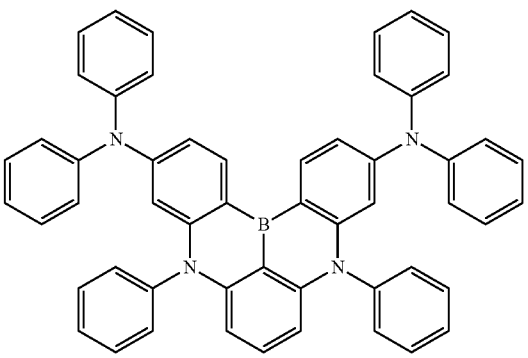
B-7
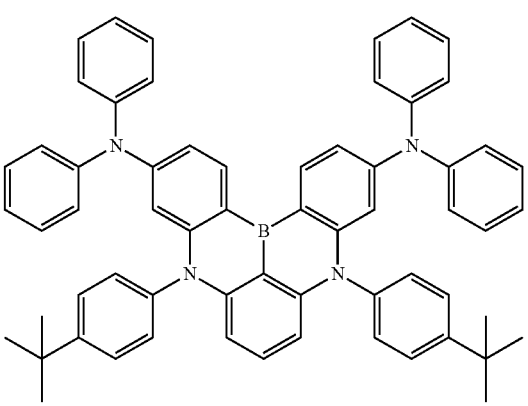
B-8
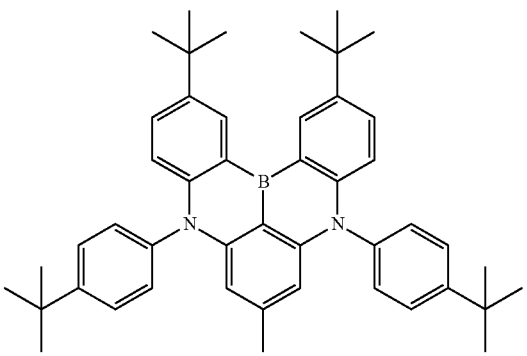
B-9
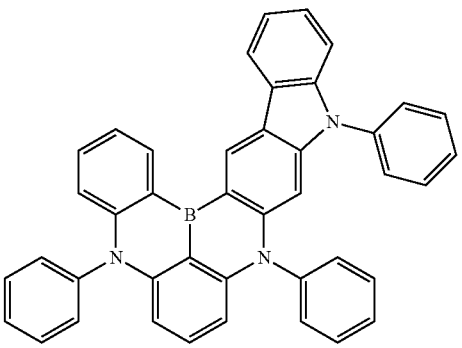

-continued

B-10

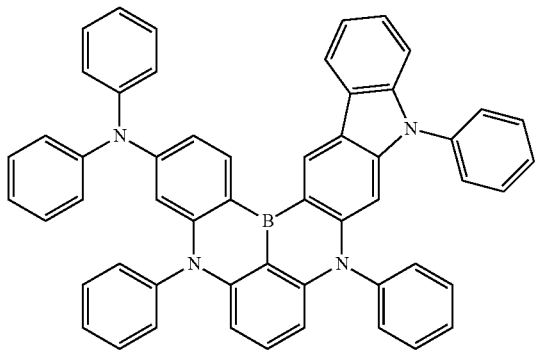

B-11

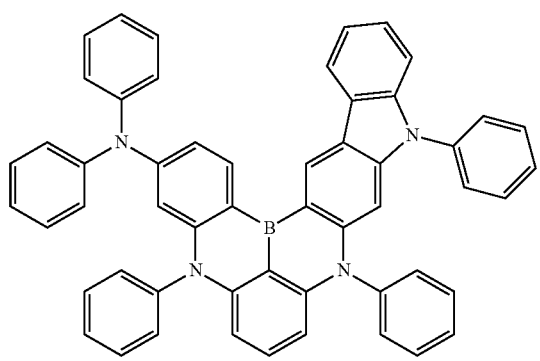

9. The organic light emitting diode of claim 1, wherein the at least one emitting material layer has a single-layered structure.

10. The organic light diode of claim 1, wherein the at least one emitting material layer includes a first emitting material layer disposed between the first and second electrodes and a second emitting material layer disposed between the first electrode and the first emitting material layer or between the first emitting material layer and the second electrode,
wherein the first emitting material layer includes the first host and the first delayed fluorescent dopant, and
wherein the second emitting material layer includes the second delayed fluorescent dopant.

11. The organic light emitting diode of claim 10, wherein the second emitting material layer further includes a second host.

12. The organic light emitting diode of claim 10, further comprising a third emitting material layer disposed oppositely to the second emitting material layer with respect to the first emitting material layer, wherein the third emitting material layer includes a third host and a third delayed fluorescent dopant.

13. The organic light emitting diode of claim 12, wherein an excited state singlet energy level ($S_1^{TD3}$) and an excited state triplet energy level ($T_1^{TD3}$) of the third delayed fluorescent dopant is higher than each of the excited state singlet energy level ($S_1^{TD2}$) and the excited state triplet energy level ($T_1^{TD2}$) of the second delayed fluorescent dopant, respectively.

14. An organic light emitting diode, comprising:
a first electrode;
a second electrode, wherein the first and second electrodes face each other; and
at least one emitting unit disposed between the first and second electrodes,
wherein the at least one emitting unit comprises at least one emitting material layer,
wherein the at least one emitting material layer comprises a first host, a first delayed fluorescent dopant and a second delayed fluorescent dopant,
wherein the first delayed fluorescent dopant includes an organic compound having the following structure of Chemical Formula 1:

Chemical Formula 1

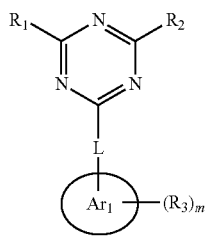

wherein each of $R_1$ and $R_2$ is independently a $C_5$~$C_{30}$ aryl group or a $C_4$~$C_{30}$ hetero aryl group; $R_3$ is halogen, a $C_1$~$C_{20}$ alkyl halide, a cyano group, a nitro group, a linear or branched $C_1$~$C_{20}$ alkyl group, a $C_1$~$C_{20}$ alkoxy group, a $C_5$~$C_{30}$ aryl group unsubstituted or substituted with a group selected from halogen, a $C_1$~$C_{20}$ alkyl halide, a cyano group, a nitro group and combinations thereof, or a $C_4$~$C_{30}$ hetero aryl group unsubstituted or substituted with a group selected from halogen, a $C_1$~$C_{20}$ alkyl halide, a cyano group, a nitro group and combinations thereof; m is a number of substituent and is an integer of 1 to 5; $Ar_1$ is a $C_{10}$~$C_{30}$ fused hetero aryl group; and L is a $C_5$~$C_{30}$ arylene group unsubstituted or substituted with one or more groups selected from halogen, a $C_1$~$C_{20}$ alkyl halide, a cyano group, a nitro group and combinations thereof, or a $C_4$~$C_{30}$ hetero arylene group unsubstituted or substituted with one or more selected from halogen, a $C_1$~$C_{20}$ alkyl halide, a cyano group, a nitro group and combinations thereof, and wherein the second delayed fluorescent dopant includes an organic compound having the following structure of Chemical Formula 4:

Chemical Formula 4

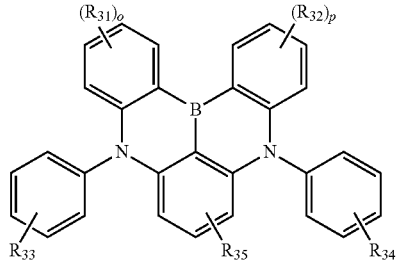

wherein each of $R_{31}$ and $R_{32}$ is independently a linear or branched $C_1$~$C_{20}$ alkyl group, a $C_1$~$C_{20}$ alkoxy group, a $C_5$~$C_{30}$ aryl group, a $C_4$~$C_{30}$ hetero aryl group or an aromatic or hetero aromatic amino group, wherein the amino group is substituted with a group selected from the group consisting of a $C_5$~$C_{30}$ aryl group, a $C_4$~$C_{30}$ hetero aryl group, a $C_5$~$C_{30}$ aryl amino group unsubstituted or substituted with a $C_5$~$C_{20}$ aryl group, a $C_4$~$C_{30}$ hetero aryl amino group unsubstituted or substituted with a $C_4$~$C_{20}$ hetero aryl group and combinations thereof, or two adjacent groups among each of $R_{31}$ and $R_{32}$ form respectively a $C_5$~$C_{20}$ fused aromatic ring or a $C_4$~$C_{20}$ fused hetero aromatic ring, wherein each of the $C_5$~$C_{20}$ fused aromatic ring and the $C_4$~$C_{20}$ fused hetero aromatic ring is independently unsubstituted or substituted with a $C_5$~$C_{20}$ aryl group or a $C_4$~$C_{20}$ hetero aryl group; each of and p is a number of a substituent and an integer of 0 to 3; each of $R_{33}$ and $R_{34}$ is independently protium, deuterium, tritium, a linear or branched $C_1$~$C_{20}$ alkyl group, a $C_1$~$C_{20}$ alkoxy group, a $C_5$~$C_{30}$ aryl group or a $C_4$~$C_{30}$ hetero aryl group; $R_{35}$ is protium, deuterium, tritium, linear or branched a $C_1$~$C_{20}$ alkyl group, a $C_1$~$C_{20}$ alkoxy group or an aromatic or hetero aromatic amino group, wherein the amino group is substituted with a group selected from the group consisting of a $C_5$~$C_{30}$ aryl group, a $C_4$~$C_{30}$ hetero aryl group and combinations thereof.

15. The organic light emitting diode of claim 14, wherein the first delayed fluorescent dopant includes an organic compound having the following structure of Chemical Formula 2:

Chemical Formula 2

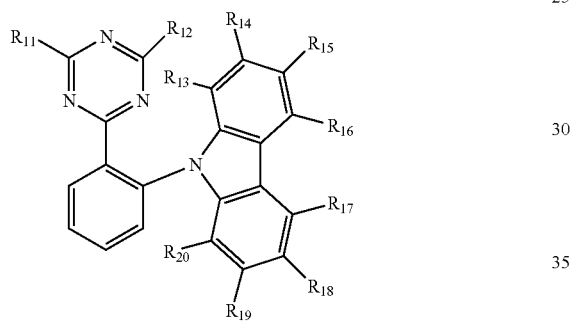

wherein each of $R_{11}$ and $R_{12}$ is independently a $C_5$~$C_{20}$ aryl group; and each of $R_{13}$ to $R_{20}$ is independently protium, deuterium, tritium, a cyano group, a linear or branched $C_1$~$C_{10}$ alkyl group, a $C_5$~$C_{30}$ aryl amino group unsubstituted or substituted with $C_5$~$C_{20}$ aryl group, a $C_5$~$C_{30}$ aryl group unsubstituted or substituted with a cyano group, or a $C_4$~$C_{30}$ hetero aryl group unsubstituted or substituted with a cyano group.

16. The organic light emitting diode of claim 14, wherein the first delayed fluorescent dopant includes anyone having the following structure of Chemical Formula 3:

Chemical Formula 3

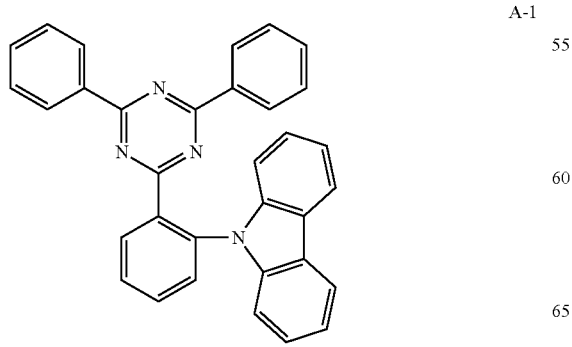
A-1

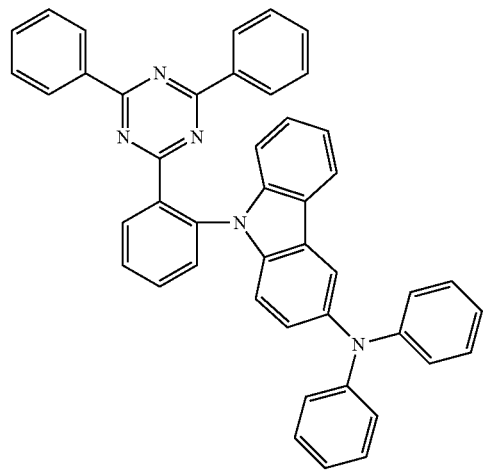
A-2

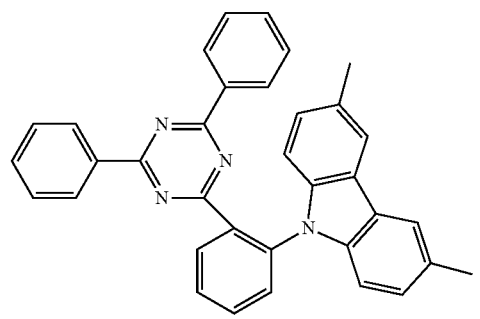
A-3

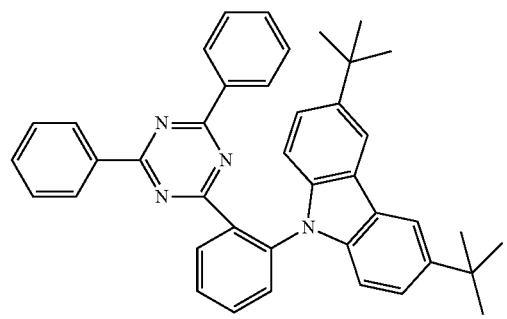
A-4

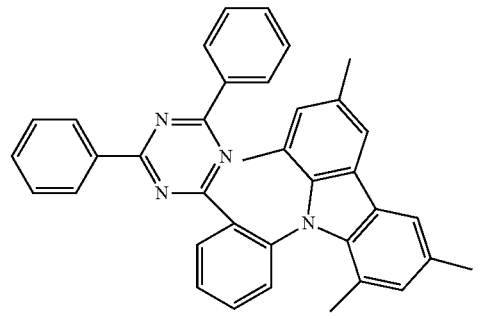
A-5

A-6
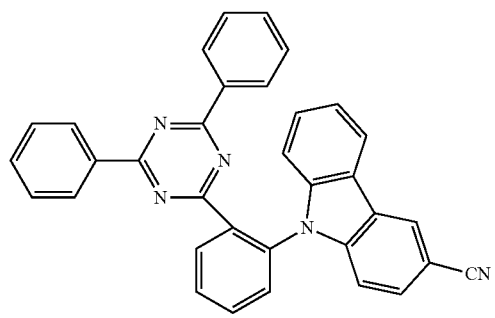
A-7
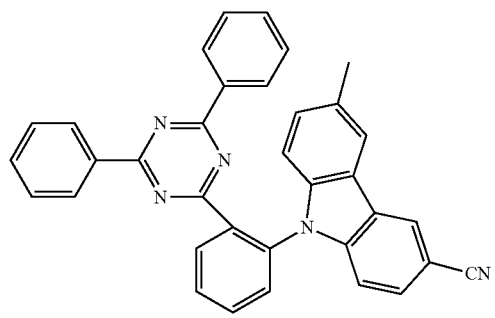
A-8
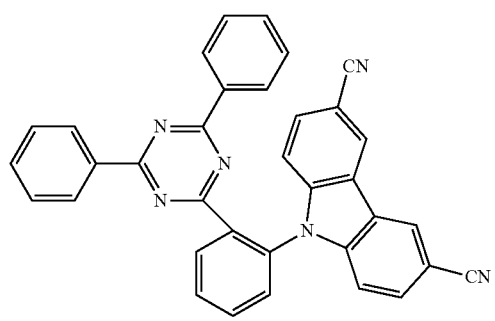
A-9
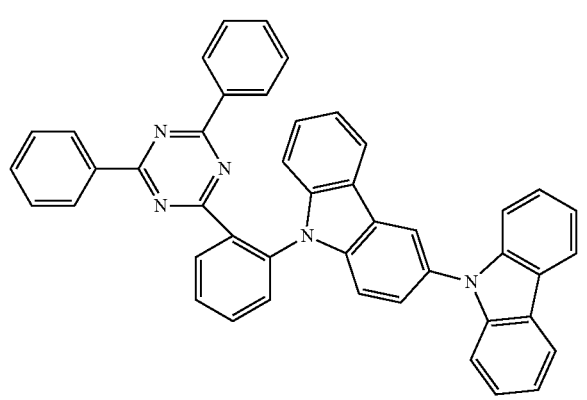
A-10
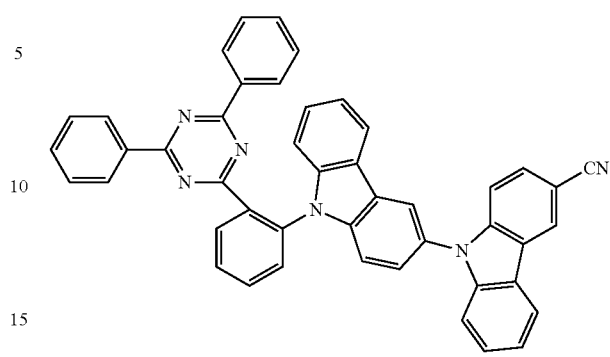
A-11
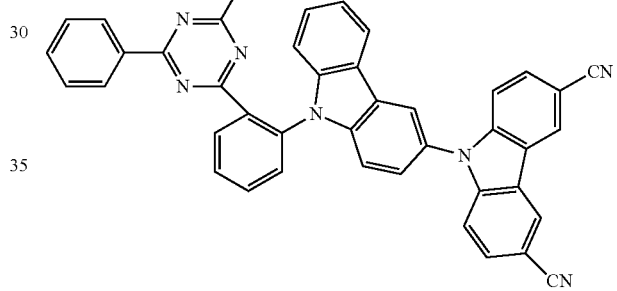
A-12
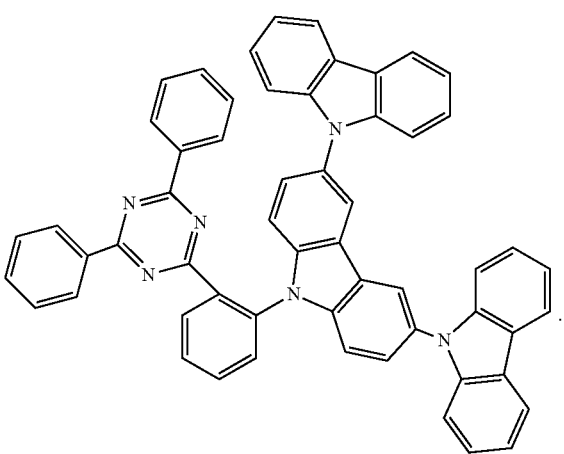

17. The organic light emitting diode of claim 14, wherein the second delayed fluorescent dopant includes an organic compound having the following structure of Chemical Formula 5:

Chemical Formula 5

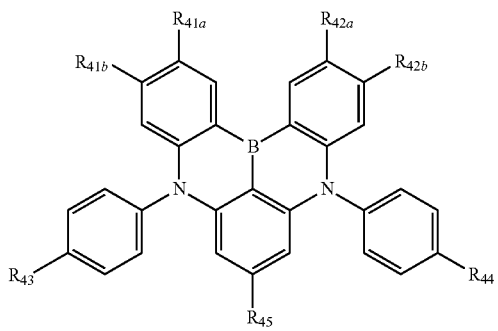

wherein each of $R_{41a}$, $R_{41b}$, $R_{42a}$ and $R_{42b}$ is independently protium, deuterium, tritium, a linear or branched $C_1$~$C_{10}$ alkyl group, a $C_5$~$C_{30}$ aryl group, a $C_4$~$C_{30}$ hetero aryl group or an aromatic or hetero aromatic amino group, wherein the amino group is substituted with a group selected from the group consisting of a $C_5$~$C_{30}$ aryl group, a $C_4$~$C_{30}$ hetero aryl group, a $C_5$~$C_{30}$ aryl amino group unsubstituted or substituted with a $C_5$~$C_{20}$ aryl group, a $C_4$~$C_{30}$ hetero aryl amino group unsubstituted or substituted with a $C_4$~$C_{20}$ hetero aryl group and combinations thereof, or two adjacent groups among $R_{41a}$, $R_{41b}$, $R_{42a}$ and $R_{42b}$ form respectively a $C_4$~$C_{20}$ fused hetero aryl ring unsubstituted or substituted with a $C_5$~$C_{20}$ aryl group; each of $R_{43}$ and $R_{44}$ is independently protium, deuterium, tritium, a linear or branched $C_1$~$C_{10}$ alkyl group or an aromatic or hetero aromatic amino group, wherein the amino group is substituted with a group selected from the group consisting of a $C_5$~$C_{30}$ aryl group, a $C_4$~$C_{30}$ hetero aryl group and combinations thereof. $R_{45}$ is protium, deuterium tritium, a linear or branched $C_1$-$C_{20}$ alkyl group, a $C_1$-$C_{20}$ alkoxy group or an aromatic or hetero aromatic amino group, wherein the amino group is substituted with a group selected from the group consisting of $C_5$-$C_{30}$ aryl group, $C_4$-$C_{30}$ hetero aryl group and combinations thereof.

18. The organic light emitting diode of claim 14, wherein the second delayed fluorescent dopant includes anyone having the following structure of Chemical Formula 6:

Chemical Formula 6

B-1

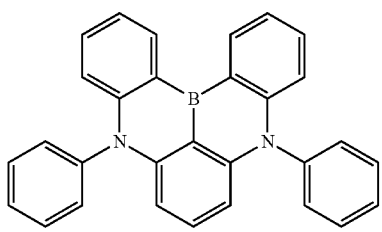

B-2

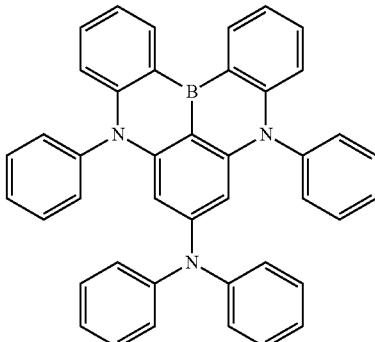

B-3

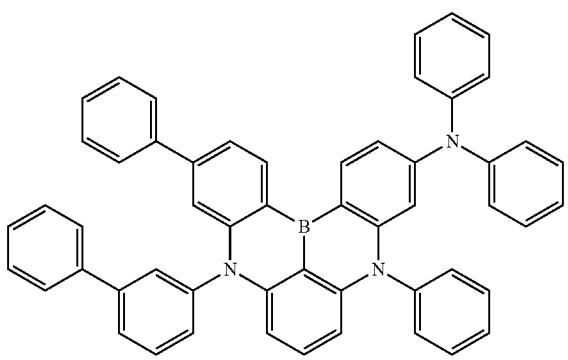

B-4

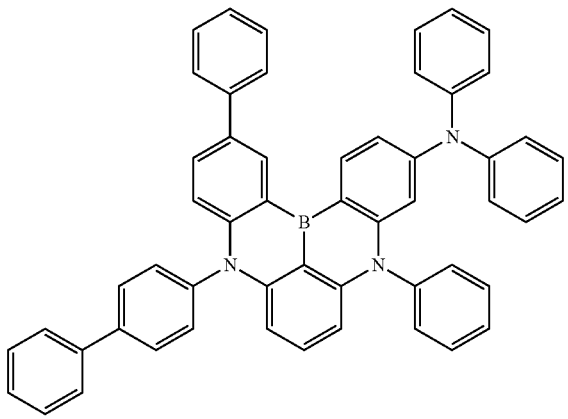

B-5

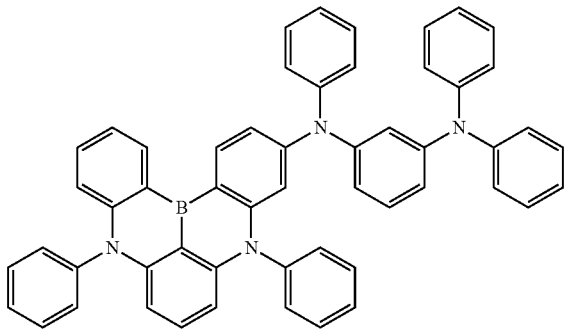

B-6
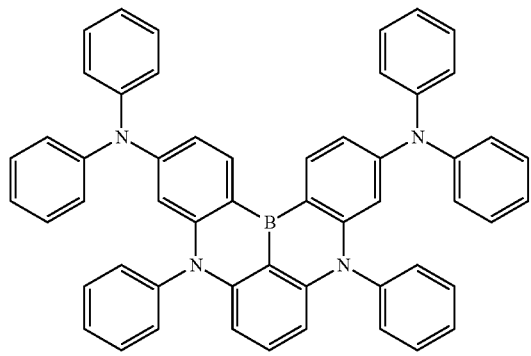

B-7
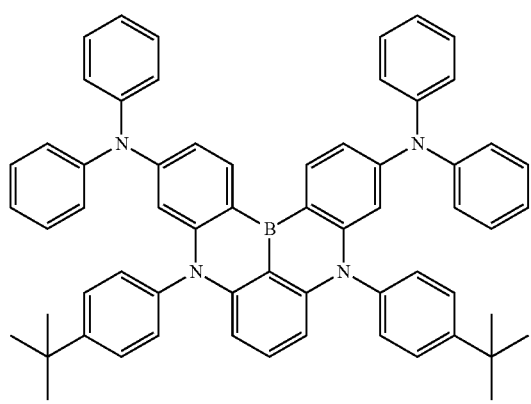

B-8
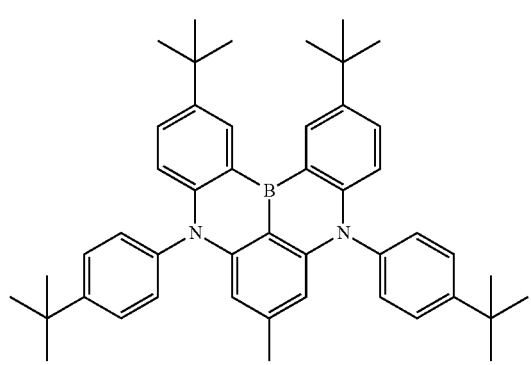

B-9
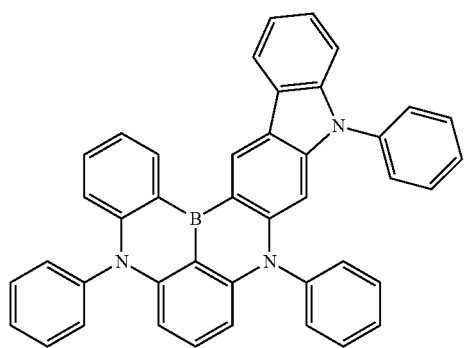

B-10
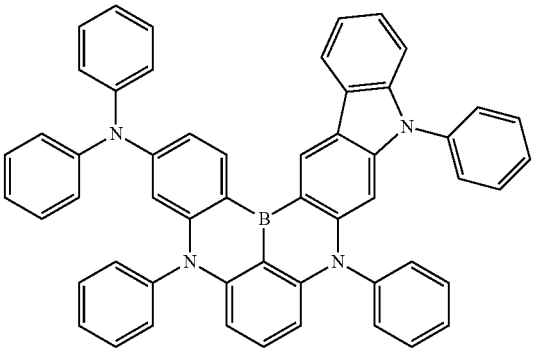

B-11
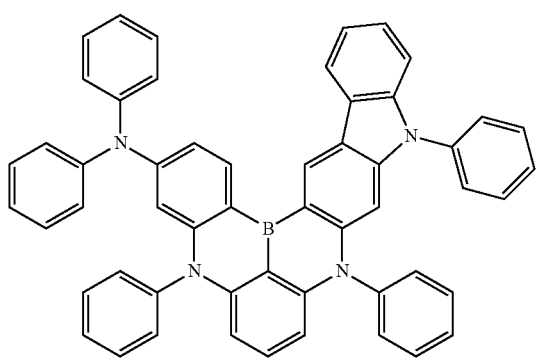

19. The organic light emitting diode of claim 14, wherein the at least one emitting material layer has a single-layered structure.

20. The organic light emitting diode of claim 14, wherein the at least one emitting material layer includes a first emitting material layer disposed between the first and second electrodes and a second emitting material layer disposed between the first electrode and the first emitting material layer or between the first emitting material layer and the second electrode,
wherein the first emitting material layer includes the first host and the first delayed fluorescent dopant, and
wherein the second emitting material layer includes the second delayed fluorescent dopant.

21. The organic light emitting diode of claim 20, wherein the second emitting material layer further includes a second host.

22. The organic light emitting diode of claim 20, further comprising a third emitting material layer disposed oppositely to the second emitting material layer with respect to the first emitting material layer, wherein the third emitting material layer includes a third host and a third delayed fluorescent dopant.

23. The organic light emitting diode of claim 22, wherein an excited state singlet energy level ($S_1^{TD3}$) and an excited state triplet energy level ($T_1^{TD3}$) of the third delayed fluorescent dopant is higher than each of the excited state singlet energy level ($S_1^{TD2}$) and the excited state triplet energy level ($T_1^{TD2}$) of the second delayed fluorescent dopant, respectively.

24. An organic light emitting device, comprising:
a substrate; and
the organic light emitting diode according to claim 1 over the substrate.

25. An organic light emitting device, comprising:
a substrate; and
the organic light emitting diode according to claim 14 over the substrate.

* * * * *